US011048165B2

(12) United States Patent
Hatakeyama et al.

(10) Patent No.: US 11,048,165 B2
(45) Date of Patent: Jun. 29, 2021

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Daisuke Domon, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 175 days.

(21) Appl. No.: 16/142,552

(22) Filed: Sep. 26, 2018

(65) Prior Publication Data

US 2019/0113842 A1 Apr. 18, 2019

(30) Foreign Application Priority Data

Oct. 13, 2017 (JP) ............................ JP2017-199476

(51) Int. Cl.

| | |
|---|---|
| ***G03F 7/004*** | (2006.01) |
| ***G03F 7/038*** | (2006.01) |
| ***G03F 7/16*** | (2006.01) |
| ***G06F 7/38*** | (2006.01) |
| ***G03F 7/20*** | (2006.01) |
| ***G03F 7/32*** | (2006.01) |
| ***G03F 7/38*** | (2006.01) |

(52) U.S. Cl.

CPC .......... *G03F 7/0045* (2013.01); *G03F 7/0382* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/322* (2013.01); *G03F 7/38* (2013.01)

(58) Field of Classification Search

CPC ..................................................... G03F 7/0045

See application file for complete search history.

(56) References Cited

U.S. PATENT DOCUMENTS

| | | | | |
|---|---|---|---|---|
| 6,673,511 | B1 | 1/2004 | Hatakeyama et al. | |
| 6,749,988 | B2 | 6/2004 | Hatakeyama et al. | |
| 6,916,593 | B2 | 7/2005 | Hatakeyama et al. | |
| 9,250,518 | B2 | 2/2016 | Hatakeyama et al. | |
| 9,989,847 | B2 | 6/2018 | Ohashi et al. | |
| 2013/0129995 | A1 * | 5/2013 | Ouattara | G03F 7/092 428/209 |
| 2015/0293281 | A1 * | 10/2015 | Ezoe | B32B 27/283 359/360 |
| 2016/0246175 | A1 * | 8/2016 | Kotake | C08F 220/20 |
| 2016/0259242 | A1 * | 9/2016 | Ohashi | C07D 231/12 |
| 2016/0299428 | A1 * | 10/2016 | Masunaga | G03F 1/22 |

FOREIGN PATENT DOCUMENTS

| | | | |
|---|---|---|---|
| JP | 2001-194776 | A | 7/2001 |
| JP | 2002-226470 | A | 8/2002 |
| JP | 2002-363148 | A | 12/2002 |
| JP | 2015-90382 | A | 5/2015 |
| JP | 2016-44135 | A | 4/2016 |

OTHER PUBLICATIONS

Wang et al., "Photobase generator and photo decomposable quencher for high-resolution photoresist applications," Advances in Resist Materials and Processing Technology XXVII, Proc. of SPIE vol. 7639, pp. 76390W-1 to 6390W-15 (2010), cited in the specification.

* cited by examiner

*Primary Examiner* — Cynthia H Kelly
*Assistant Examiner* — Anna Malloy
(74) *Attorney, Agent, or Firm* — Westerman, Hattori, Daniels & Adrian, LLP

(57) ABSTRACT

A resist composition comprising a base polymer and a sulfonium salt of brominated indole or brominated indazole carboxylic acid offers a high sensitivity, minimal LWR and improved CDU independent of whether it is of positive or negative tone.

15 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2017-199476 filed in Japan on Oct. 13, 2017, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of wavelength 13.5 nm, and double patterning version of the ArF lithography, on which active research efforts have been made.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein crosslinking reaction takes place under the action of acid. Quenchers are often added to these resist compositions for the purpose of controlling the diffusion of the acid to unexposed areas to improve the contrast. The addition of quenchers is fully effective to this purpose. A number of amine quenchers were proposed as disclosed in Patent Documents 1 to 3.

As the pattern feature size is reduced, approaching to the diffraction limit of light, light contrast lowers. In the case of positive resist film, a lowering of light contrast leads to reductions of resolution and focus margin of hole and trench patterns.

For mitigating the influence of reduced resolution of resist pattern due to a lowering of light contrast, an attempt is made to enhance the dissolution contrast of resist film. One such attempt is a chemically amplified resist material utilizing an acid amplifying mechanism that a compound is decomposed with an acid to generate another acid. In general, the concentration of acid creeps up linearly with an increase of exposure dose. In the case of the acid amplifying mechanism, the concentration of acid jumps up non-linearly as the exposure dose increases. The acid amplifying system is beneficial for further enhancing the advantages of chemically amplified resist film including high contrast and high sensitivity, but worsens the drawbacks of chemically amplified resist film that environmental resistance is degraded by amine contamination and maximum resolution is reduced by an increase of acid diffusion distance. The acid amplifying system is very difficult to control when implemented in practice.

Another approach for enhanced contrast is by reducing the concentration of amine with an increasing exposure dose. This may be achieved by applying a compound which loses the quencher function upon light exposure.

With respect to the acid labile group used in (meth) acrylate polymers for the ArF lithography, deprotection reaction takes place when a photoacid generator capable of generating a sulfonic acid having fluorine substituted at α-position (referred to "α-fluorinated sulfonic acid") is used, but not when an acid generator capable of generating a sulfonic acid not having fluorine substituted at α-position (referred to "α-non-fluorinated sulfonic acid") or carboxylic acid is used. If a sulfonium or iodonium salt capable of generating an α-fluorinated sulfonic acid is combined with a sulfonium or iodonium salt capable of generating an α-non-fluorinated sulfonic acid, the sulfonium or iodonium salt capable of generating an α-non-fluorinated sulfonic acid undergoes ion exchange with the α-fluorinated sulfonic acid. Through the ion exchange, the α-fluorinated sulfonic acid thus generated by light exposure is converted back to the sulfonium or iodonium salt while the sulfonium or iodonium salt of an α-non-fluorinated sulfonic acid or carboxylic acid functions as a quencher.

Further, the sulfonium or iodonium salt capable of generating an α-non-fluorinated sulfonic acid also functions as a photodegradable quencher since it loses the quencher function by photodegradation. Non-Patent Document 1 points out that the addition of a photodegradable quencher expands the margin of a trench pattern although the structural formula is not illustrated. However, it has only a little influence on performance improvement. There is a desire to have a quencher for further improving contrast.

Patent Document 4 discloses a quencher of onium salt type which reduces its basicity through a mechanism that it generates an amino-containing carboxylic acid upon light exposure, which in turn forms a lactam in the presence of acid. Due to the mechanism that basicity is reduced under the action of acid, acid diffusion is controlled by high basicity in the unexposed region where the amount of acid generated is minimal, whereas acid diffusion is promoted due to reduced basicity of the quencher in the overexposed region where the amount of acid generated is large. This expands the difference in acid amount between the exposed and unexposed regions, from which an improvement in contrast is expected. Despite the advantage of improved contrast, the acid diffusion controlling effect is rather reduced.

Patent Document 5 discloses a resist composition having a sulfonium salt of indole or indazole carboxylic acid added as a quencher. The sulfonium salt of indole or indazole carboxylic acid exerts a substantial acid diffusion suppressing effect because both the nitrogen atom in the indole moiety and the sulfur atom in the sulfonium moiety participate in acid diffusion control. The same sulfonium salt, however, is detrimental to the sensitivity of resist.

As the pattern feature size is reduced, the edge roughness (LWR) of line patterns and the critical dimension uniformity (CDU) of hole patterns are regarded significant. It is pointed out that these factors are affected by the segregation or agglomeration of a base polymer and acid generator and the diffusion of generated acid. There is a tendency that LWR becomes greater as the resist film becomes thinner. A film thickness reduction to comply with the progress of size reduction causes a degradation of LWR, which becomes a serious problem.

The EUV lithography resist must meet high sensitivity, high resolution, low LWR and improved CDU at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation among sensitivity, LWR and CDU. The same tradeoff relation exists with the EB lithography because EB is similar high-energy radiation.

CITATION LIST

Patent Document 1: JP-A 2001-194776

Patent Document 2: JP-A 2002-226470

Patent Document 3: JP-A 2002-363148

Patent Document 4: JP-A 2015-090382 (U.S. Pat. No. 9,250,518)

Patent Document 5: JP-A 2016-044135 (U.S. Pat. No. 9,989,847)

Non-Patent Document 1: SPIE Vol. 7639 p 76390 W (2010)

DISCLOSURE OF INVENTION

For the acid-catalyzed chemically amplified resist material, it is desired to develop a quencher capable of providing a high sensitivity and improving LWR or CDU.

An object of the invention is to provide a resist composition which exhibits a high sensitivity, reduced LWR and improved CDU, independent of whether it is of positive tone or negative tone; and a pattern forming process using the same.

The inventors have found that using a sulfonium salt of brominated indole or brominated indazole carboxylic acid as the quencher, a resist material having a high sensitivity, high contrast, high resolution, reduced LWR, improved CDU, and wide process margin is obtainable.

In one aspect, the invention provides a resist composition comprising a base polymer and a sulfonium salt having the formula (A-1) or (A-2).

(A-1)

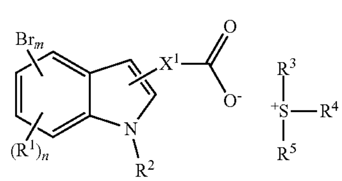

(A-2)

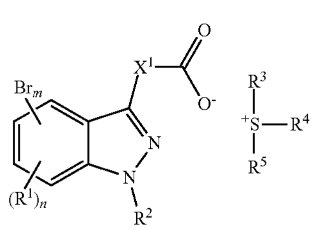

Herein $R^1$ is hydrogen, hydroxyl, $C_1$-$C_6$ alkyl, $C_1$-$C_6$ alkoxy, $C_2$-$C_7$ acyl, $C_2$-$C_7$ alkoxycarbonyl, $C_6$-$C_{10}$ aryl group, fluorine, or chlorine; $X^1$ is a single bond or a $C_1$-$C_{10}$ divalent aliphatic hydrocarbon group in which at least one hydrogen may be substituted by halogen, or at least one carbon may be substituted by an ether bond, ester bond or carbonyl moiety; $R^2$ is hydrogen, $C_1$-$C_6$ alkyl, $C_2$-$C_8$ alkenyl, $C_2$-$C_8$ alkynyl, $C_2$-$C_{15}$ alkoxycarbonyl, $C_3$-$C_{15}$ alkenyloxycarbonyl, or $C_3$-$C_{15}$ alkynyloxycarbonyl group; $R^3$, $R^4$ and $R^5$ are each independently halogen or a $C_1$-$C_{20}$ monovalent hydrocarbon group which may contain a heteroatom, any two of $R^3$, $R^4$ and $R^5$ may bond together to form a ring with the sulfur atom to which they are attached; m is an integer of 1 to 5, n is an integer of 0 to 4, and $1 \leq m+n \leq 5$.

In a preferred embodiment, the resist composition further comprises an acid generator capable of generating sulfonic acid, imide acid or methide acid, and/or an organic solvent.

In a preferred embodiment, the base polymer comprises recurring units having the formula (a1) or recurring units having the formula (a2).

(a1)

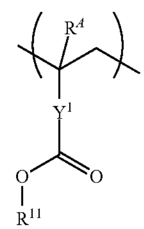

(a2)

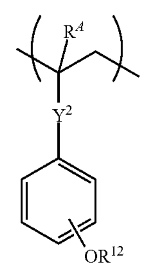

Herein $R^A$ is each independently hydrogen or methyl, $Y^1$ is a single bond, phenylene group, naphthylene group, or $C_1$-$C_{12}$ linking group containing an ester bond or lactone ring, $Y^2$ is a single bond or ester bond, $R^{11}$ and $R^{12}$ each are an acid labile group.

The resist composition may further comprise a dissolution inhibitor. The composition is typically a chemically amplified positive resist composition.

In another preferred embodiment, the base polymer is free of an acid labile group. The resist composition may further comprise a crosslinker. The composition is typically a chemically amplified negative resist composition.

Often the resist composition further comprises a surfactant.

In a preferred embodiment, the base polymer further comprises recurring units of at least one type selected from the formulae (f1) to (f3).

(f1)

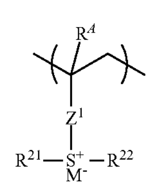

-continued (f2)

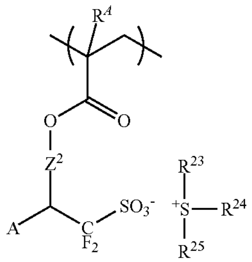

(f3)

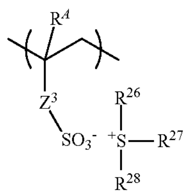

Herein $R^A$ is each independently hydrogen or methyl; $Z^1$ is a single bond, phenylene group, —O—$Z^{12}$—, or —C(═O)—$Z^{11}$—$Z^{12}$—, $Z^{11}$ is —O— or —NH—, $Z^{12}$ is a $C_1$-$C_6$ alkylene group, $C_2$-$C_6$ alkenylene group, or phenylene group, which may contain a carbonyl, ester bond, ether bond or hydroxyl moiety; $Z^2$ is a single bond, —$Z^{21}$—C(═O)—O—, —$Z^{21}$—O— or —$Z^{21}$—O—C(═O)—, $Z^{21}$ is a $C_1$-$C_{12}$ alkylene group which may contain a carbonyl, ester bond or ether bond; $Z^3$ is a single bond, methylene, ethylene, phenylene, fluorinated phenylene, —O—$Z^{32}$—, or —C(═O)—$Z^{31}$—$Z^{32}$—, $Z^{31}$ is —O— or —NH—, $Z^{32}$ is a $C_1$-$C_6$ alkylene group, phenylene group, fluorinated phenylene group, trifluoromethyl-substituted phenylene group, or $C_2$-$C_6$ alkenylene group, which may contain a carbonyl, ester bond, ether bond or hydroxyl moiety; $R^{21}$ to $R^{28}$ are each independently a $C_1$-$C_{20}$ monovalent hydrocarbon group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached; A is hydrogen or trifluoromethyl; and $M^-$ is a non-nucleophilic counter ion.

In another aspect, the invention provides a process for forming a pattern comprising the steps of applying the resist composition defined above onto a substrate, baking to form a resist film, exposing the resist film to high-energy radiation, and developing the exposed film in a developer.

Typically, the high-energy radiation is ArF excimer laser radiation of wavelength 193 nm, KrF excimer laser radiation of wavelength 248 nm, EB, or EUV of wavelength 3 to 15 nm.

Advantageous Effects of Invention

In a resist film containing a sulfonium salt of brominated indole or brominated indazole carboxylic acid, indole is effective for suppressing the diffusion of secondary electrons which are generated within the resist film upon exposure to EB or EUV. The invention is thus successful in reducing the LWR of line patterns or improving the CDU of hole patterns.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "brominated" or "fluorinated" indicates that a compound contains bromine or fluorine. In chemical formulae, Me stands for methyl, Ac for acetyl, and Ph for phenyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition The resist composition of the invention is defined as comprising a base polymer and a sulfonium salt of brominated indole or brominated indazole carboxylic acid. The sulfonium salt is an acid generator capable of generating brominated indole or brominated indazole carboxylic acid upon light exposure, but also functions as a quencher at the same time because it possesses a strongly basic sulfonium. Since the brominated indole or brominated indazole carboxylic acid does not possess a sufficient acidity to induce deprotection reaction of acid labile groups, it is recommended to separately add an acid generator capable of generating a strong acid such as sulfonic acid, imide acid or methide acid, as will be described later, in order to induce deprotection reaction of acid labile groups. The acid generator capable of generating a strong acid such as sulfonic acid, imide acid or methide acid may be either of separate type which is added to the base polymer or of bound type which is bound in the base polymer.

When a resist composition containing the sulfonium salt of brominated indole or brominated indazole carboxylic acid in admixture with an acid generator capable of generating a perfluoroalkylsulfonic acid or superstrong acid is exposed to radiation, brominated indole or brominated indazole carboxylic acid and perfluoroalkylsulfonic acid generate. Since the acid generator is not entirely decomposed, the undecomposed acid generator is present nearby. When the sulfonium salt of brominated indole or brominated indazole carboxylic acid co-exists with the perfluoroalkylsulfonic acid, the perfluoroalkylsulfonic acid undergoes ion exchange with the sulfonium salt of brominated indole or brominated indazole carboxylic acid, whereby a sulfonium salt of perfluoroalkylsulfonic acid is created and brominated indole or brominated indazole carboxylic acid is released. This is because the salt of perfluoroalkylsulfonic acid having a high acid strength is more stable. In contrast, when a sulfonium salt of perfluoroalkylsulfonic acid co-exists with brominated indole or brominated indazole carboxylic acid, no ion exchange takes place. Ion exchange takes place not only with the perfluoroalkylsulfonic acid, but also similarly with arylsulfonic acid, alkylsulfonic acid, imide acid and methide acid having a higher acid strength than the brominated indole or brominated indazole carboxylic acid.

The brominated indole or brominated indazole carboxylic acid sulfonium salt is effective not only for suppressing acid diffusion, but also for suppressing diffusion of secondary electrons generated upon exposure. This leads to reduced LWR of line patterns or improved CDU of hole patterns.

When the brominated indole or brominated indazole carboxylic acid sulfonium salt is exposed to radiation, bromine is ionized to generate secondary electrons. The energy of secondary electrons is transferred to the acid generator to promote its decomposition, contributing to a higher sensitivity. In this sense, the brominated indole or brominated indazole carboxylic acid sulfonium salt functions not only as a quencher for acid diffusion control, but also as a sensitizer.

While the resist composition should essentially contain the sulfonium salt of brominated indole or brominated indazole carboxylic acid, another sulfonium or iodonium salt may be separately added as the quencher. Examples of the sulfonium or iodonium salt to be added as the quencher include sulfonium or iodonium salts of carboxylic acid, sulfonic acid, imide acid and saccharin. The carboxylic acid used herein may or may not be fluorinated at α-position.

For the LWR improving purpose, it is effective to prevent a polymer and/or acid generator from agglomeration. Effective means for preventing agglomeration of a polymer is by reducing the difference between hydrophobic and hydrophilic properties or by lowering the glass transition temperature (Tg) thereof. Specifically, it is effective to reduce the polarity difference between a hydrophobic acid labile group and a hydrophilic adhesive group or to lower the Tg by using a compact adhesive group like monocyclic lactone. One effective means for preventing agglomeration of an acid generator is by introducing a substituent into the triphenylsulfonium cation. In particular, with respect to a methacrylate polymer containing an alicyclic protective group and a lactone adhesive group for ArF lithography, a triphenylsulfonium composed solely of aromatic groups has a heterogeneous structure and low compatibility. As the substituent to be introduced into triphenylsulfonium, an alicyclic group or lactone similar to those used in the base polymer is regarded adequate. When lactone is introduced in a sulfonium salt which is hydrophilic, the resulting sulfonium salt becomes too hydrophilic and thus less compatible with a polymer, with a likelihood that the sulfonium salt will agglomerate. When a hydrophobic alkyl group is introduced, the sulfonium salt may be uniformly dispersed within the resist film. WO 2011/048919 discloses the technique for improving LWR by introducing an alkyl group into a sulfonium salt capable of generating an α-fluorinated sulfone imide acid.

The dispersion of a quencher is a crucial factor for LWR improvement. Even when the dispersion of an acid generator in a resist film is improved, LWR is still low if a quencher is unevenly distributed. For a quencher of sulfonium salt type, the introduction of an alkyl or similar substituent into the triphenylsulfonium cation moiety is effective for LWR improvement. Further the introduction of a halogen into the quencher of sulfonium salt type is effective for rendering it more hydrophobic and improving dispersion. The introduction of a bulky halogen atom is effective not only in the cation moiety, but also in the anion moiety of the sulfonium salt. The brominated indole or brominated indazole carboxylic acid sulfonium salt having bromine introduced in its anion moiety serves to enhance the dispersion of the quencher in a resist film, thereby reducing LWR.

The sulfonium salt of brominated indole or brominated indazole carboxylic acid exerts a LWR reducing effect, which may stand good either in positive and negative tone pattern formation by alkaline development or in negative tone pattern formation by organic solvent development.

Sulfonium Salt

The sulfonium salt in the resist composition is a brominated indole or brominated to indazole carboxylic acid sulfonium salt having the formula (A-1) or (A-2).

(A-1)

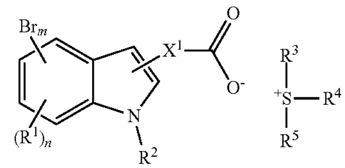

(A-2)

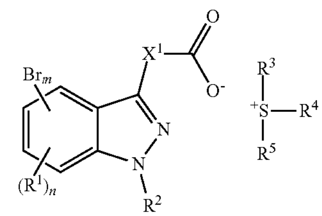

Herein $R^1$ is hydrogen, hydroxyl, $C_1$-$C_6$ alkyl, $C_1$-$C_6$ alkoxy, $C_2$-$C_7$ acyl, $C_2$-$C_7$ alkoxycarbonyl, $C_6$-$C_{10}$ aryl group, fluorine, or chlorine. Examples of the alkyl group which may be straight, branched or cyclic include methyl, ethyl, n-propyl, isopropyl, cyclopropyl, n-butyl, isobutyl, sec-butyl, tert-butyl, cyclobutyl, n-pentyl, cyclopentyl, n-hexyl and cyclohexyl. Examples of the alkyl moiety in the alkoxy, acyl and alkoxycarbonyl groups are as exemplified just above for the alkyl group. Examples of the aryl group include phenyl, naphthyl, anthryl, and phenanthryl. Preferably, $R^1$ is fluorine or chlorine.

$X^1$ is a single bond or a $C_1$-$C_{10}$ divalent aliphatic hydrocarbon group in which at least one (one or more or even all) hydrogen may be substituted by halogen, or at least one carbon may be substituted by an ether bond, ester bond or carbonyl moiety. Suitable halogens include fluorine, chlorine, bromine and iodine. The divalent aliphatic hydrocarbon groups are preferably straight or branched and examples thereof include $C_1$-$C_6$ alkylene groups and $C_2$-$C_6$ alkenylene groups. Preferably $X^1$ is selected from a single bond, $C_1$-$C_4$ alkylene groups, and $C_2$-$C_4$ alkenylene groups.

$R^2$ is hydrogen, $C_1$-$C_6$ alkyl, $C_2$-$C_8$ alkenyl, $C_2$-$C_8$ alkynyl, $C_2$-$C_{15}$ alkoxycarbonyl, $C_3$-$C_{15}$ alkenyloxycarbonyl, or $C_3$-$C_{15}$ alkynyloxycarbonyl group. The alkyl group may be straight, branched or cyclic, and examples thereof are as exemplified above for $R^1$. The alkenyl group may be straight, branched or cyclic, and examples thereof include vinyl, 1-propenyl and 2-propenyl. The alkynyl group may be straight, branched or cyclic, and examples thereof include ethynyl, 1-propynyl and 2-propynyl. Examples of the alkyl moiety in the $C_2$-$C_{15}$ alkoxycarbonyl group are as exemplified above for the alkyl group. Examples of the alkenyl moiety in the $C_3$-$C_{15}$ alkenylcarbonyl group are as exemplified above for the alkenyl group. Examples of the alkynyl moiety in the $C_3$-$C_{15}$ alkynylcarbonyl group are as exemplified above for the alkynyl group.

$R^3$, $R^4$ and $R^5$ are each independently halogen or a $C_1$-$C_{20}$ monovalent hydrocarbon group which may contain a heteroatom. Any two of $R^3$, $R^4$ and $R^5$ may bond together to form a ring with the sulfur atom to which they are attached. The monovalent hydrocarbon group may be straight, branched or cyclic and examples thereof include $C_1$-$C_{12}$ alkyl groups, $C_2$-$C_{12}$ alkenyl groups, $C_2$-$C_{12}$ alkynyl groups, $C_6$-$C_{20}$ aryl groups, and $C_7$-$C_{12}$ aralkyl groups. Also included are substituted forms of the foregoing in which at least one (one or more or even all) hydrogen is substituted by hydroxyl, carboxyl, halogen, cyano, amide, nitro, mercapto, sultone, sulfone moiety or sulfonium salt-containing moiety, or in which at least one carbon is substituted by an ether bond, ester bond, carbonyl moiety, carbonate moiety or sulfonic acid ester bond.

The subscript m is an integer of 1 to 5, n is an integer of 0 to 4, and $1 \leq m+n \leq 5$. Preferably, m is an integer of 1 to 4, and n is 0 or 1.

Examples of the anion in the brominated indole carboxylic acid sulfonium salt having formula (A-1) are given below, but not limited thereto.

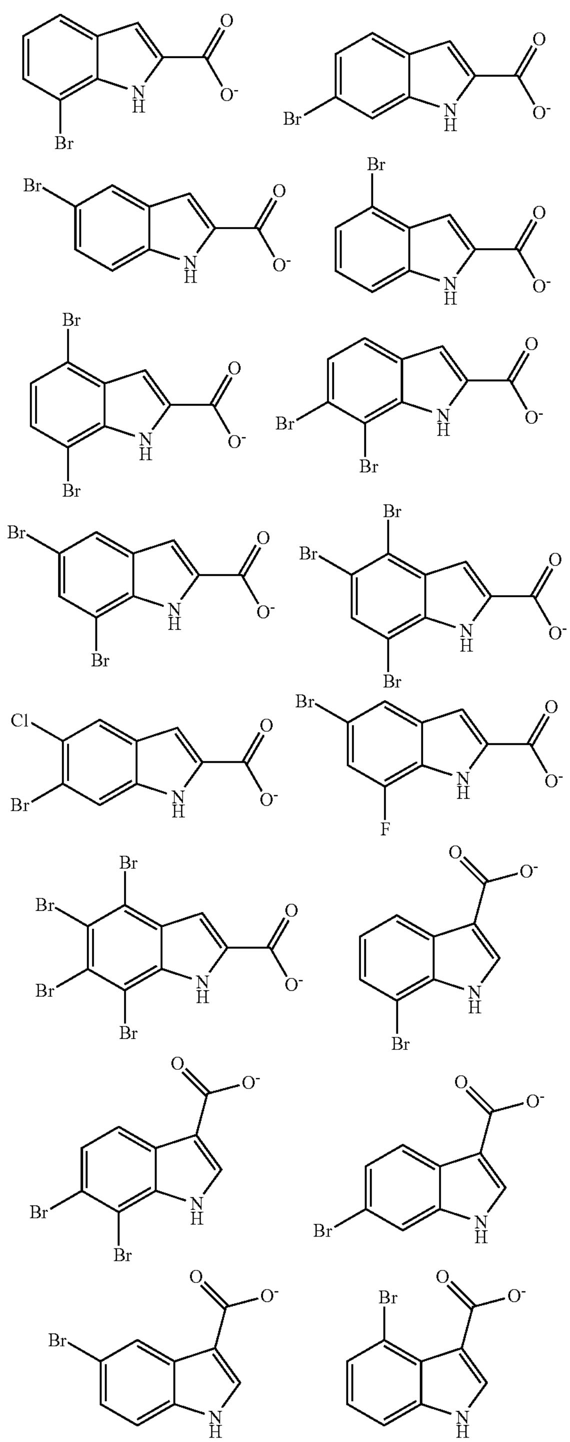

-continued

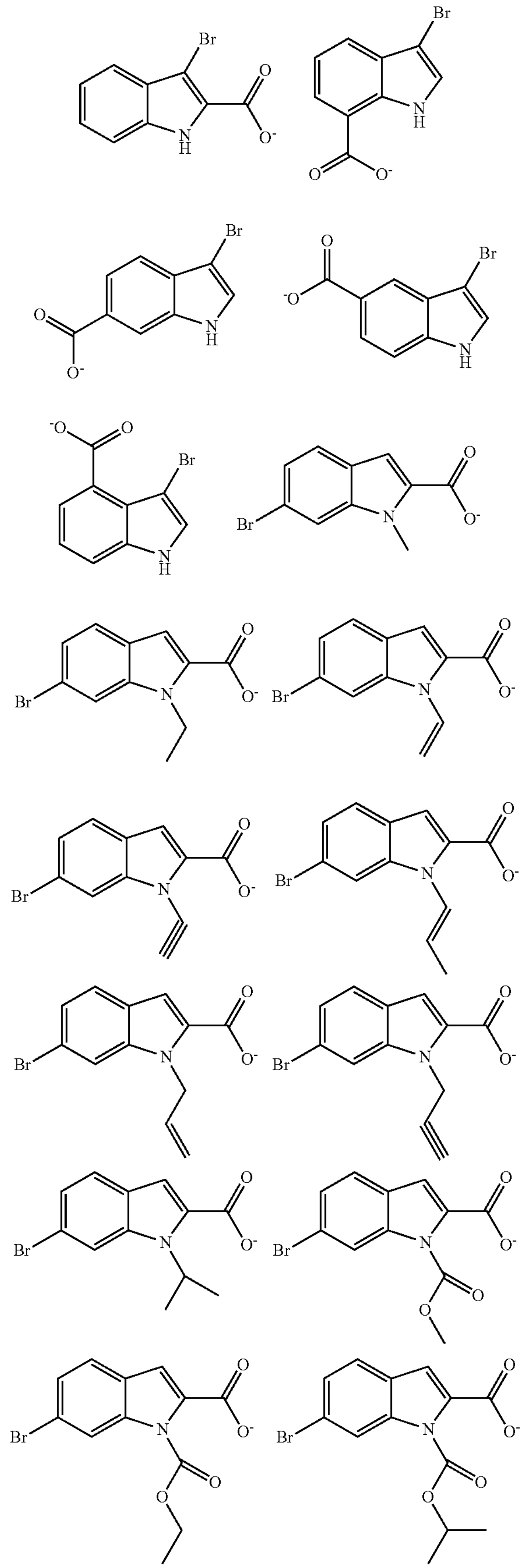

-continued
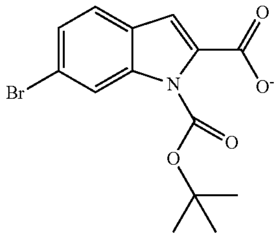
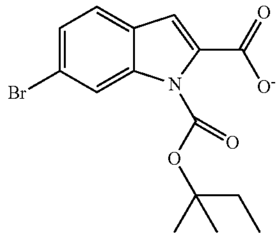
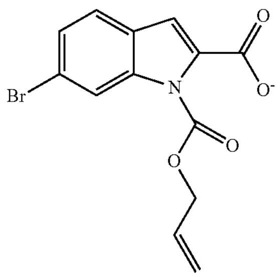
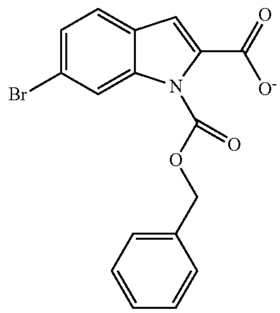
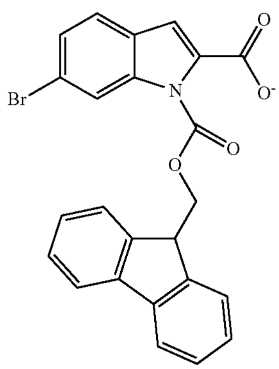
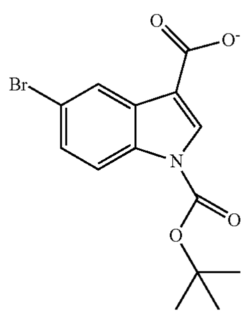
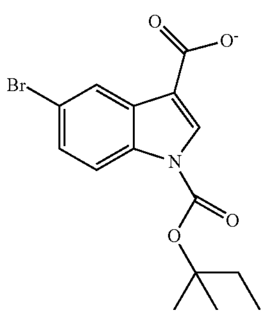
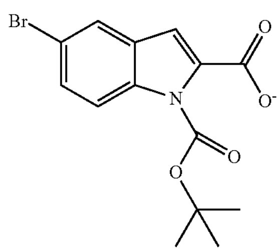
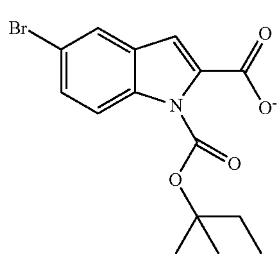
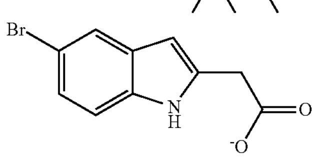
-continued
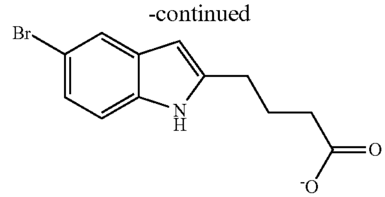
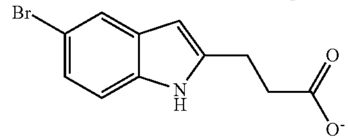
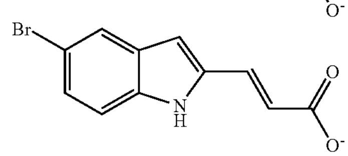
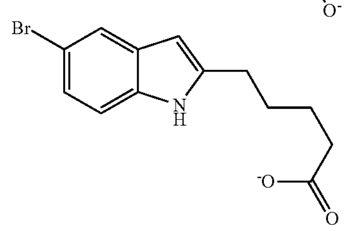
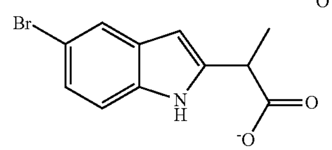
Examples of the anion in the brominated indazole carboxylic acid sulfonium salt having formula (A-2) are given below, but not limited thereto.
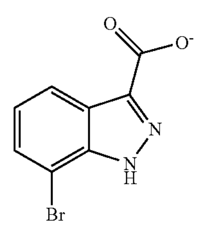
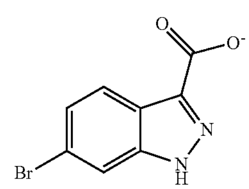
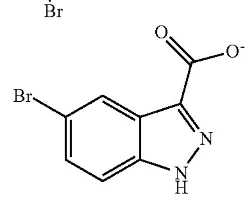
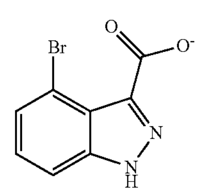
Examples of the cation in the sulfonium salt having formula (A-1) or (A-2) are given below, but not limited thereto.
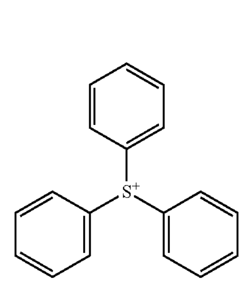
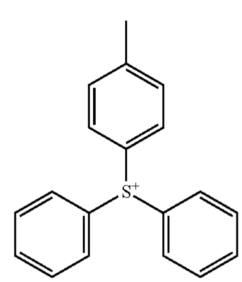

-continued
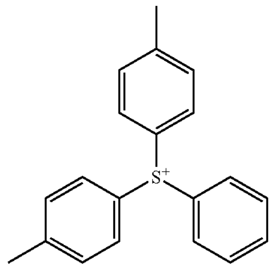
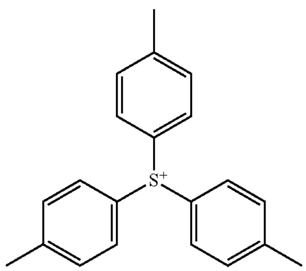
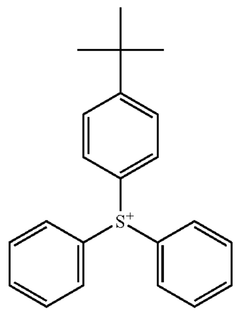
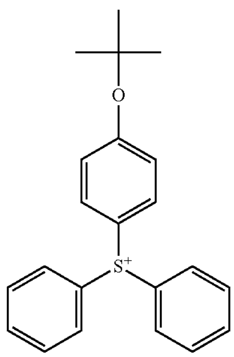
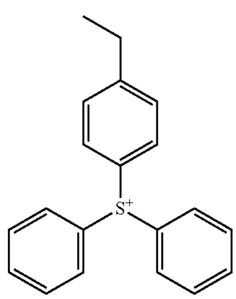
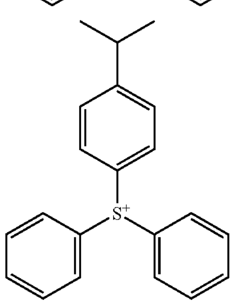
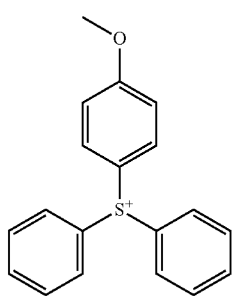
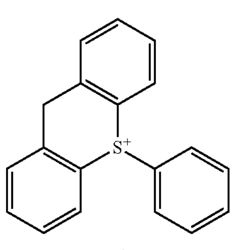
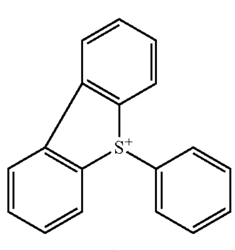
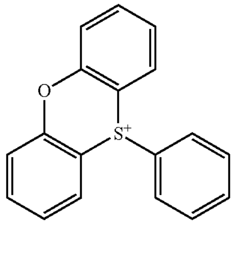
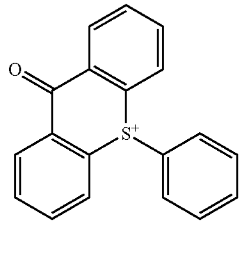
-continued
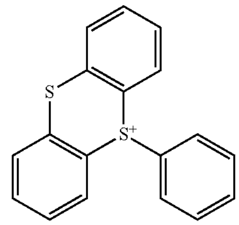
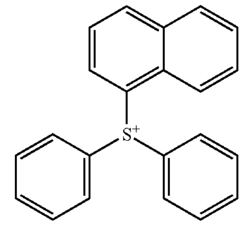
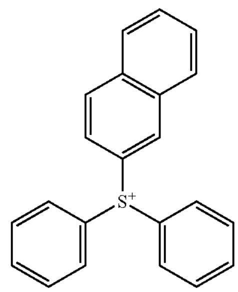
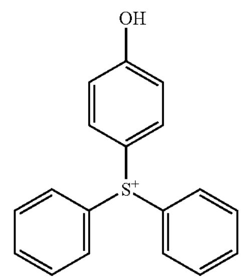
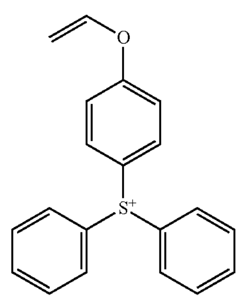
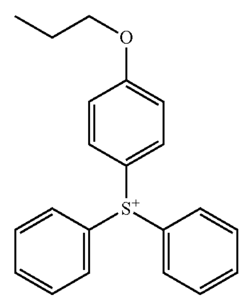
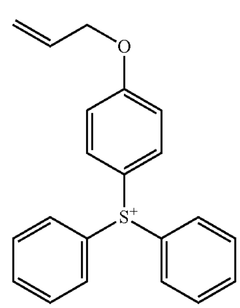
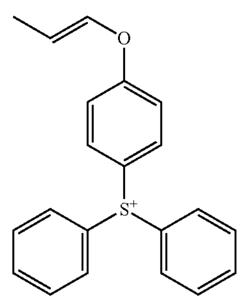
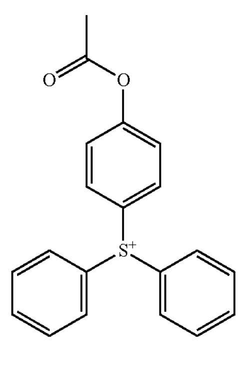
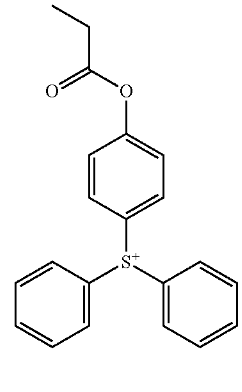

-continued
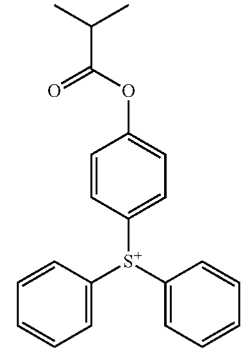
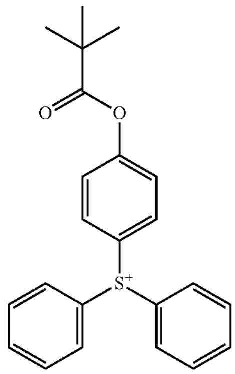
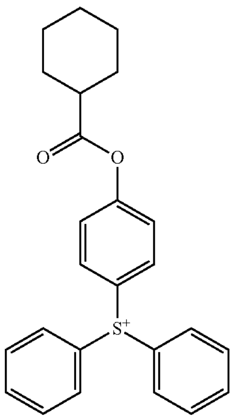
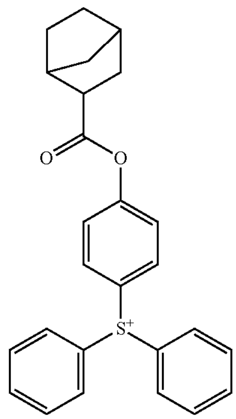
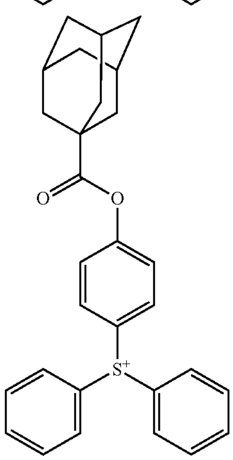
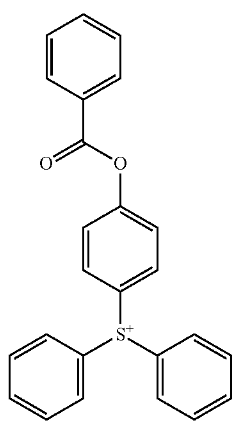
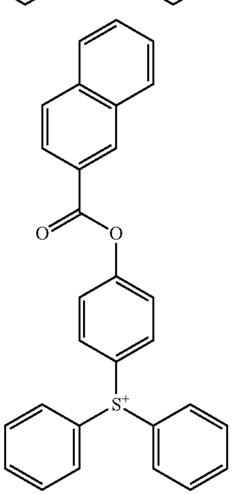
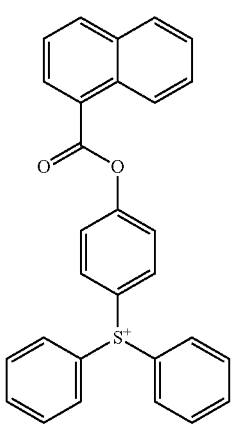
-continued
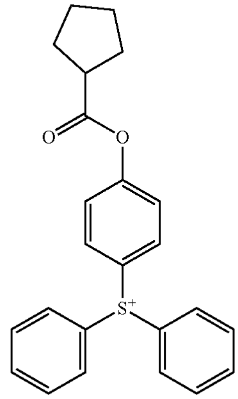
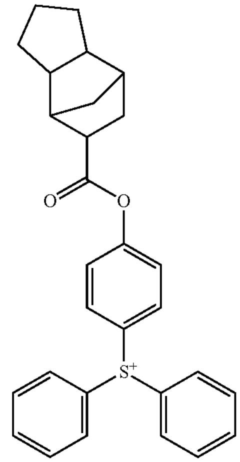
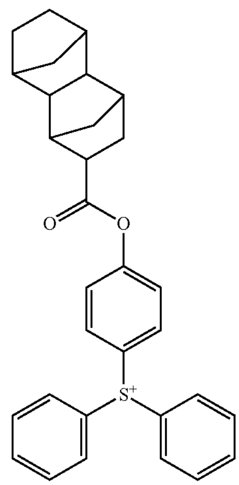
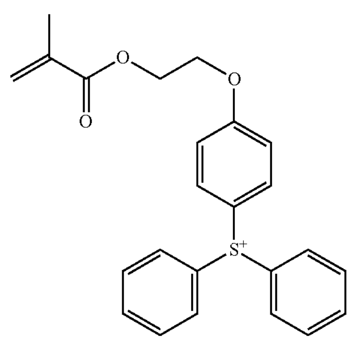
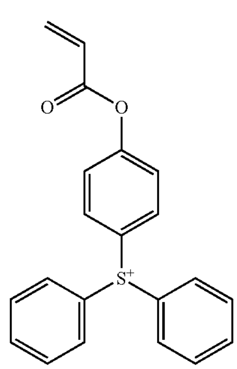
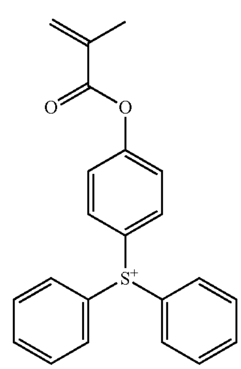

-continued
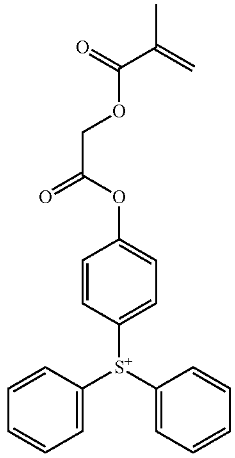
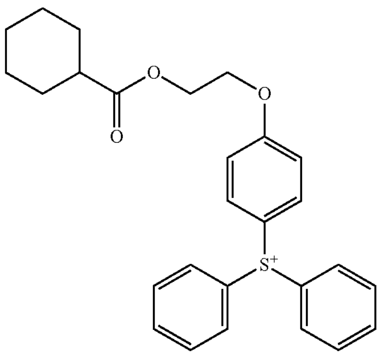
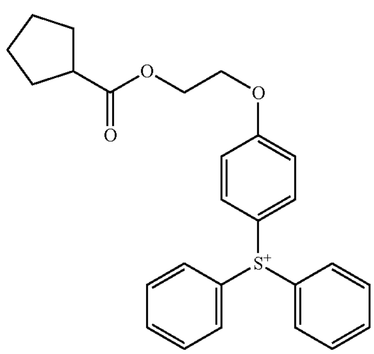
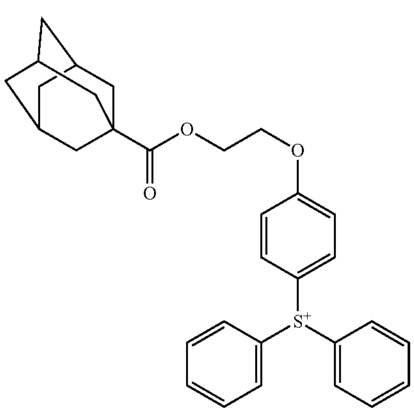
-continued
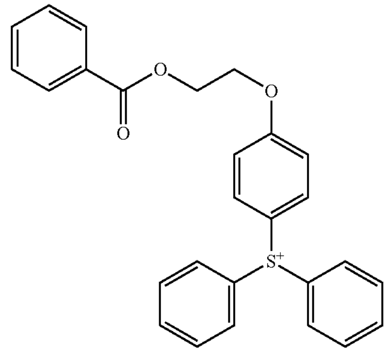
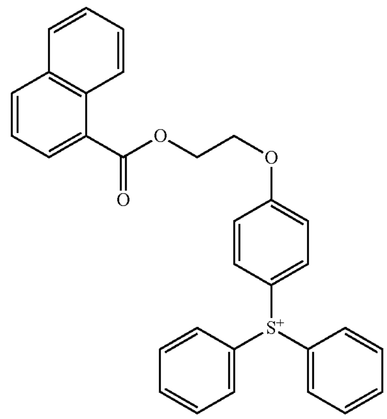
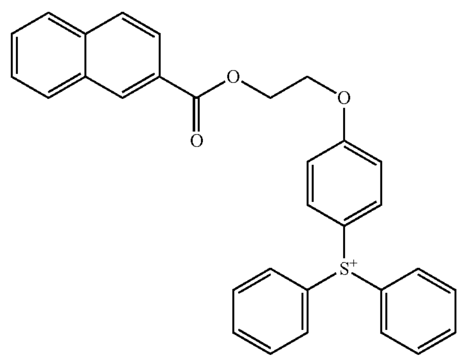
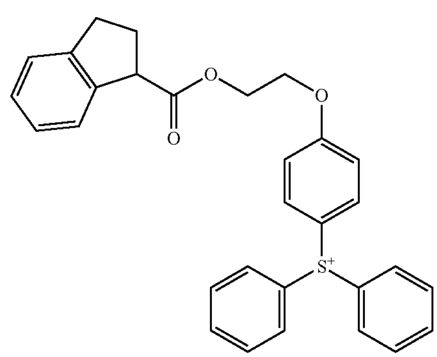

-continued
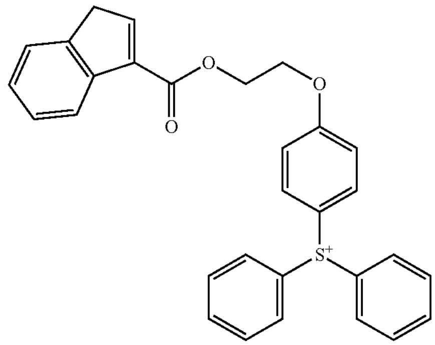
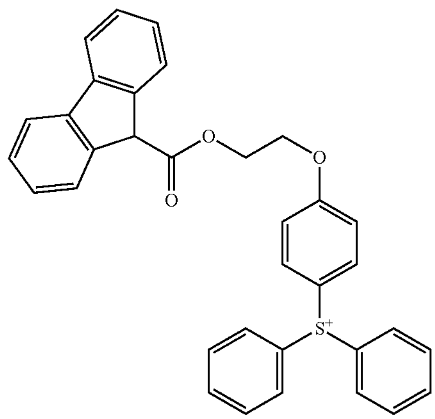
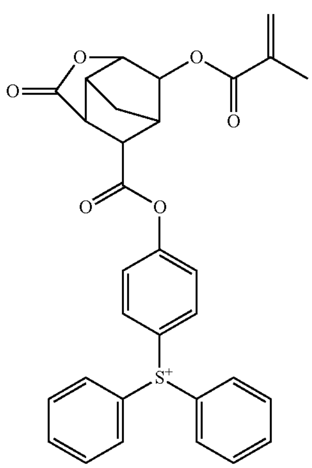
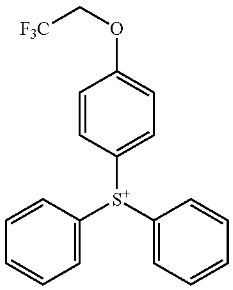
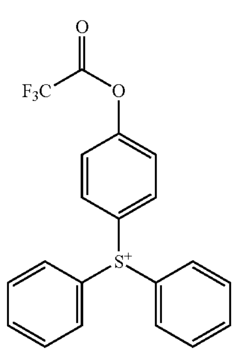
-continued
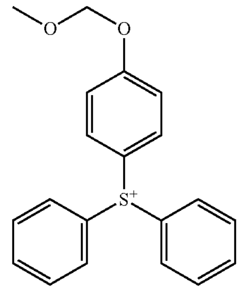
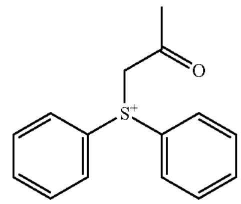
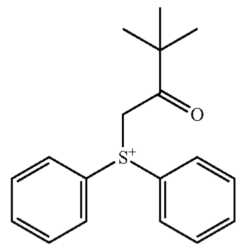
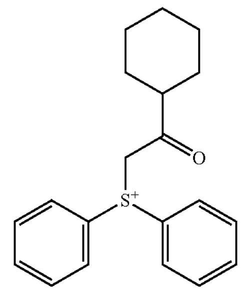
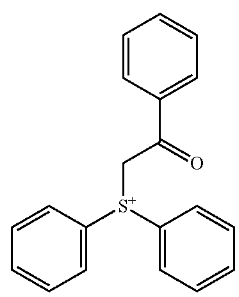
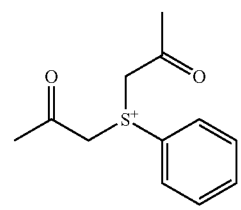
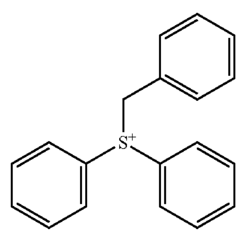
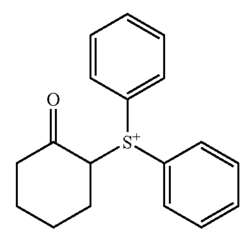
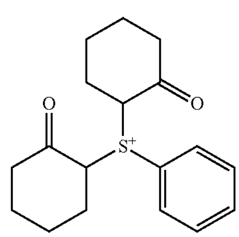
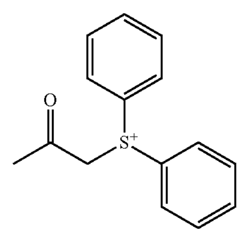
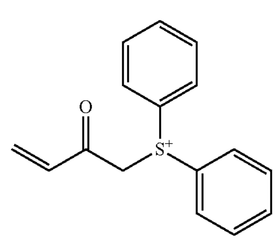

-continued
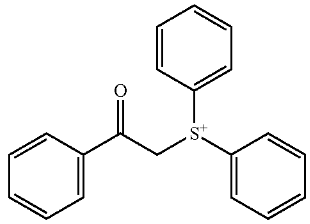
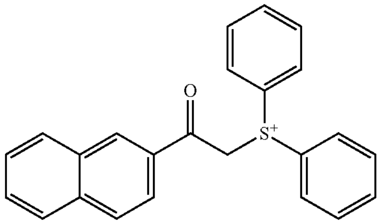
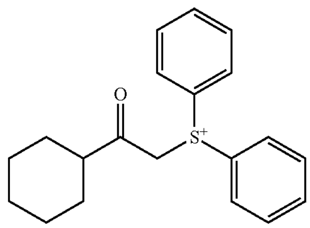
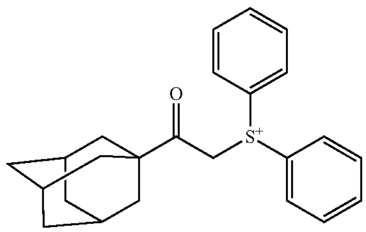
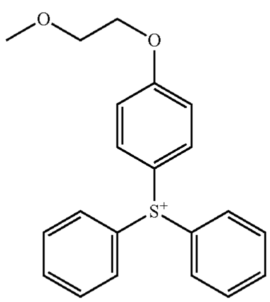
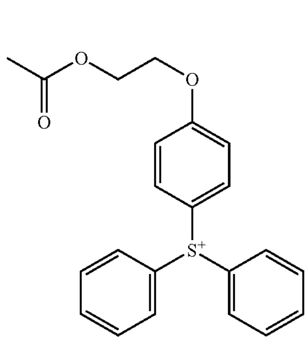
-continued
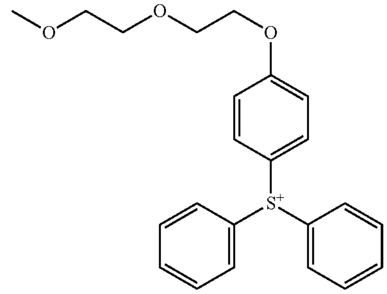
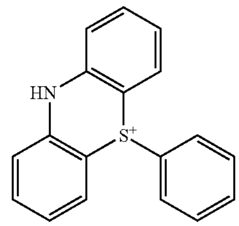
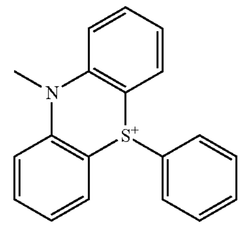
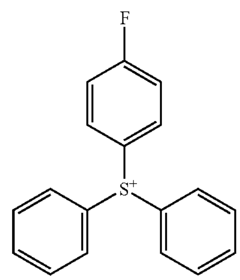
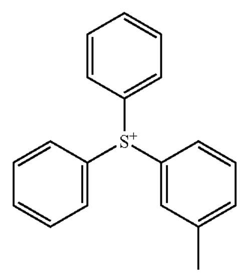
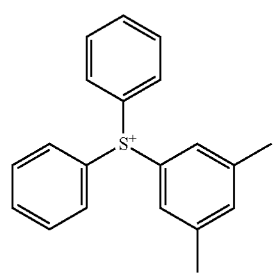
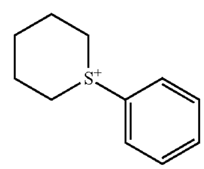
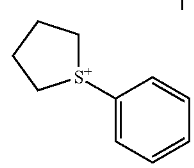
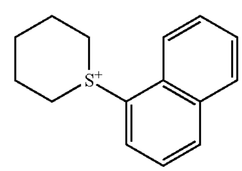
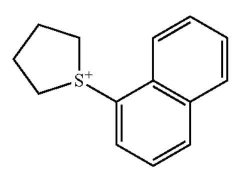
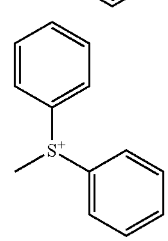
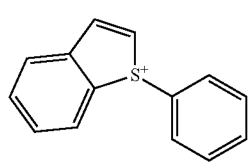
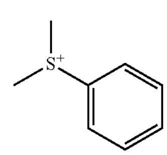

-continued
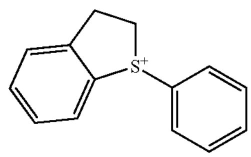
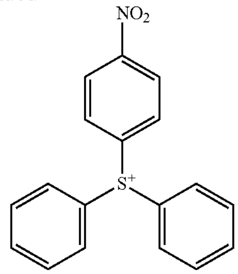
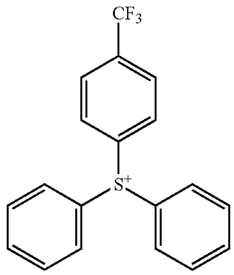
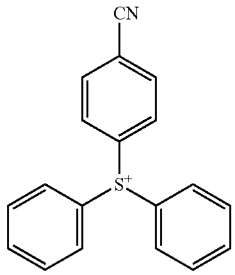
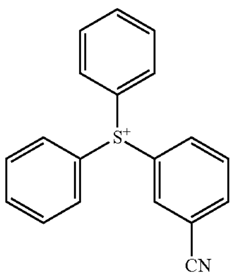
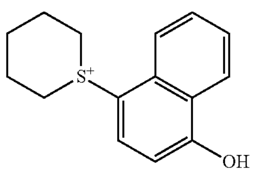
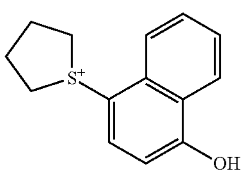
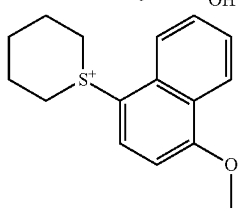
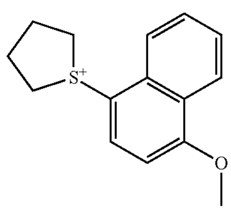
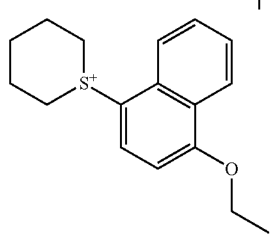
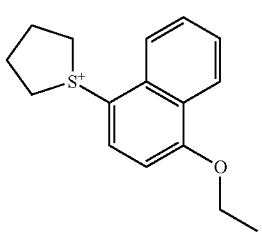
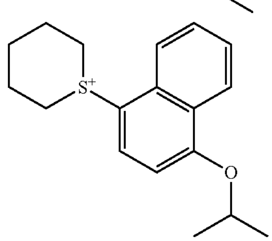
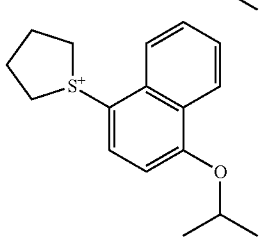
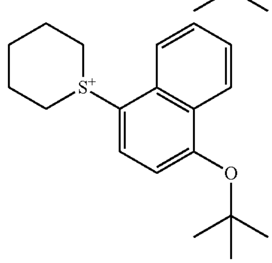
-continued
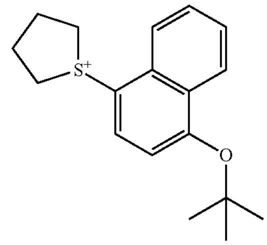
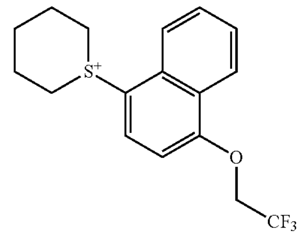
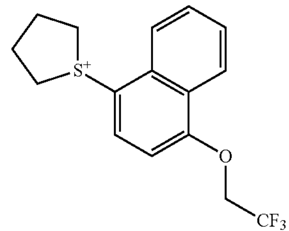
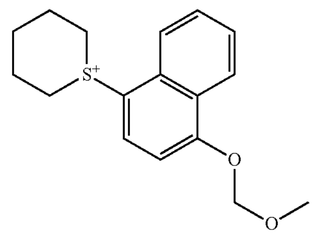
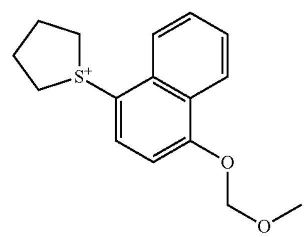
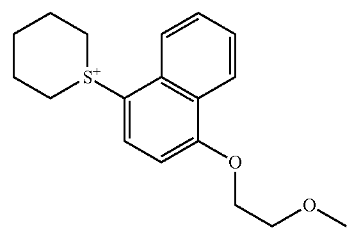
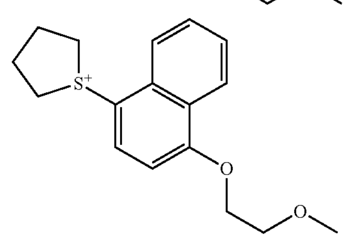
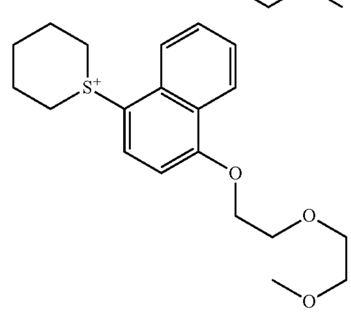

-continued
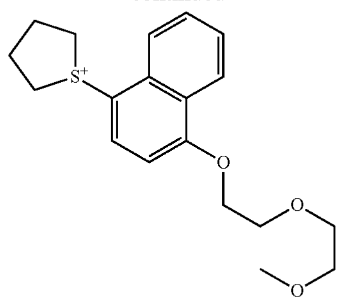
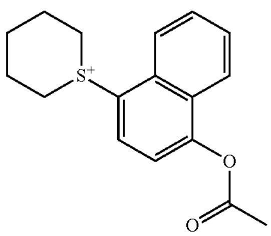
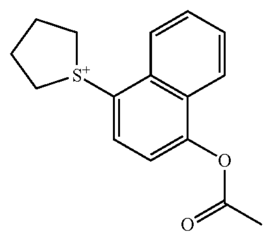
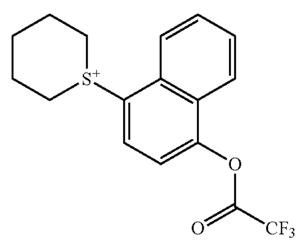
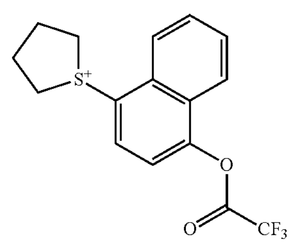
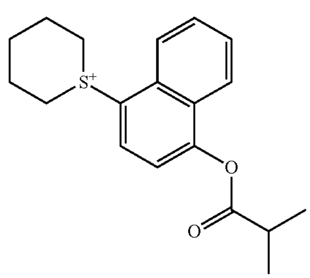
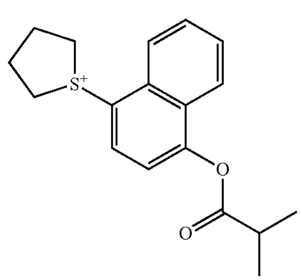
-continued
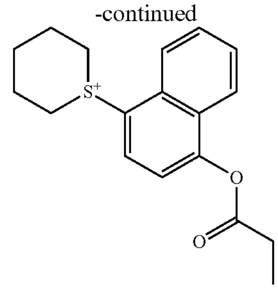
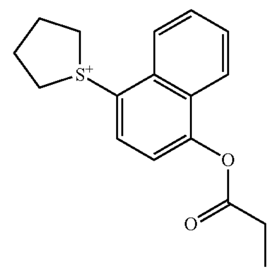
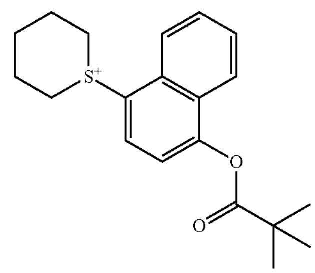
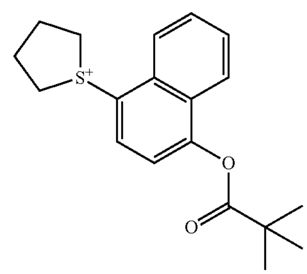
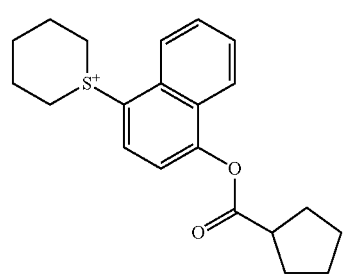
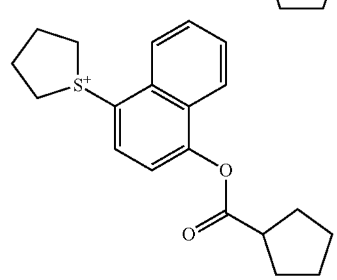

-continued
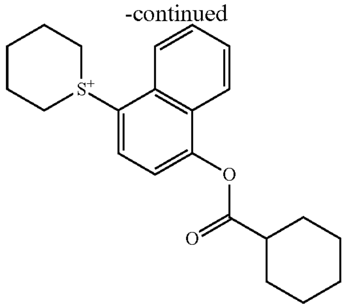
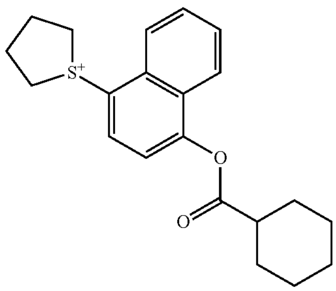
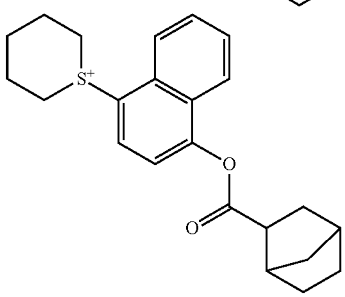
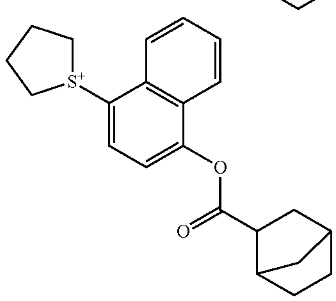
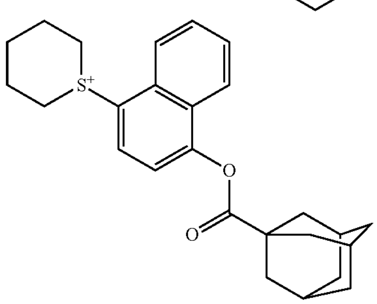
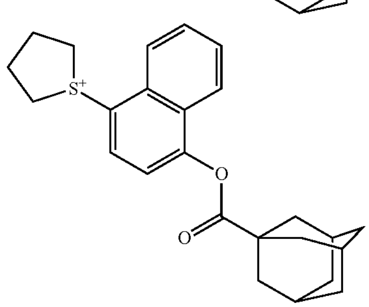
-continued
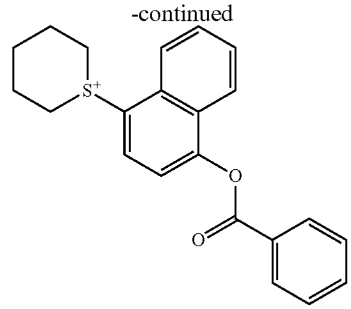
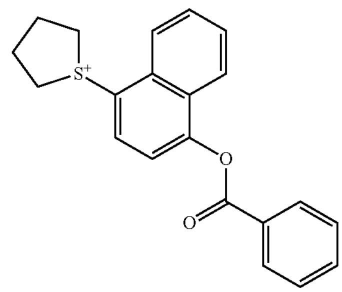
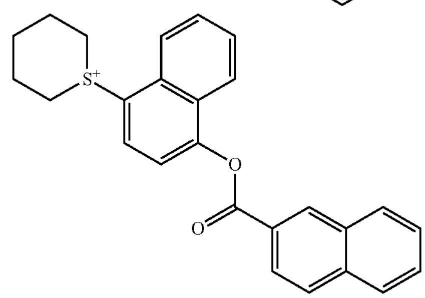
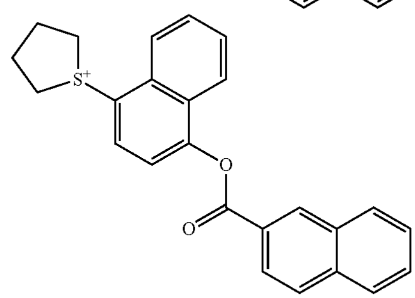
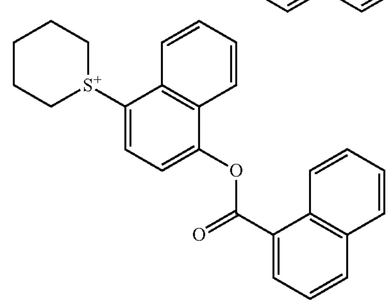
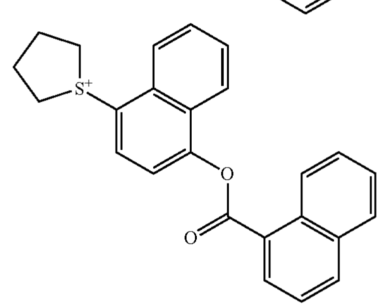

-continued
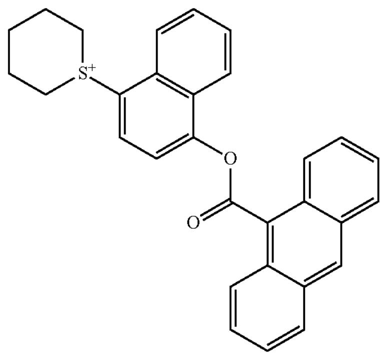
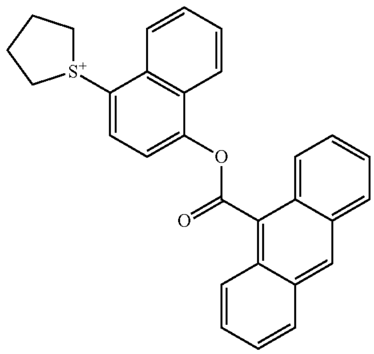
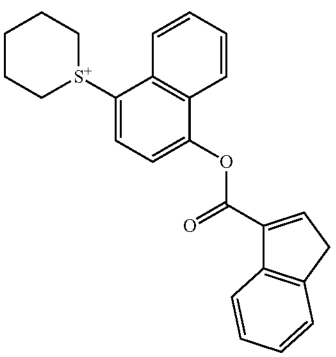
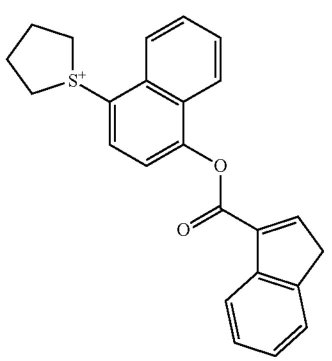
-continued
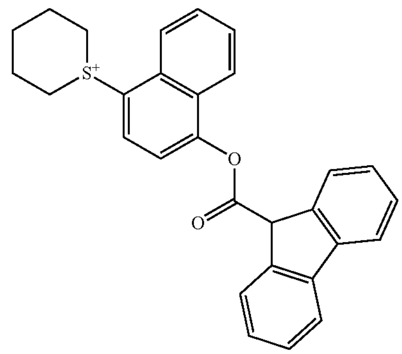
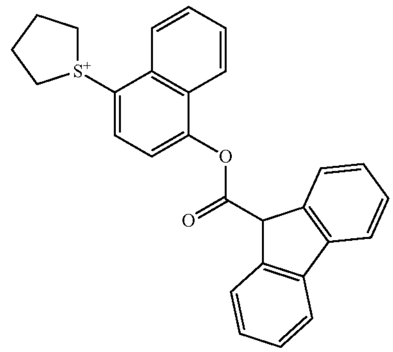
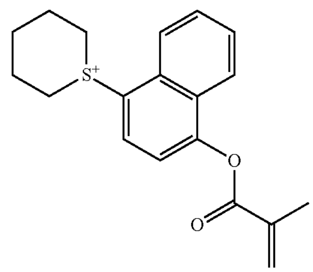
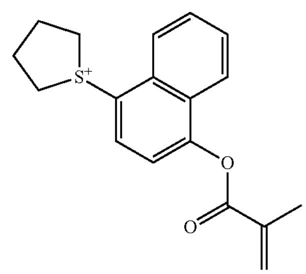
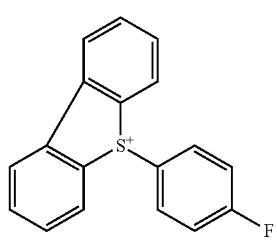
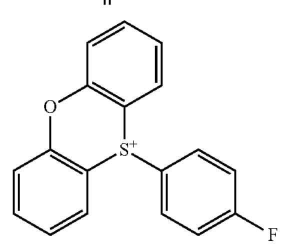
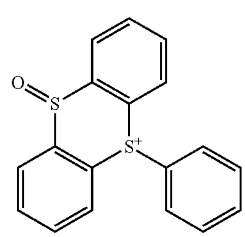
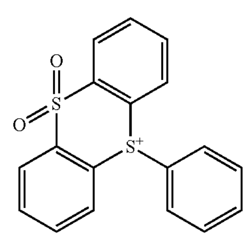

-continued
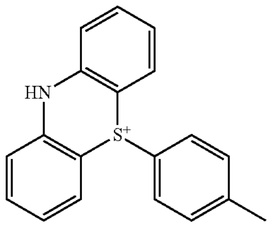
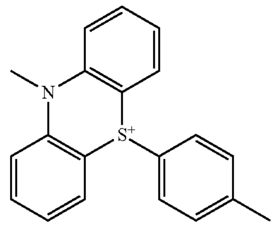
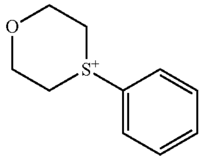
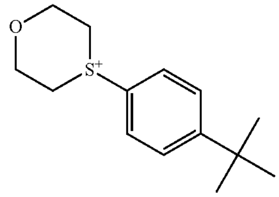
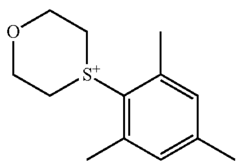
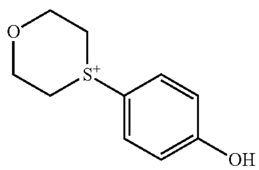
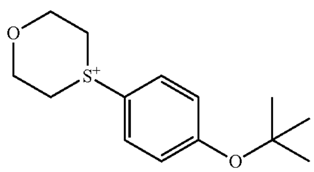
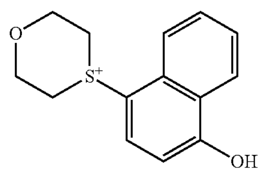
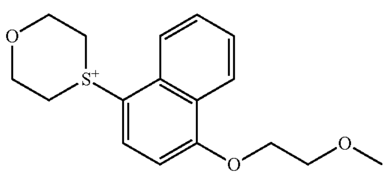
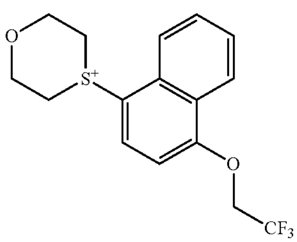
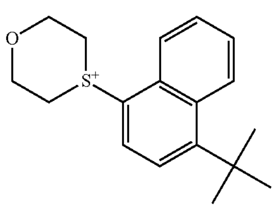
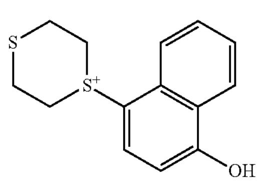
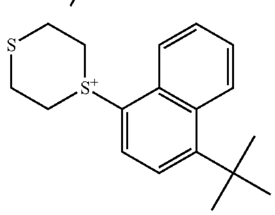
-continued
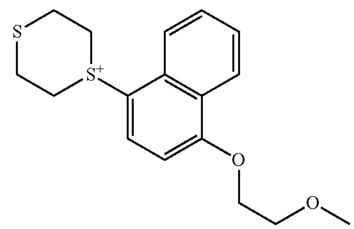
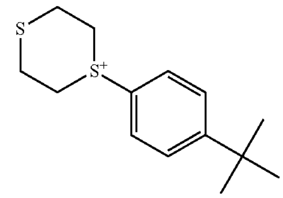
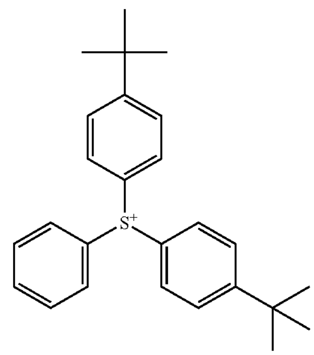
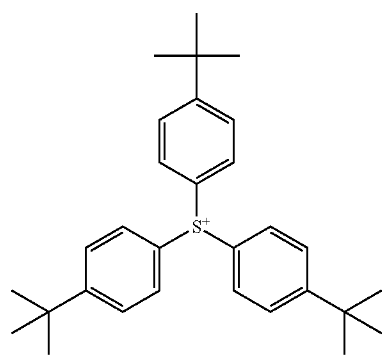
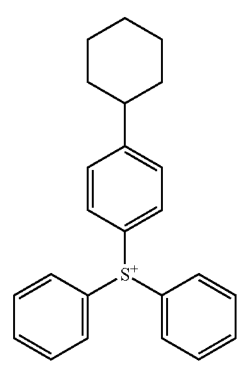

-continued
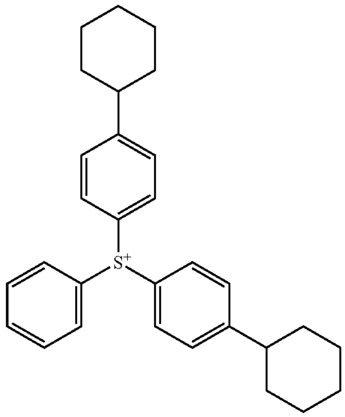
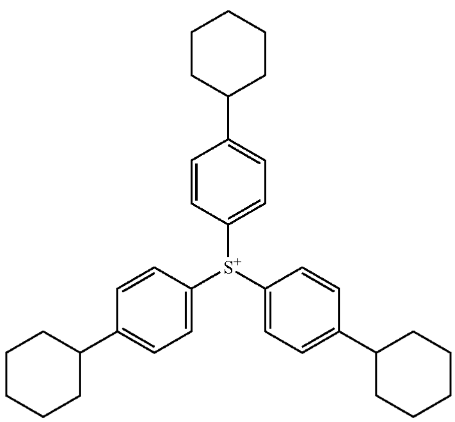
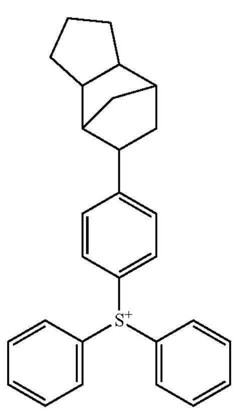
-continued
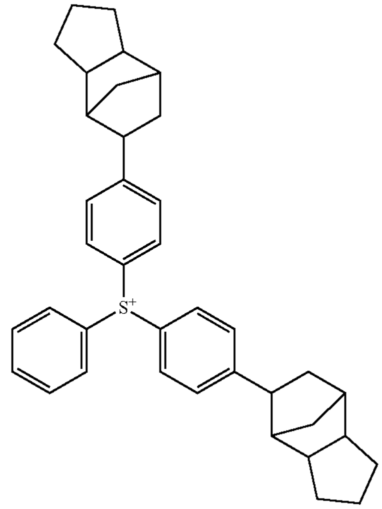
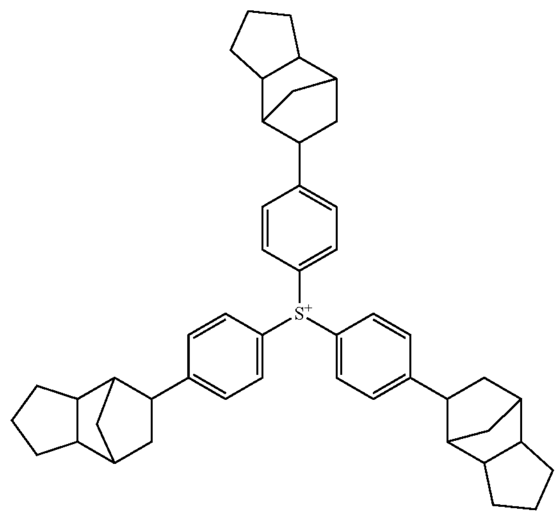
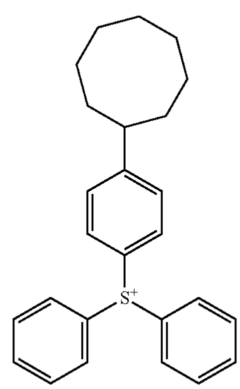

-continued
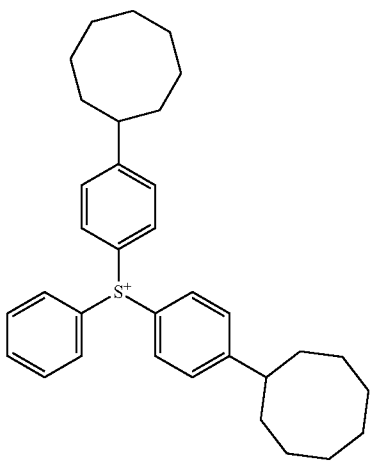
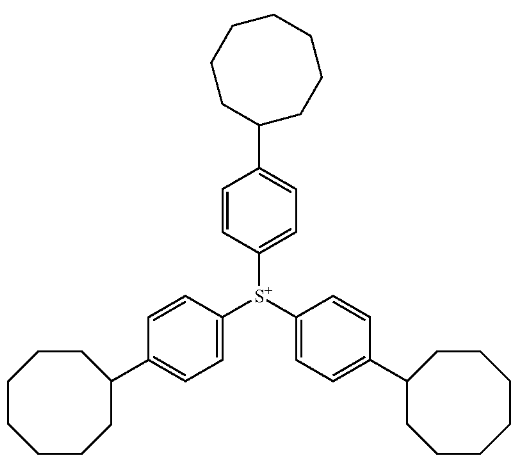
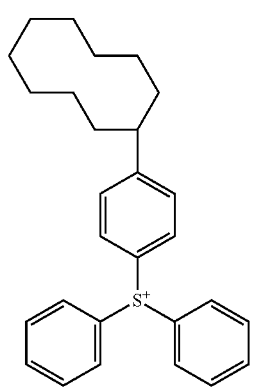
-continued
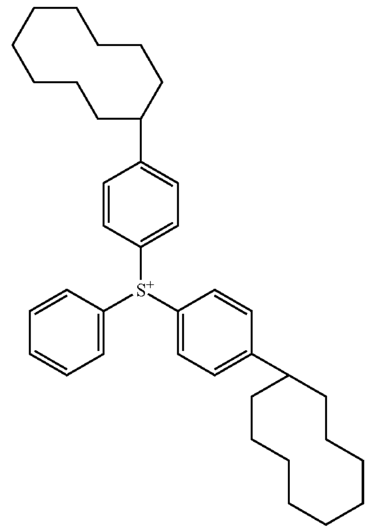
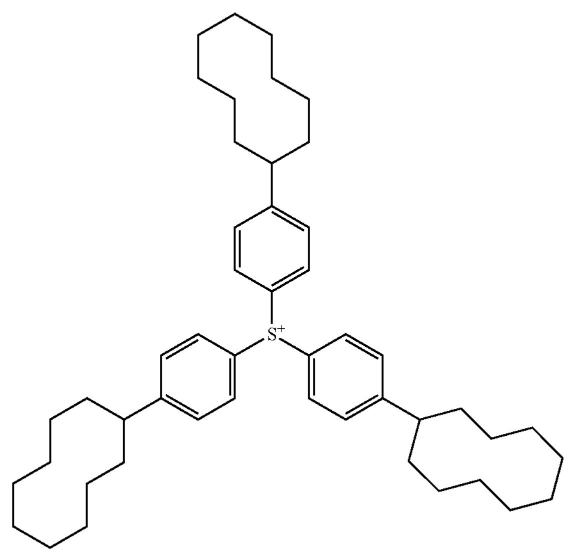
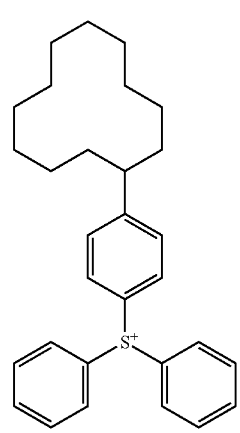

-continued
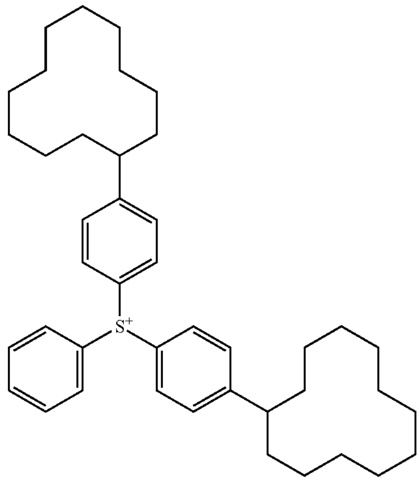
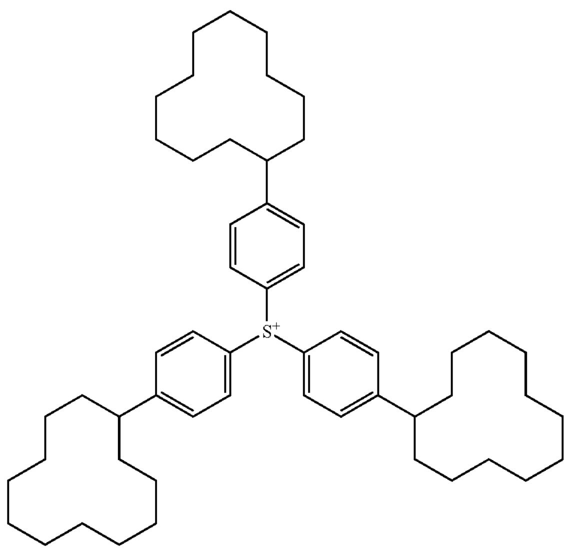
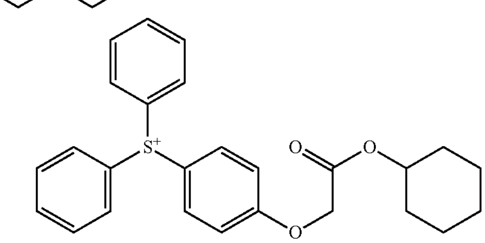
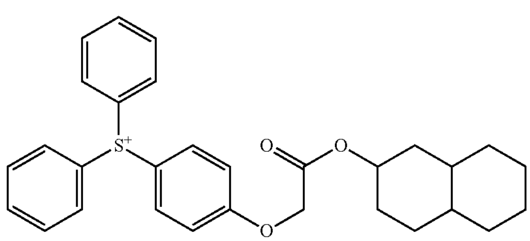
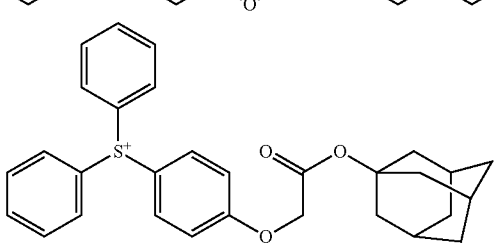
-continued
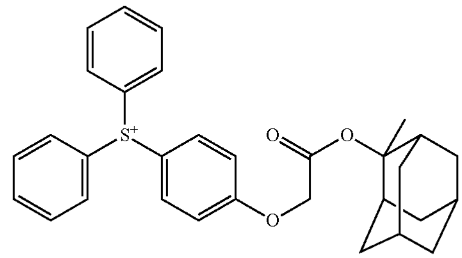
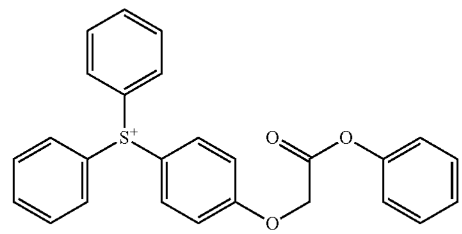
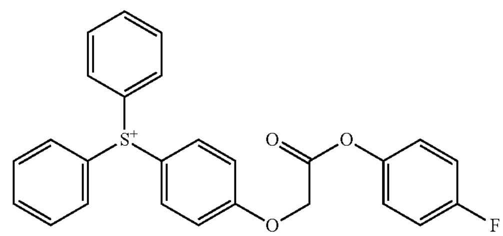
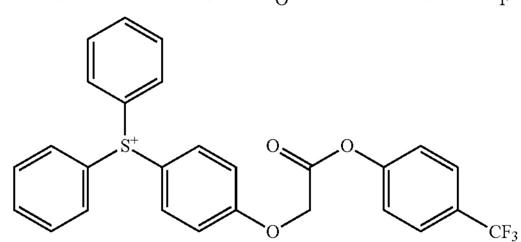
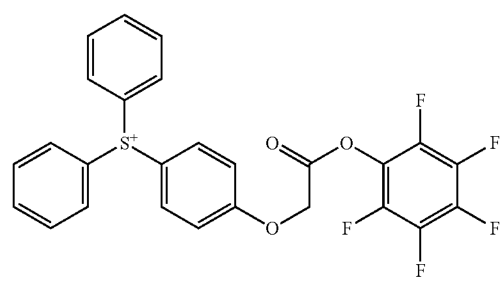
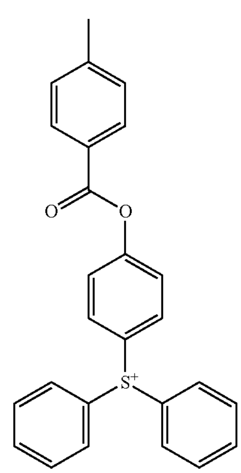
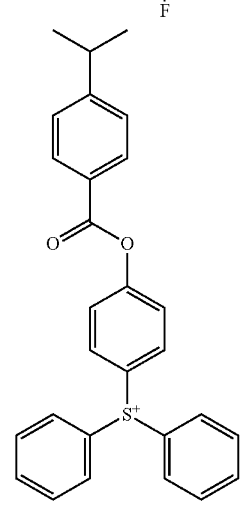

-continued
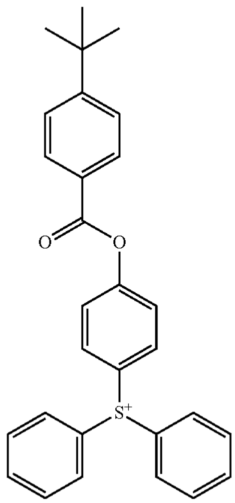
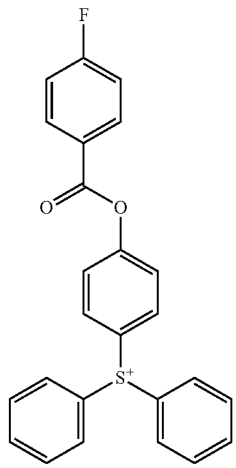
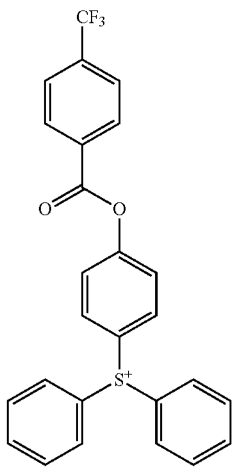
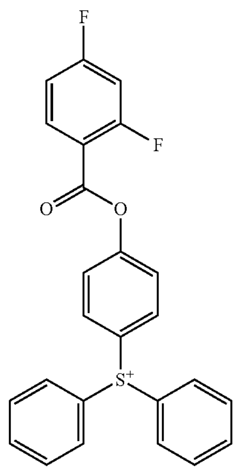
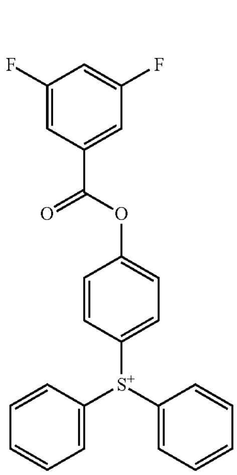
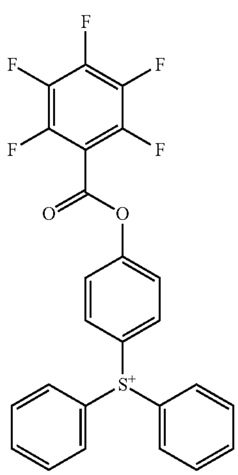
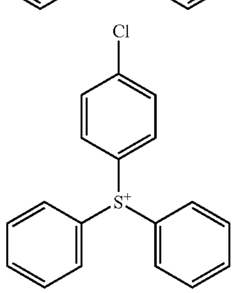
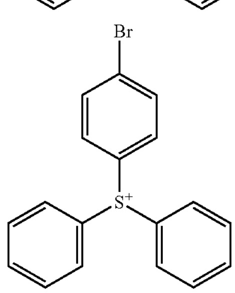
-continued
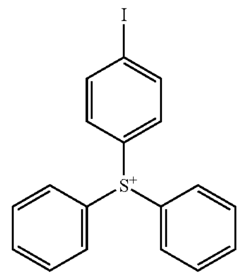
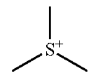
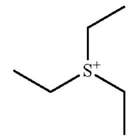
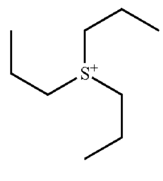
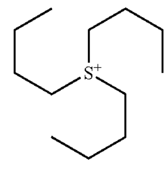
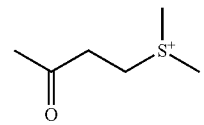
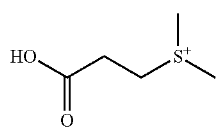
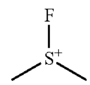
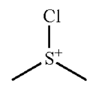
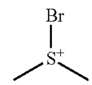
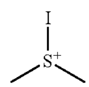
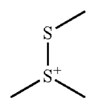
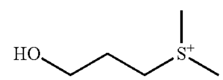
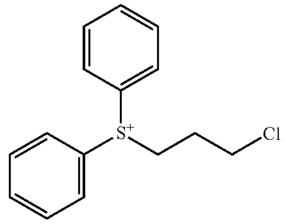
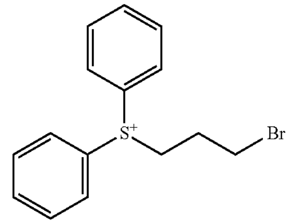
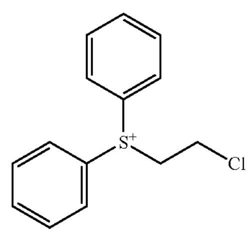
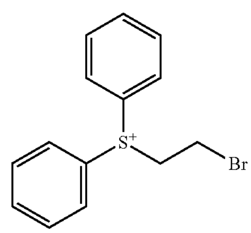
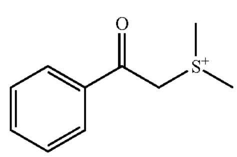
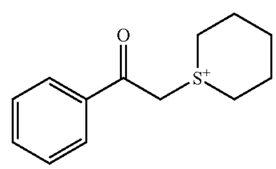
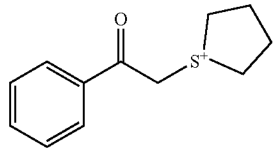
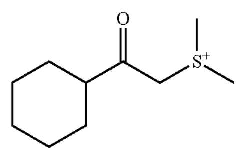
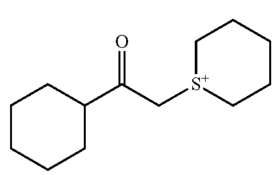
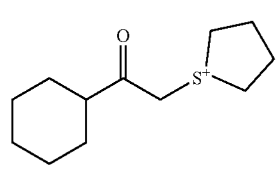

-continued

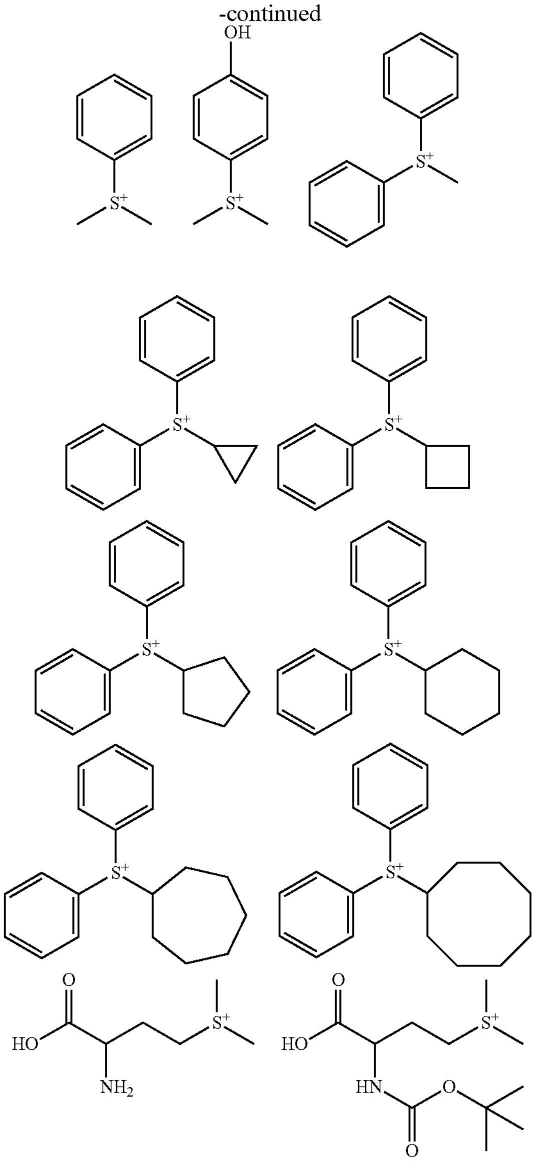

The sulfonium salt having formula (A-1) or (A-2) may be synthesized, for example, by ion exchange with a sulfonium salt of weaker acid than the brominated indole or brominated indazole carboxylic acid. Typical of the weaker acid than the brominated indole or brominated indazole carboxylic acid is carbonic acid. Alternatively, the sulfonium salt may be synthesized by ion exchange of a sodium or ammonium salt of brominated indole or brominated indazole carboxylic acid with a sulfonium chloride.

In the resist composition, the sulfonium salt having formula (A-1) or (A-2) is preferably used in an amount of 0.001 to 50 parts, more preferably 0.01 to 20 parts by weight per 100 parts by weight of the base polymer, as viewed from sensitivity and acid diffusion suppressing effect.

Base Polymer

Where the resist composition is of positive tone, the base polymer comprises recurring units containing an acid labile group, preferably recurring units having the formula (a1) or recurring units having the formula (a2). These units are simply referred to as recurring units (a1) and (a2), hereinafter.

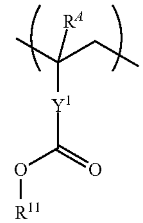

(a1)

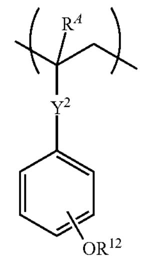

(a2)

Herein $R^A$ is each independently hydrogen or methyl. $Y^1$ is a single bond, phenylene group, naphthylene group, or a $C_1$-$C_{12}$ linking group containing an ester bond or lactone ring. $Y^2$ is a single bond or ester bond. $R^{11}$ and $R^{12}$ each are an acid labile group. Where the base polymer contains both recurring units (a1) and recurring units (a2), $R^{11}$ and $R^{12}$ may be the same or different.

Examples of the monomer from which recurring units (a1) are derived are shown below, but not limited thereto. $R^A$ and $R^{11}$ are as defined above.

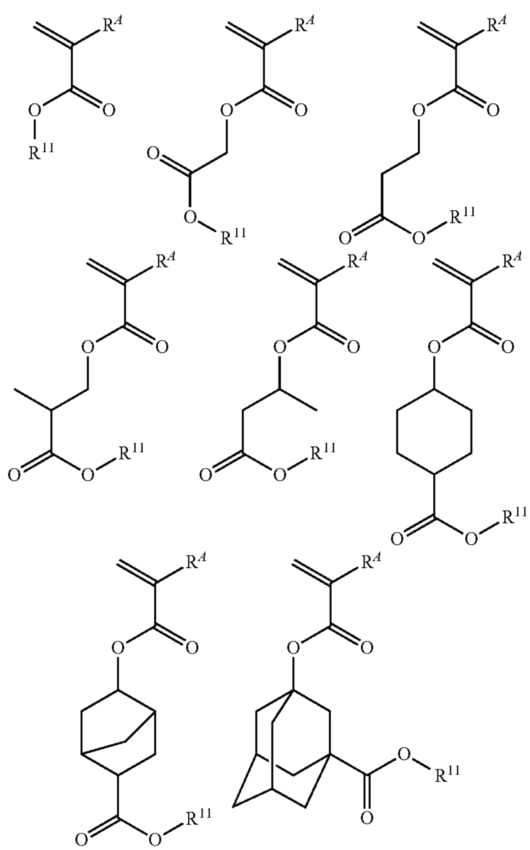

-continued

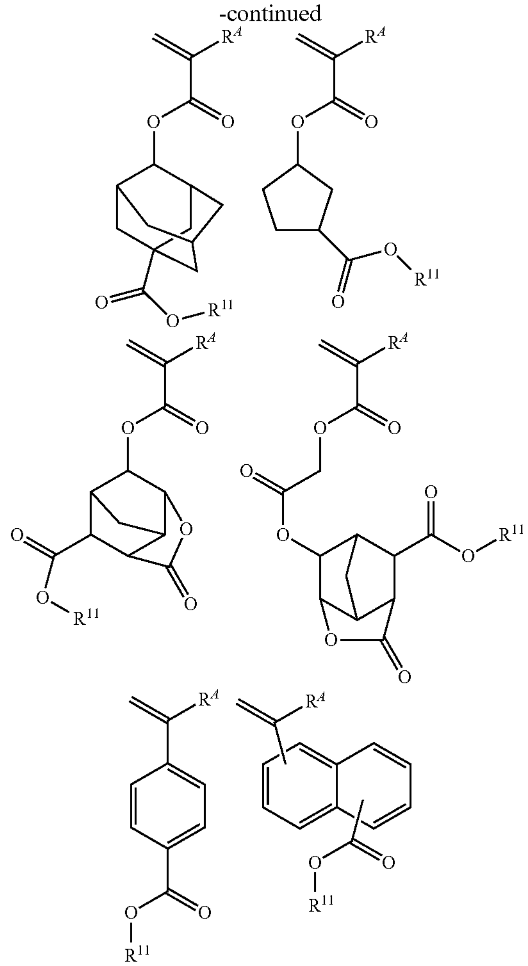

Examples of the monomer from which recurring units (a2) are derived are shown below, but not limited thereto. $R^A$ and $R^{12}$ are as defined above.

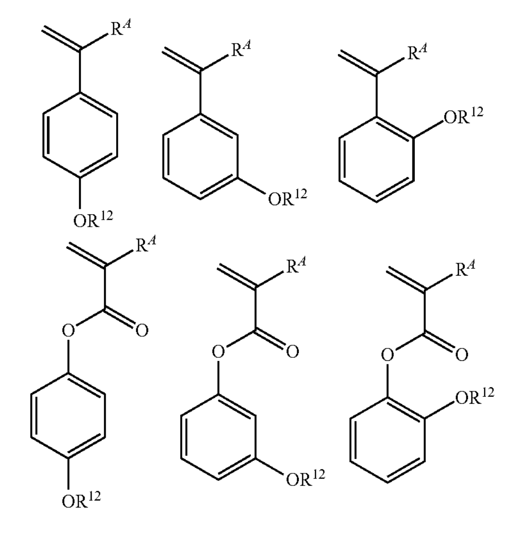

The acid labile groups represented by $R^{11}$ and $R^{12}$ in the recurring units (a1) and (a2) may be selected from a variety of such groups, for example, those described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

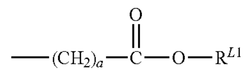

(AL-2)

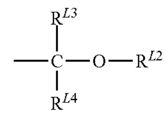

(AL-3)

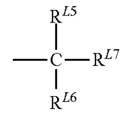

In formulae (AL-1) and (AL-2), $R^{L1}$ and $R^{L2}$ are each independently a $C_1$-$C_{40}$ monovalent hydrocarbon group which may contain a heteroatom such as oxygen, sulfur, nitrogen or fluorine. The monovalent hydrocarbon groups may be straight, branched or cyclic, with alkyl groups of 1 to 40 carbon atoms, especially 1 to 20 carbon atoms being preferred. In formula (AL-1), "a" is an integer of 0 to 10, especially 1 to 5.

In formula (AL-2), $R^{L3}$ and $R^{L4}$ are each independently hydrogen or a $C_1$-$C_{20}$ monovalent hydrocarbon group which may contain a heteroatom such as oxygen, sulfur, nitrogen or fluorine. The monovalent hydrocarbon groups may be straight, branched or cyclic, with $C_1$-$C_{20}$ alkyl groups being preferred. Any two of $R^{L2}$, $R^{L3}$ and $R^{L4}$ may bond together to form a ring with the carbon atom or carbon and oxygen atoms to which they are attached. The ring contains 3 to 20 carbon atoms, preferably 4 to 16 carbon atoms, and is typically alicyclic.

In formula (AL-3), $R^{L5}$, $R^{L6}$ and $R^{L7}$ are each independently a $C_1$-$C_{20}$ monovalent hydrocarbon group which may contain a heteroatom such as oxygen, sulfur, nitrogen or fluorine. The monovalent hydrocarbon groups may be straight, branched or cyclic, with $C_1$-$C_{20}$ alkyl groups being preferred. Any two of $R^{L5}$, $R^{L6}$ and $R^{L7}$ may bond together to form a ring with the carbon atom to which they are attached. The ring contains 3 to 20 carbon atoms, preferably 4 to 16 carbon atoms and is typically alicyclic.

The base polymer may further comprise recurring units (b) having a phenolic hydroxyl group as an adhesive group. Examples of suitable monomers from which recurring units (b) are derived are given below, but not limited thereto. Herein $R^A$ is as defined above.

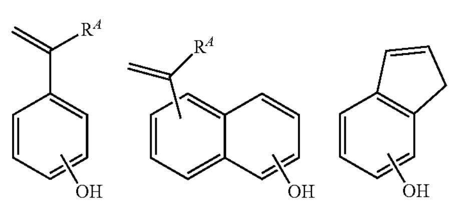

-continued

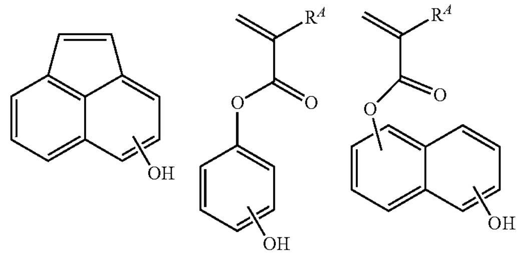

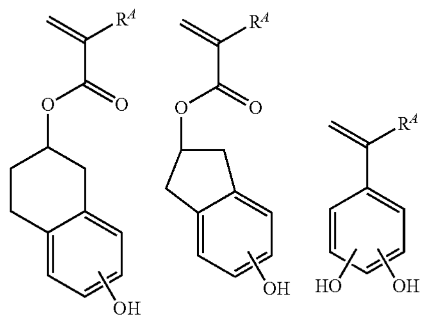

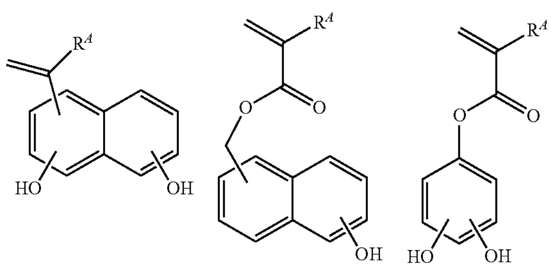

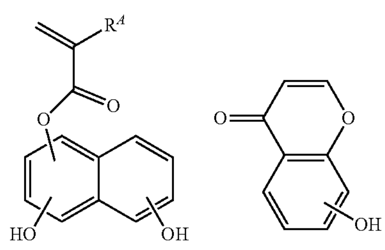

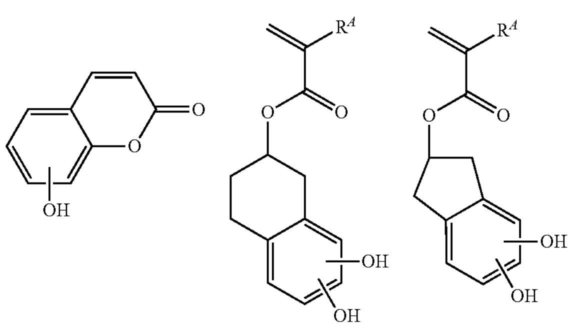

Further, recurring units (c) having another adhesive group selected from hydroxyl (other than the foregoing phenolic hydroxyl), carboxyl, lactone ring, ether, ester, carbonyl and cyano groups may also be incorporated in the base polymer. Examples of suitable monomers from which recurring units (c) are derived are given below, but not limited thereto. Herein $R^A$ is as defined above.

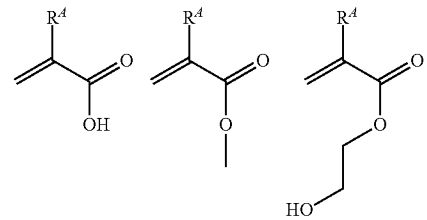

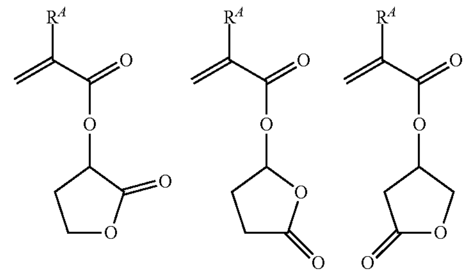

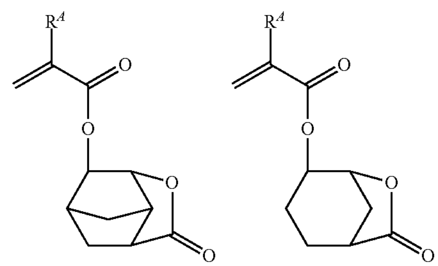

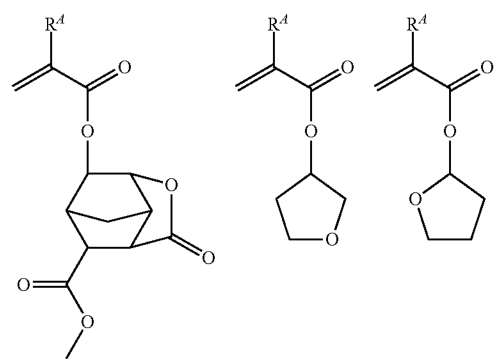

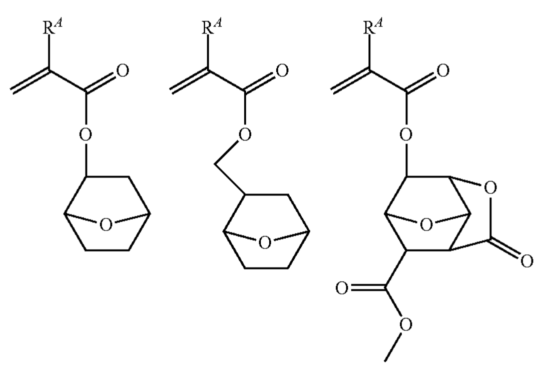

-continued
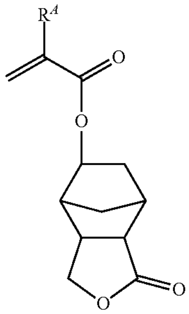
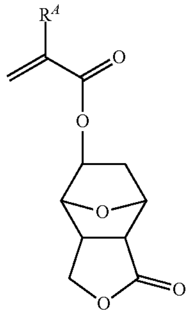
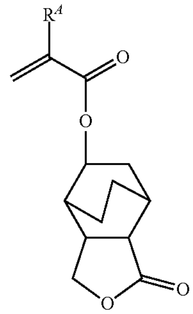
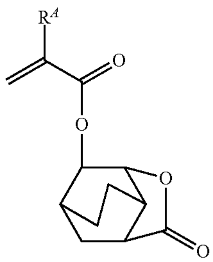
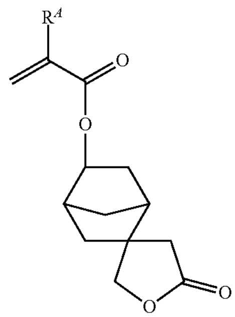
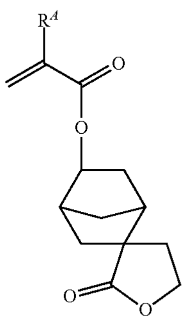
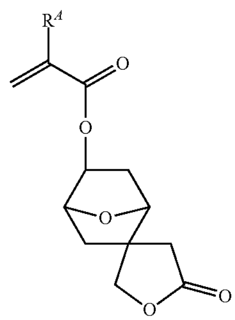
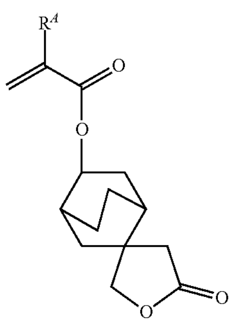
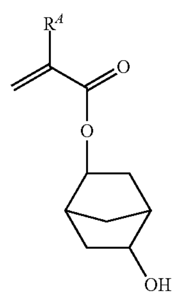
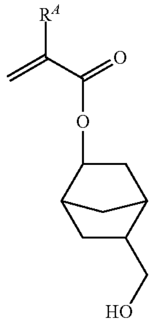
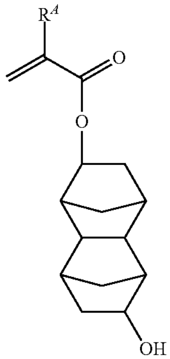
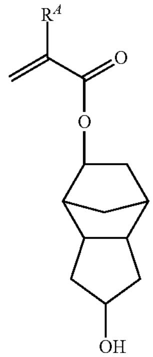
-continued
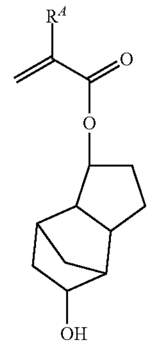
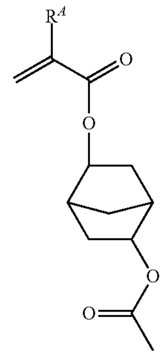
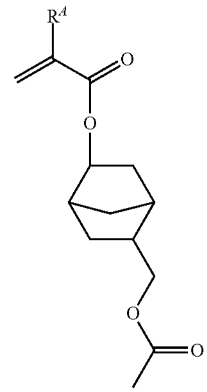
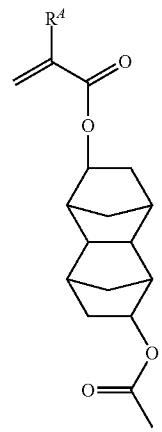
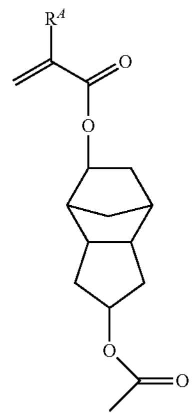
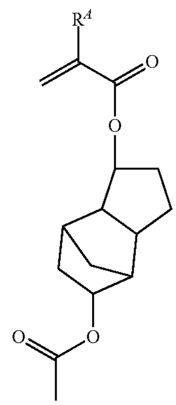
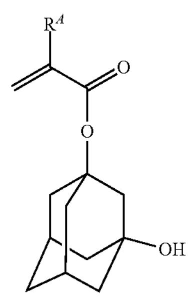
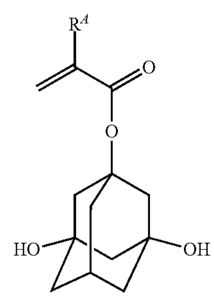
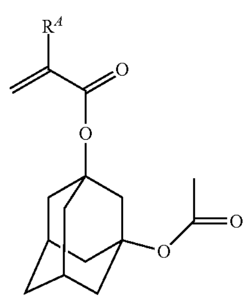
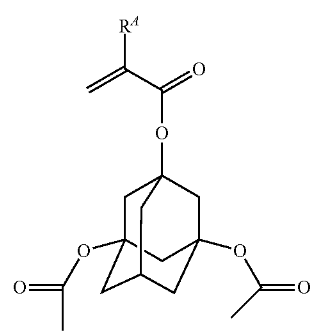

-continued
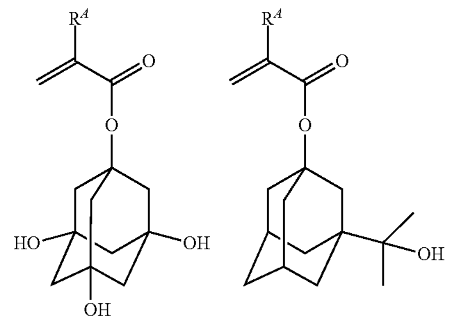
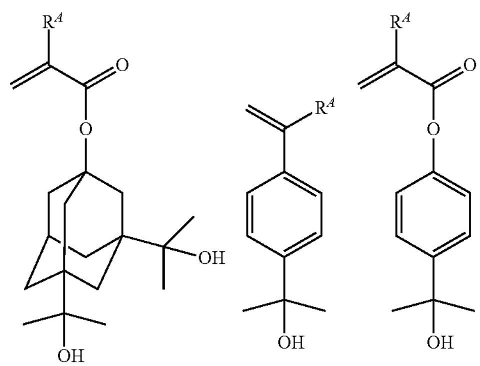
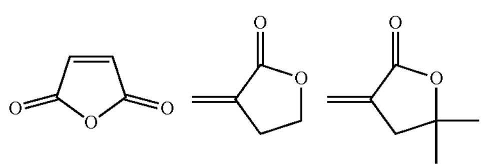
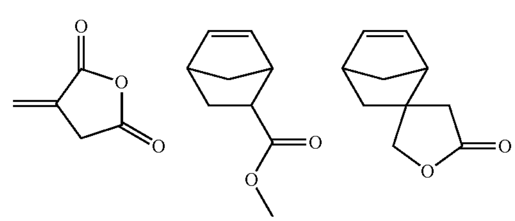
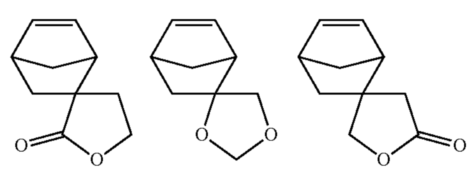
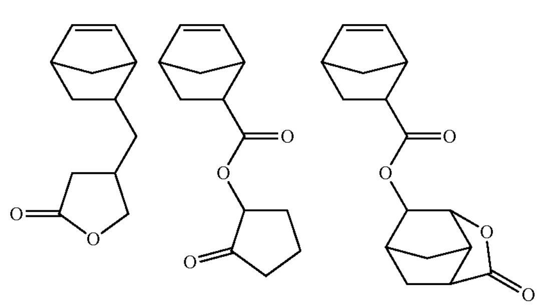
-continued
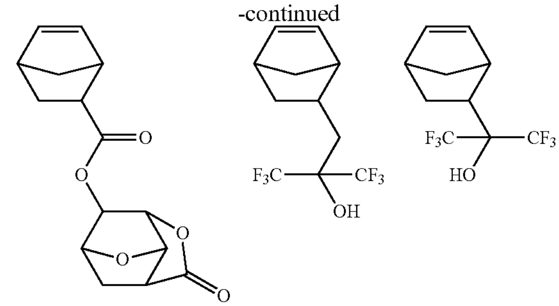
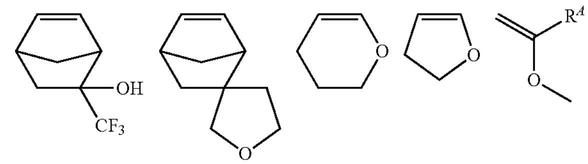
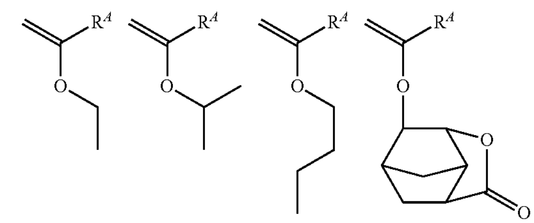
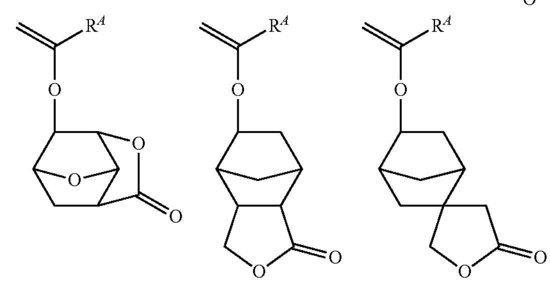
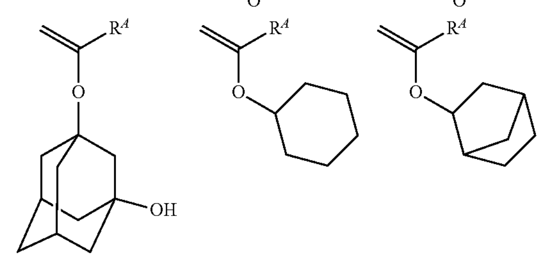
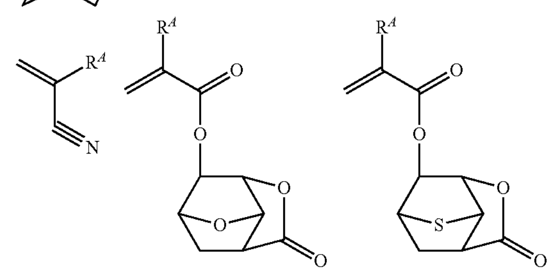
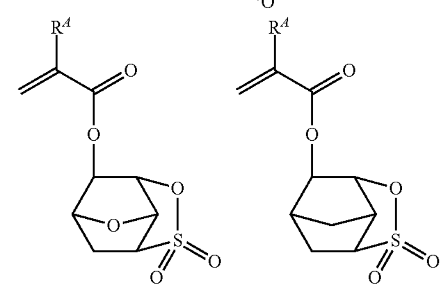

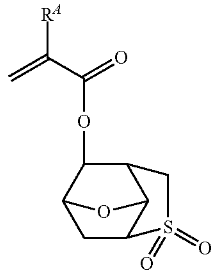
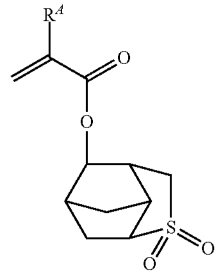
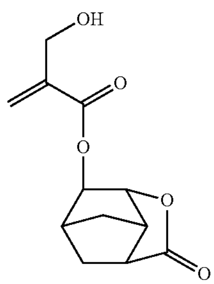
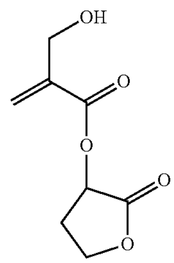
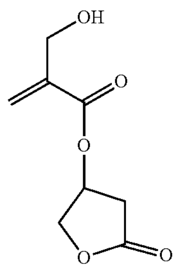
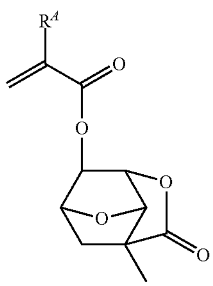
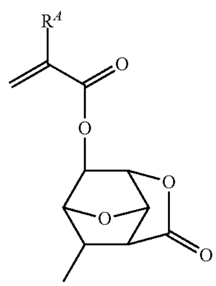
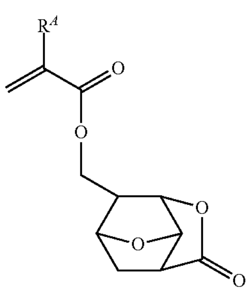
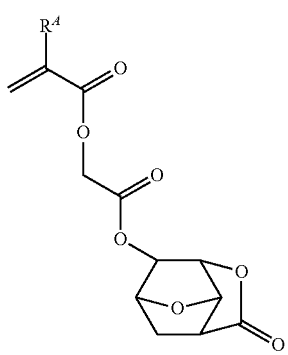
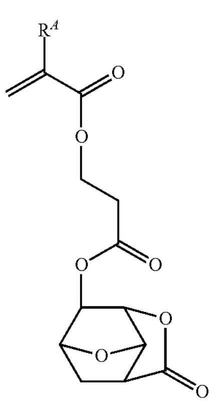
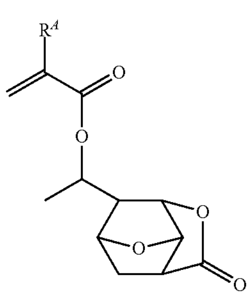
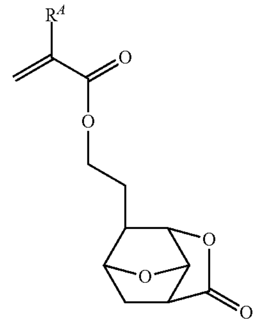
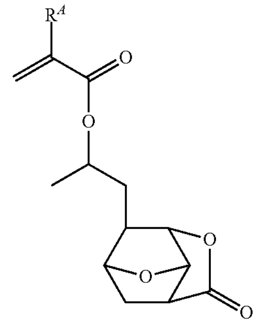
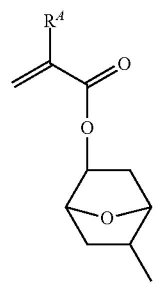
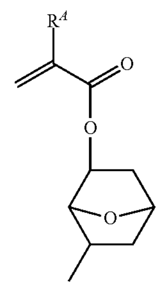
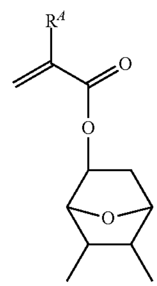
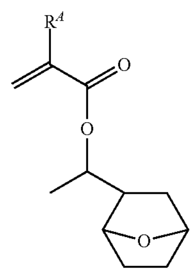
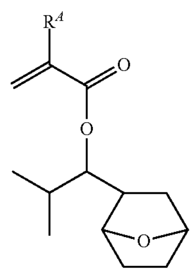
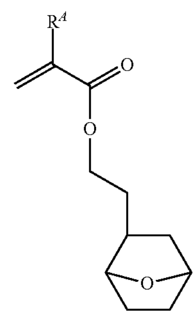
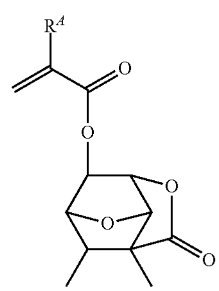
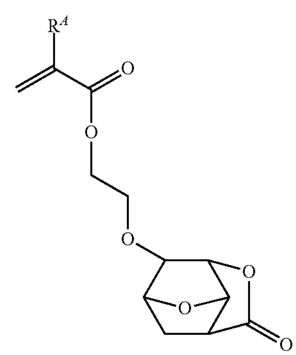
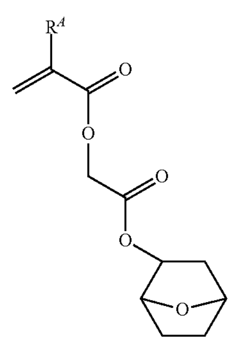
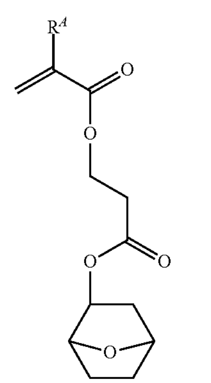

-continued
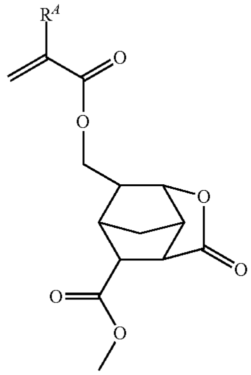
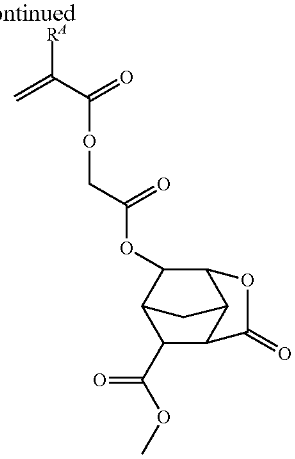
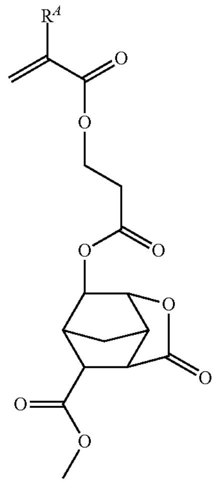
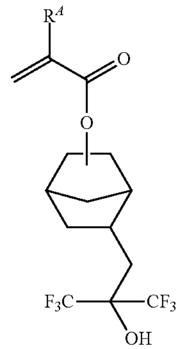
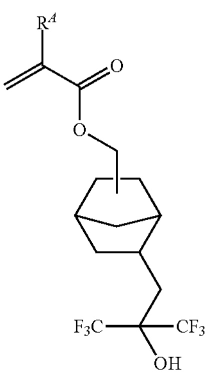
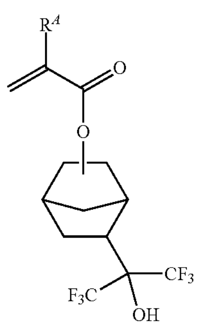
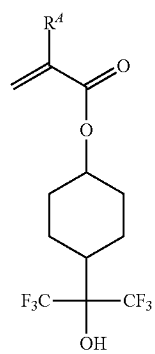
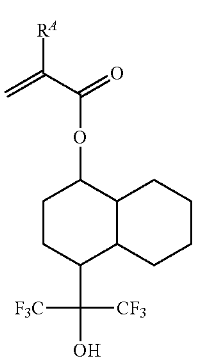
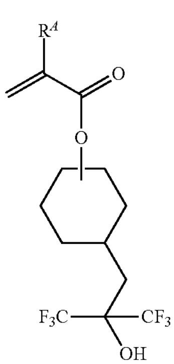
-continued
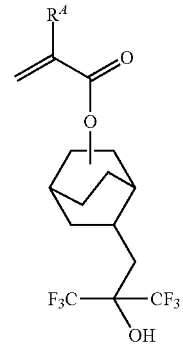
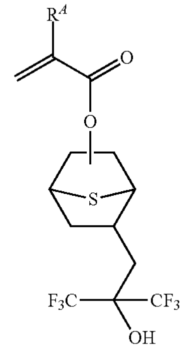
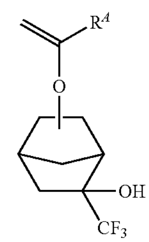
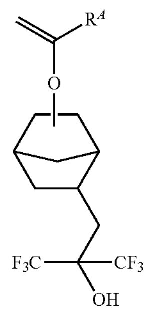
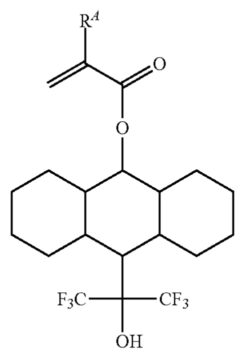
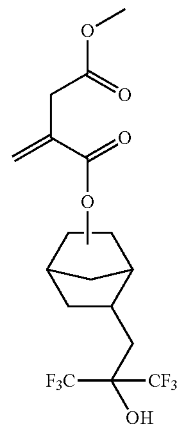
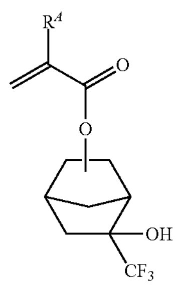
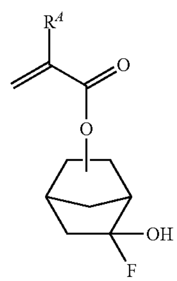
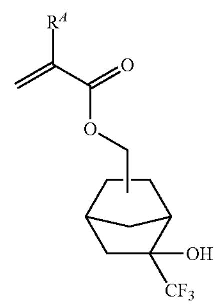
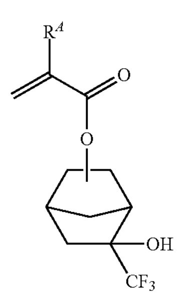
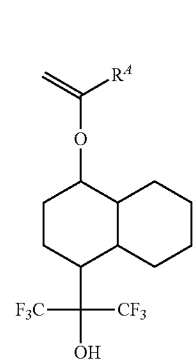

-continued
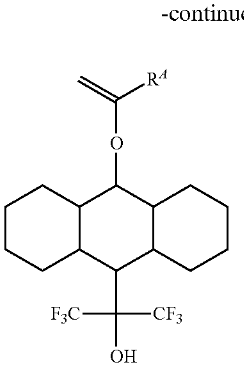
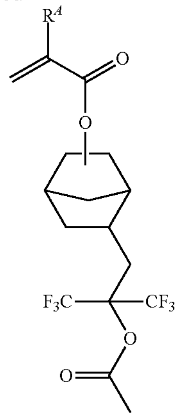
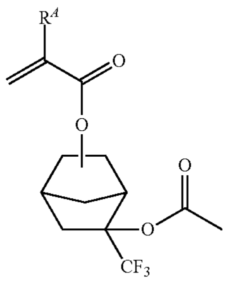
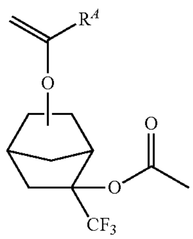
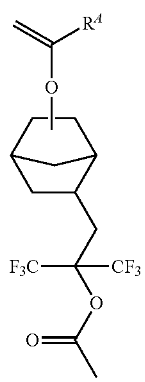
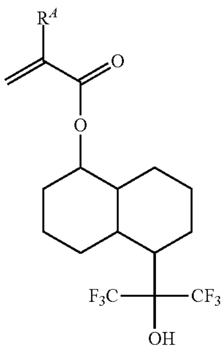
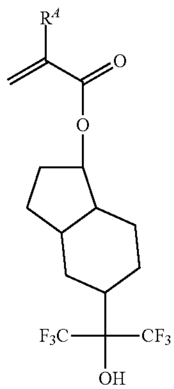
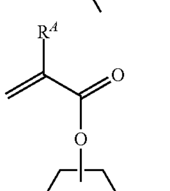
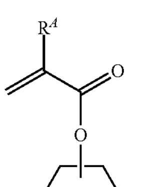
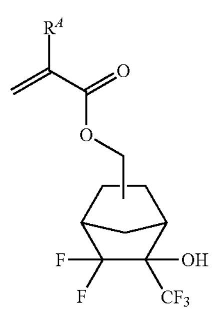
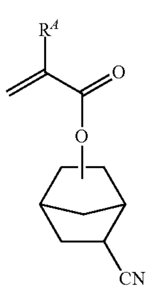
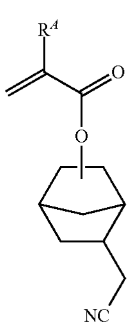
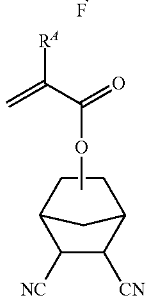
-continued
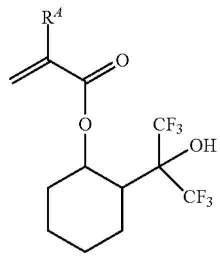
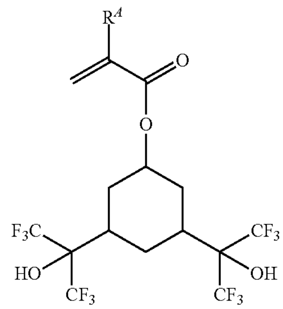
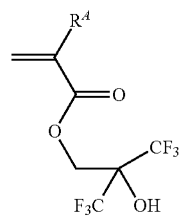
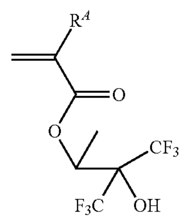
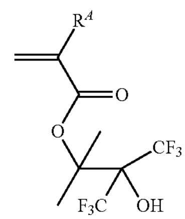
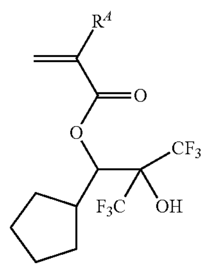
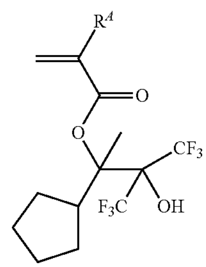
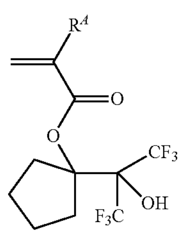
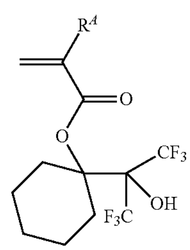
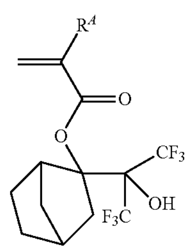
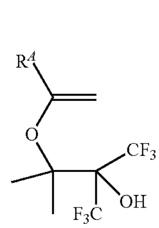
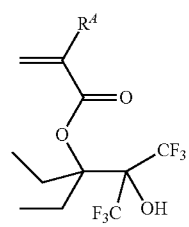
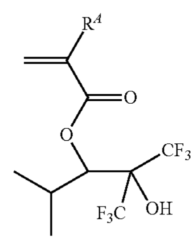
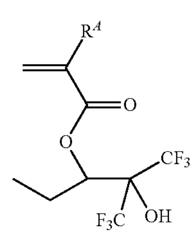
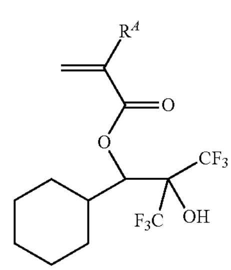

-continued
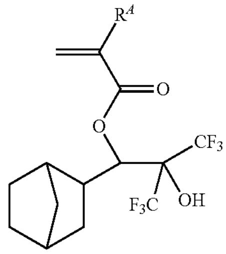
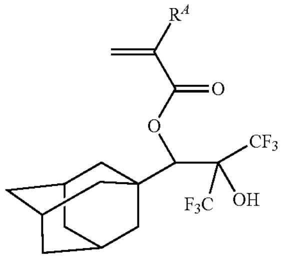
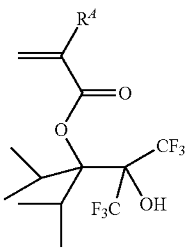
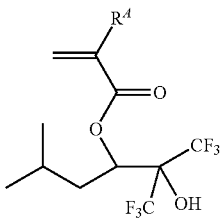
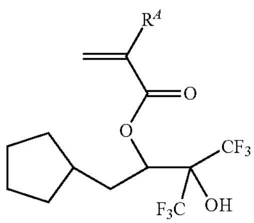
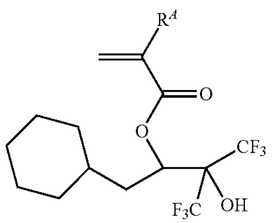
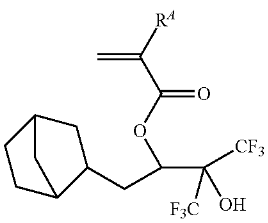
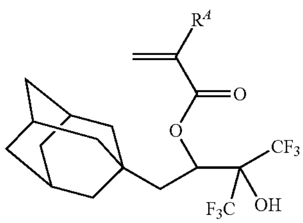
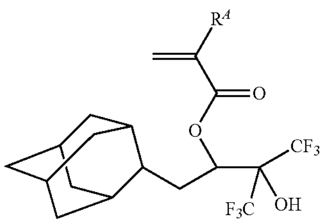
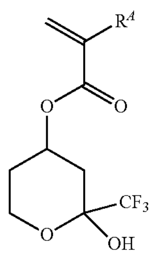
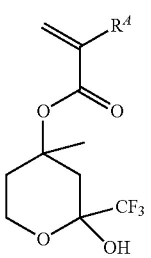
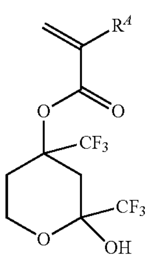
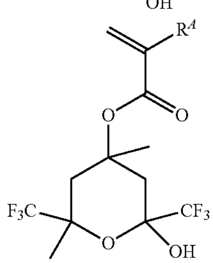
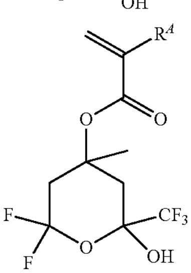
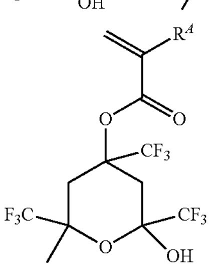
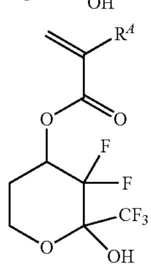
-continued
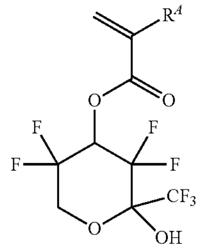
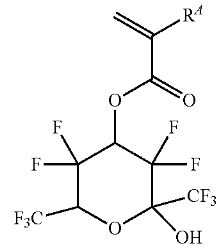
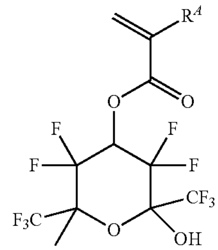
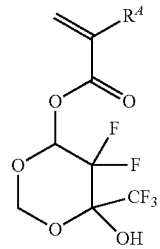
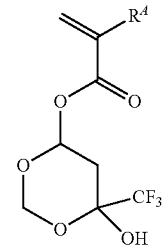
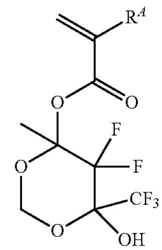
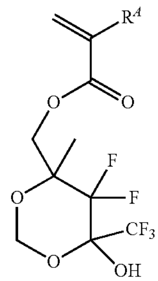
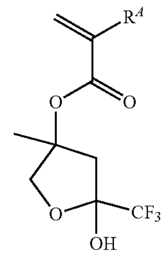
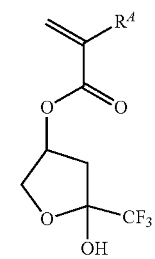
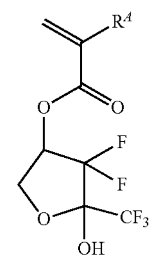
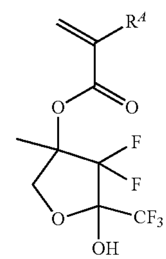
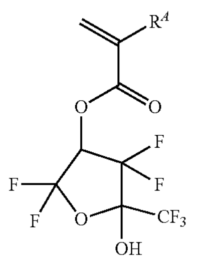
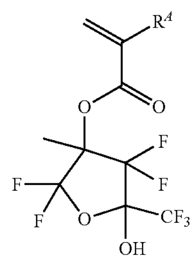
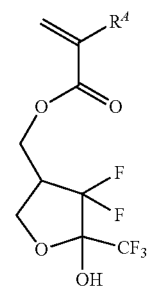
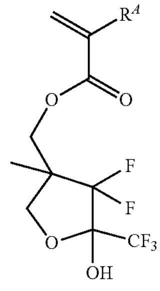
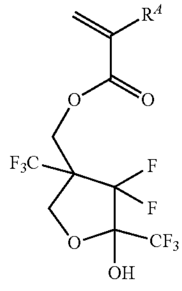
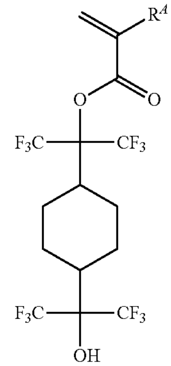

-continued
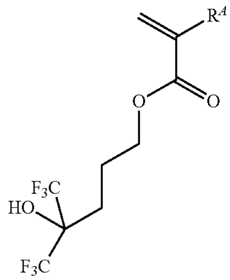
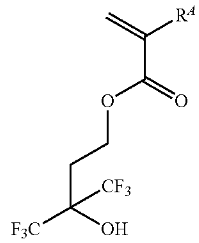
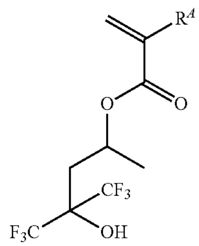
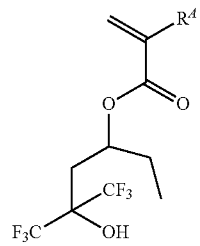
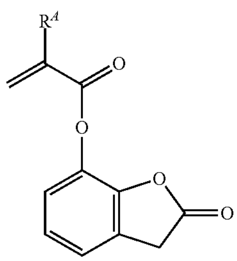
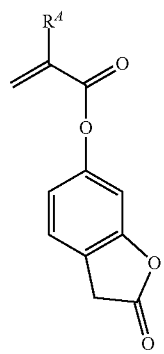
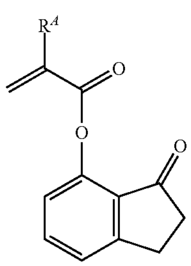
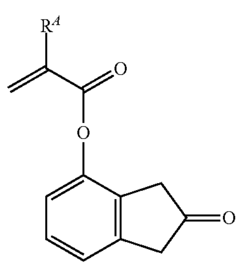
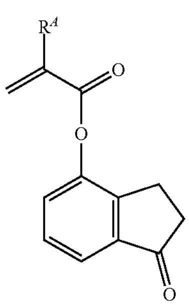
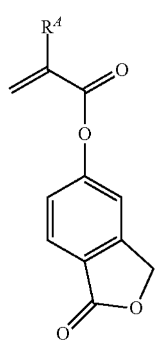
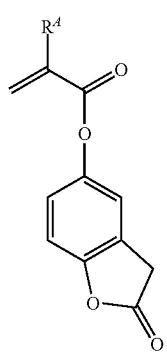
-continued
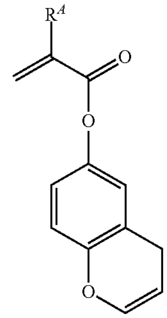
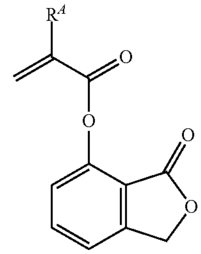
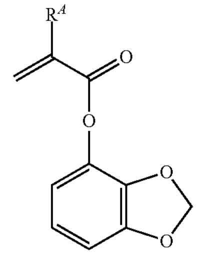
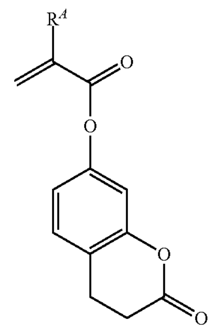
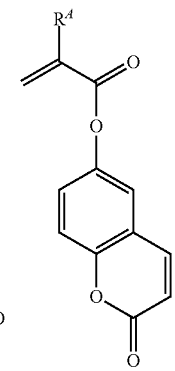
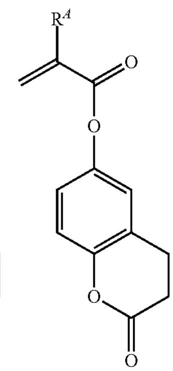
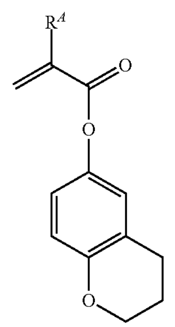
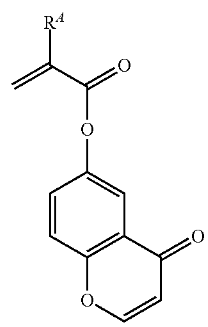
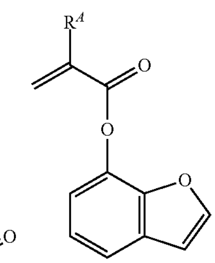
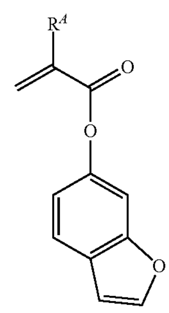
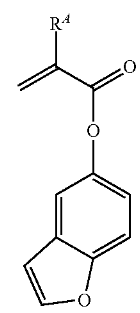
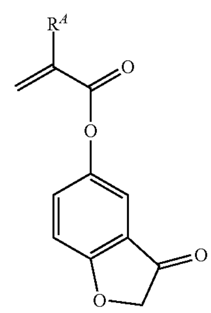
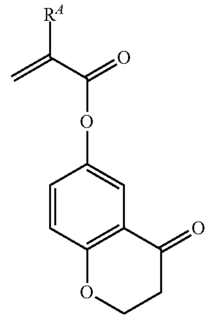
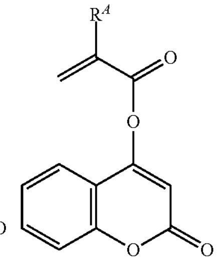

-continued
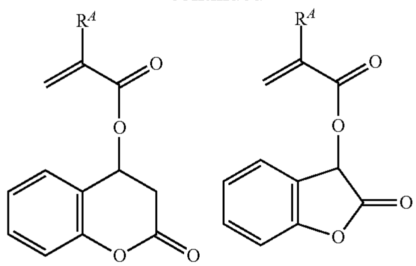
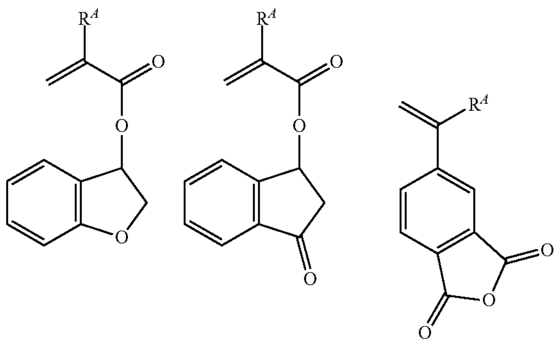
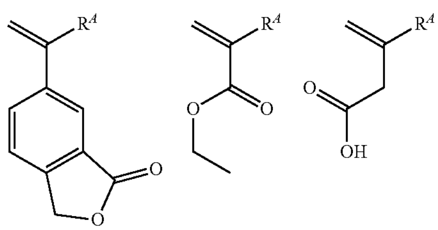
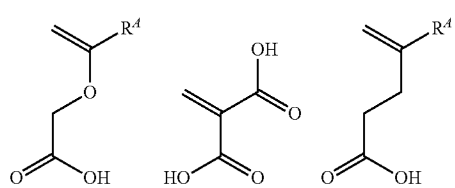
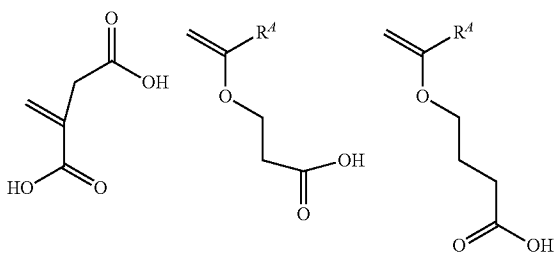
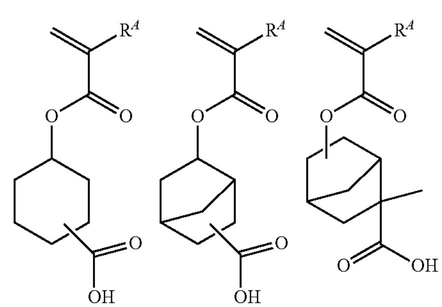
-continued
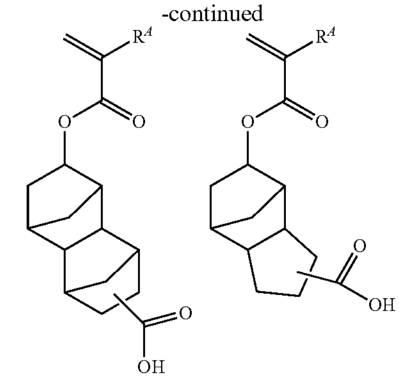
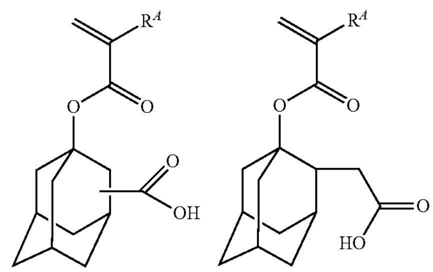
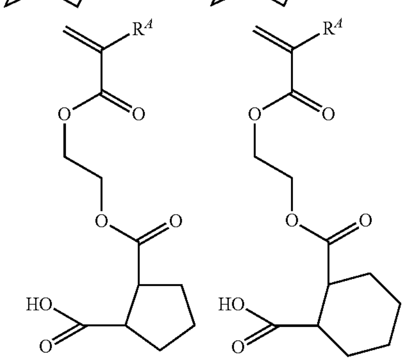
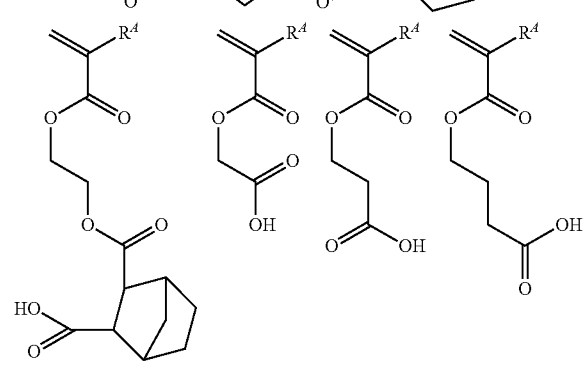
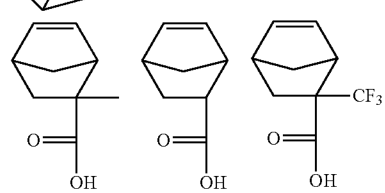
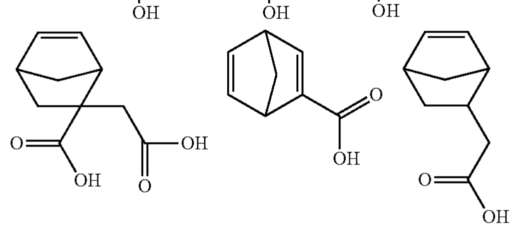

In another preferred embodiment, the base polymer may further comprise recurring units (d) selected from units of indene, benzofuran, benzothiophene, acenaphthylene, chromone, coumarin, and norbornadiene, or derivatives thereof. Suitable monomers are exemplified below.

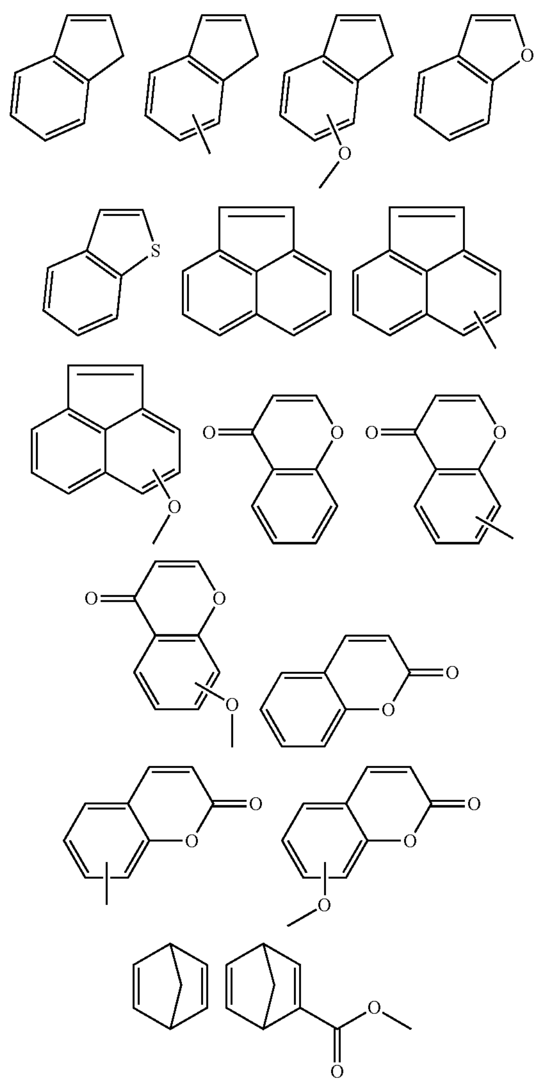

Besides the recurring units described above, further recurring units (e) may be incorporated in the base polymer, examples of which include styrene, vinylnaphthalene, vinylanthracene, vinylpyrene, methyleneindene, vinylpyridine, and vinylcarbazole.

In a further embodiment, recurring units (f) derived from an onium salt having a polymerizable unsaturated bond may be incorporated in the base polymer. JP-A 2005-084365 discloses sulfonium and iodonium salts having a polymerizable unsaturated bond capable of generating a sulfonic acid. JP-A 2006-178317 discloses a sulfonium salt having sulfonic acid directly attached to the main chain.

The preferred recurring units (f) are recurring units having the following formulae (f1), (f2) and (f3). These units are simply referred to as recurring units (f1), (f2) and (f3), which may be used alone or in combination of two or more types.

(f1)

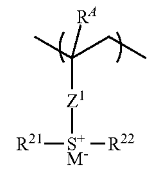

(f2)

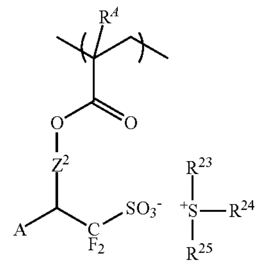

(f3)

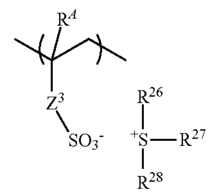

Herein $R^A$ is each independently hydrogen or methyl. $Z^1$ is a single bond, phenylene group, —O—$Z^{12}$—, or —C(═O)—$Z^{11}$—$Z^{12}$—, wherein $Z^{11}$ is —O— or —NH—, and $Z^{12}$ is a $C_1$-$C_6$ alkylene, $C_2$-$C_6$ alkenylene or phenylene group, which may contain a carbonyl, ester bond, ether bond or hydroxyl moiety. $Z^2$ is a single bond, or —$Z^{21}$—O—C(═O)—, wherein $Z^{21}$ is a $C_1$-$C_{12}$ alkylene group which may contain a carbonyl moiety, ester bond or ether bond. $Z^3$ is a single bond, methylene, ethylene, phenylene or fluorinated phenylene group, —O—$Z^{32}$—, or —C(═O)—$Z^{31}$—$Z^{32}$—, wherein $Z^{31}$ is —O— or —NH—, and $Z^{32}$ is a $C_1$-$C_6$ alkylene, phenylene, fluorinated phenylene, trifluoromethyl-substituted phenylene, or $C_2$-$C_6$ alkenylene group, which may contain a carbonyl, ester bond, ether bond or hydroxyl moiety. "A" is hydrogen or trifluoromethyl.

$R^{21}$ to $R^{28}$ are each independently a $C_1$-$C_{20}$ monovalent hydrocarbon group which may contain a heteroatom. Any two of $R^{23}$, $R^{24}$ and $R^{25}$ or any two of $R^{26}$, $R^{27}$ and $R^{28}$ may bond together to form a ring with the sulfur atom to which they are attached.

The monovalent hydrocarbon group may be straight, branched or cyclic and examples thereof are as exemplified above for $R^3$ to $R^5$ in formulae (A-1) and (A-2). The sulfonium cation in formulae (f2) and (f3) is preferably selected from the above-exemplified cations in the sulfonium salt having formula (A-1) or (A-2).

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (K-1) and sulfonate ions having fluorine substituted at α- and β-positions as represented by the formula (K-2).

$$R^{51}-CF_2-SO_3^- \quad \text{(K-1)}$$

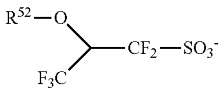

(K-2)

In formula (K-1), $R^{51}$ is hydrogen, or a $C_1$-$C_{20}$ alkyl group, $C_2$-$C_{20}$ alkenyl group, or $C_6$-$C_{20}$ aryl group, which may contain an ether bond, ester bond, carbonyl moiety, lactone ring, or fluorine atom. The alkyl and alkenyl groups may be straight, branched or cyclic.

In formula (K-2), $R^{52}$ is hydrogen, or a $C_1$-$C_{30}$ alkyl group, $C_2$-$C_{30}$ acyl group, $C_2$-$C_{20}$ alkenyl group, $C_6$-$C_{20}$ aryl group or $C_6$-$C_{20}$ aryloxy group, which may contain an ether bond, ester bond, carbonyl moiety or lactone ring. The alkyl and alkenyl groups may be straight, branched or cyclic.

Examples of the monomer from which recurring unit (f1) is derived are shown below, but not limited thereto. $R^A$ and $M^-$ are as defined above.

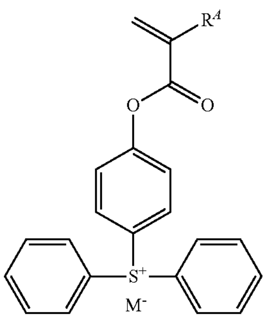

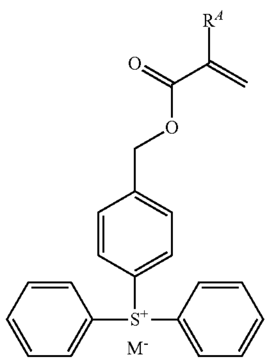

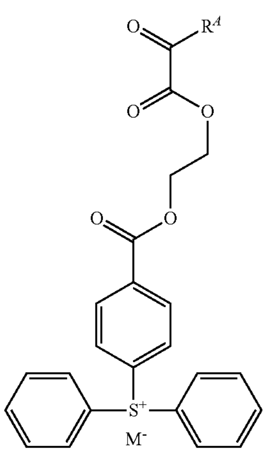

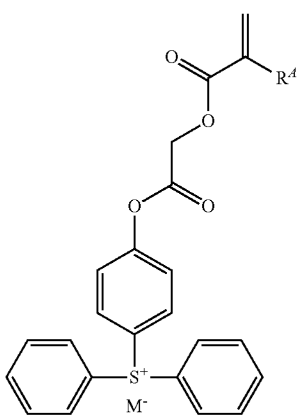

-continued

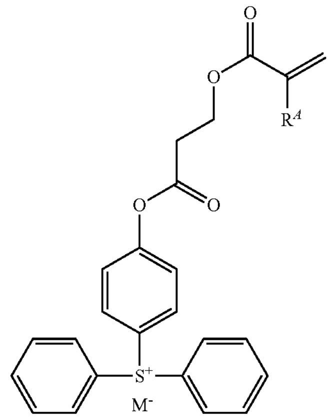

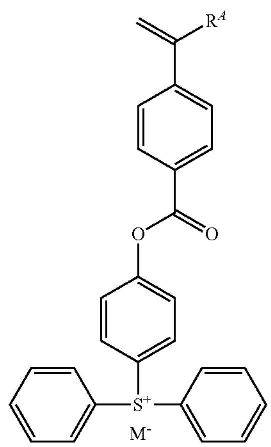

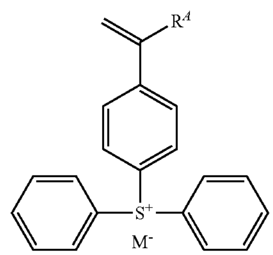

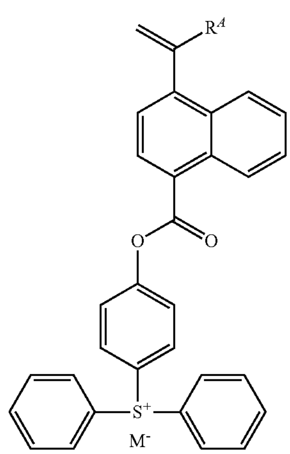

-continued
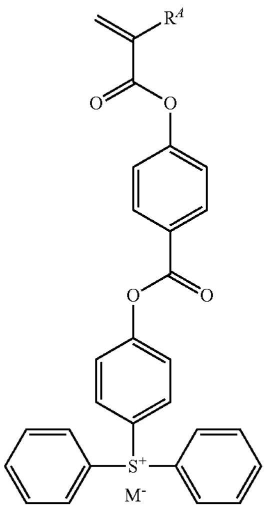
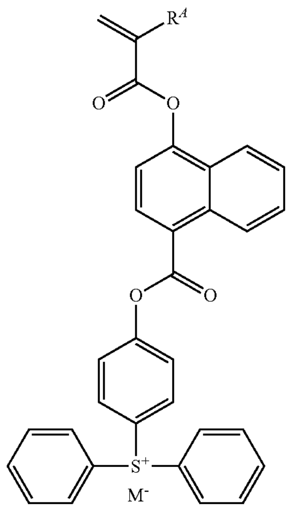
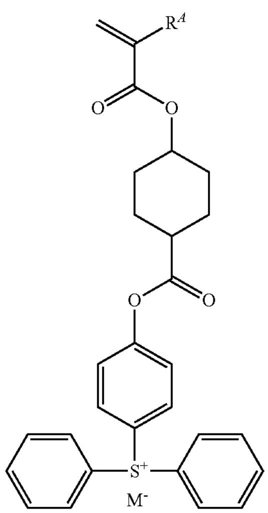
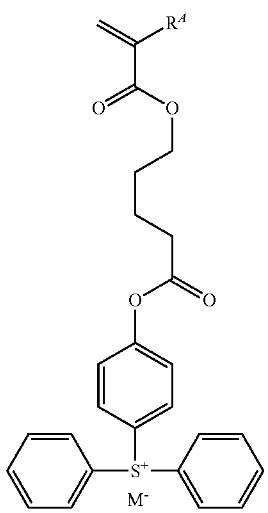
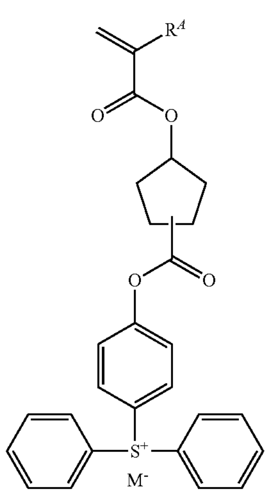
-continued
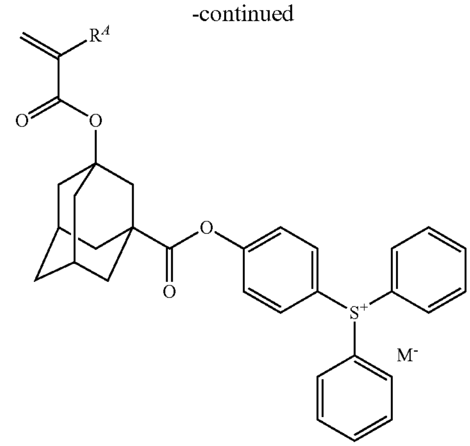
Examples of the monomer from which recurring unit (f2) is derived are shown below, but not limited thereto. $R^A$ is as defined above.
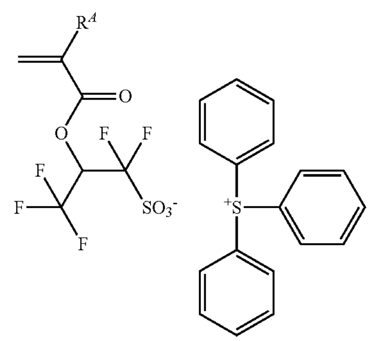
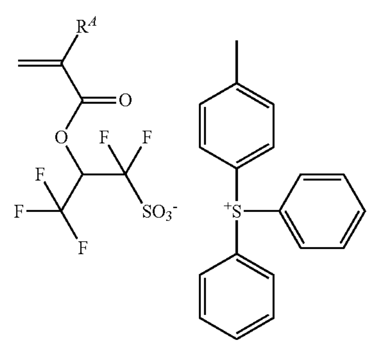
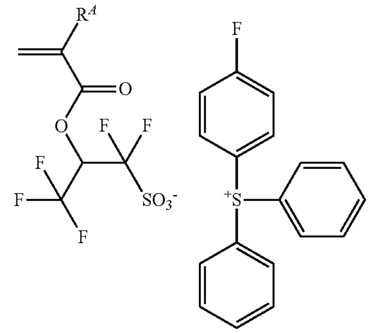

-continued
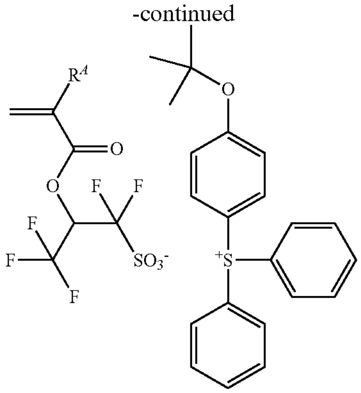
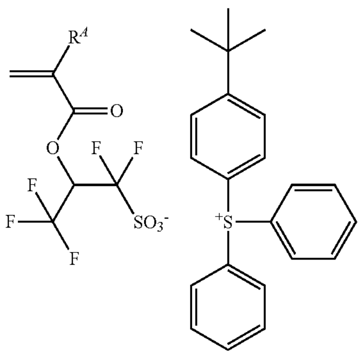
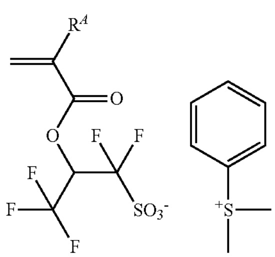
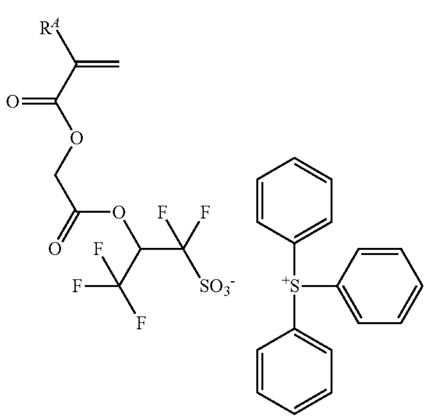
-continued
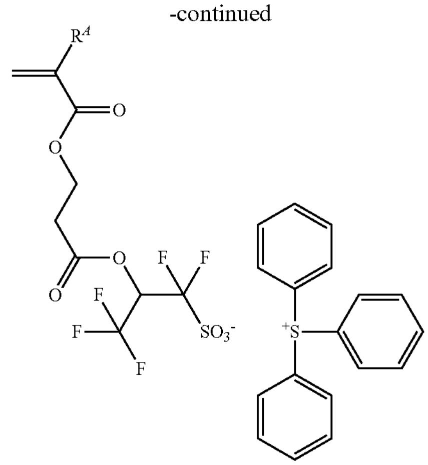
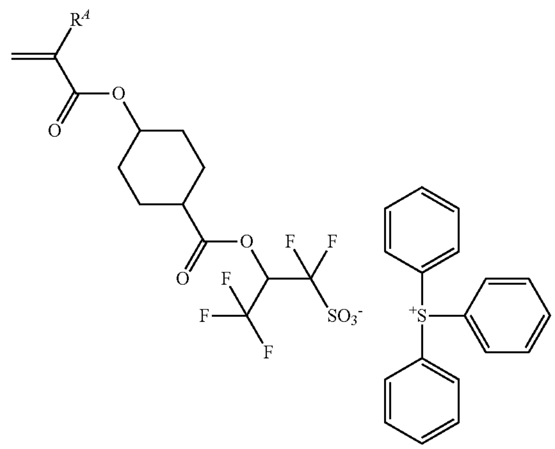
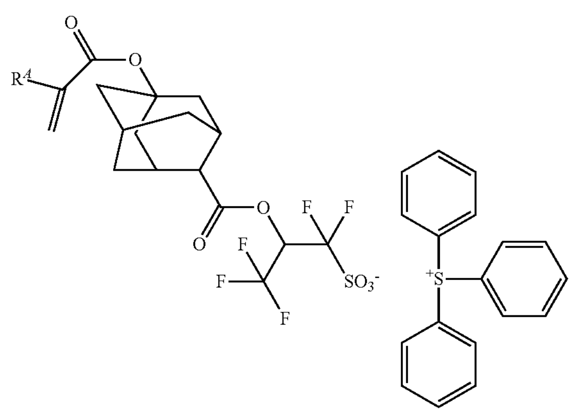
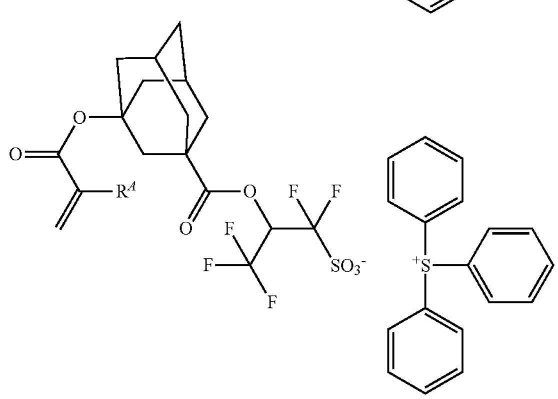

-continued
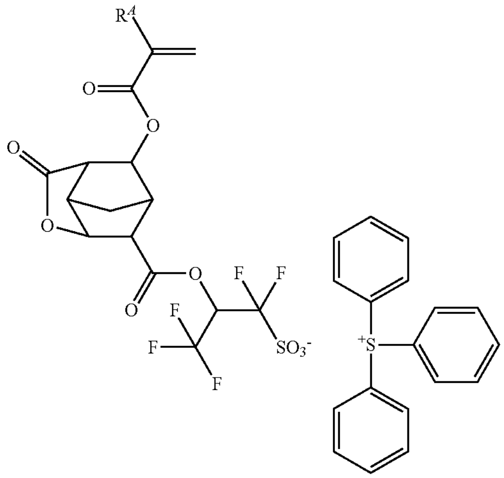
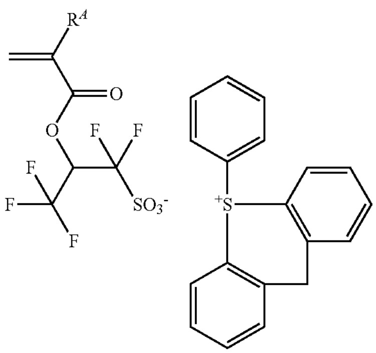
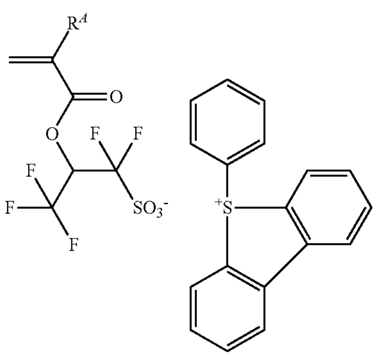
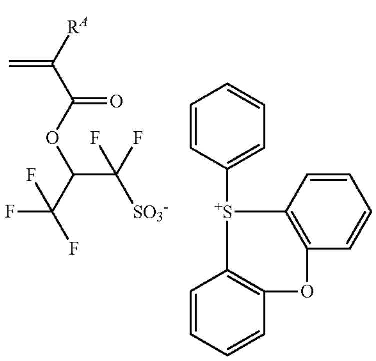
-continued
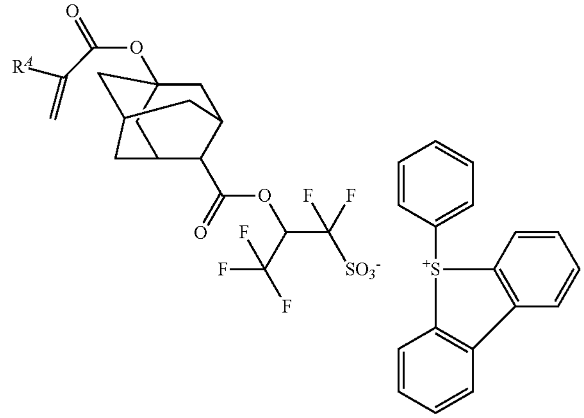
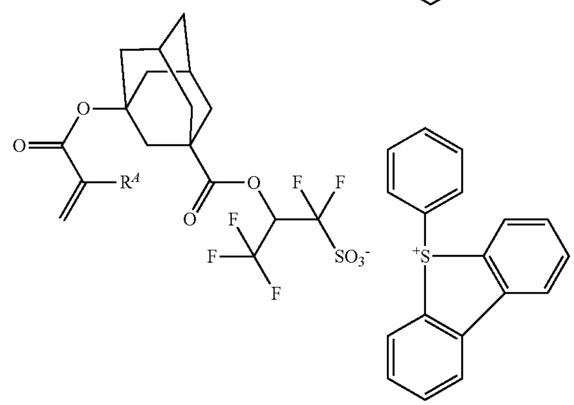
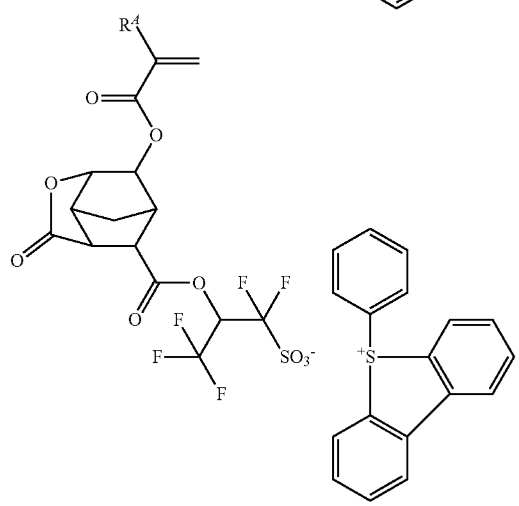
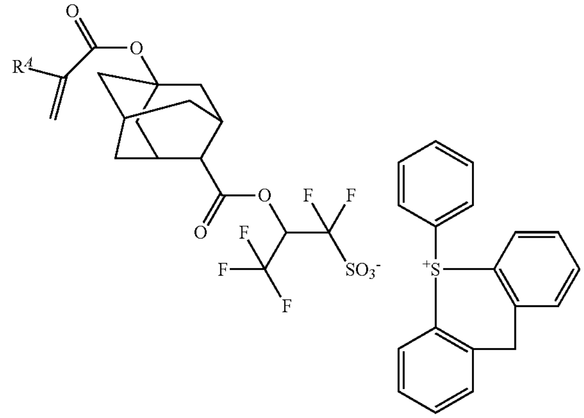

-continued
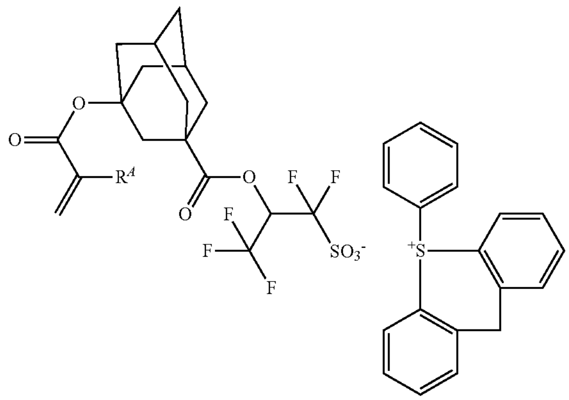
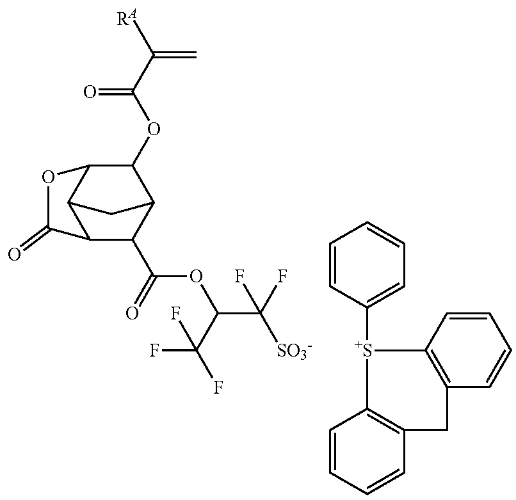
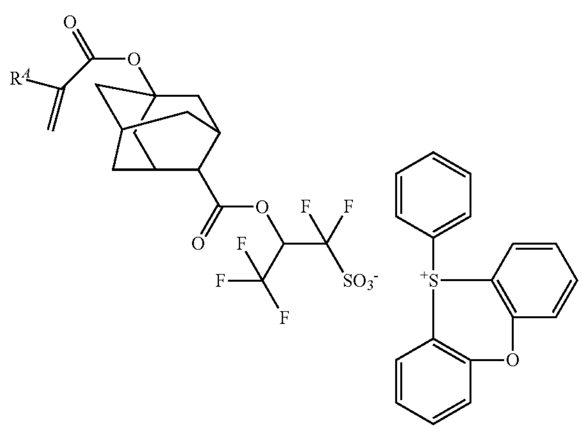
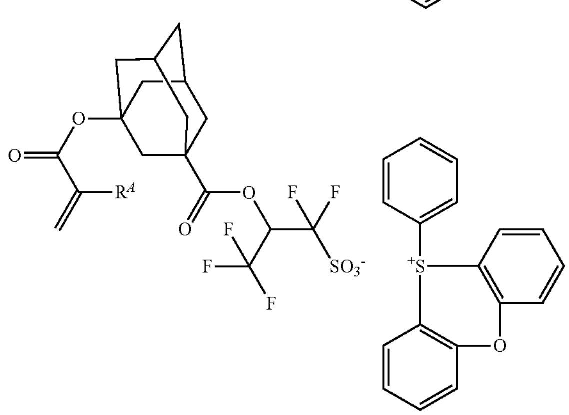
-continued
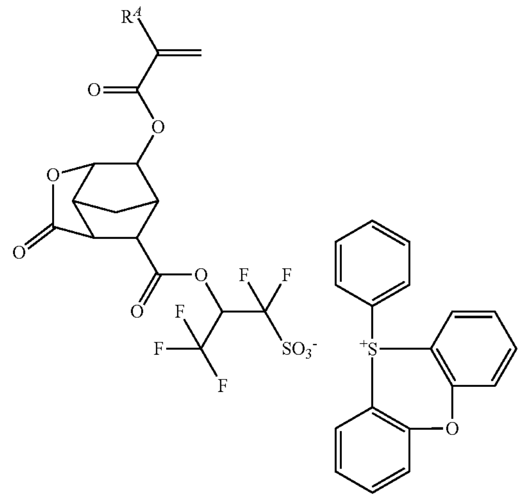
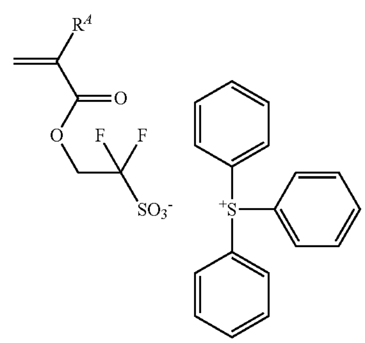
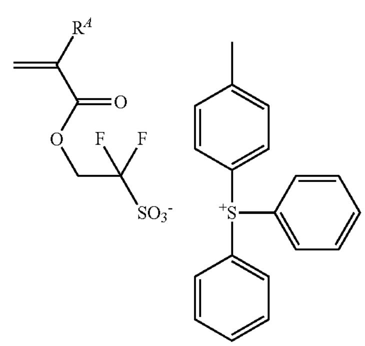
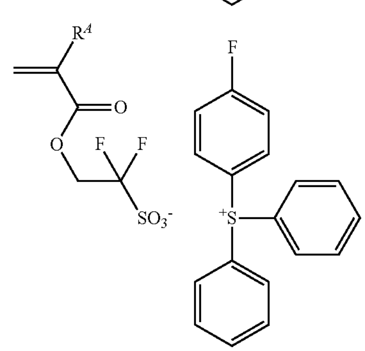

-continued
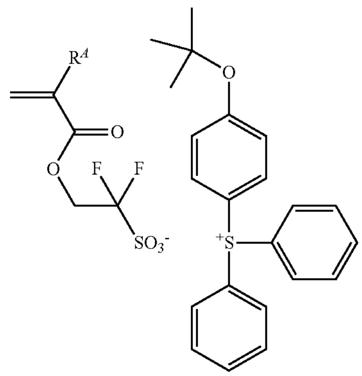
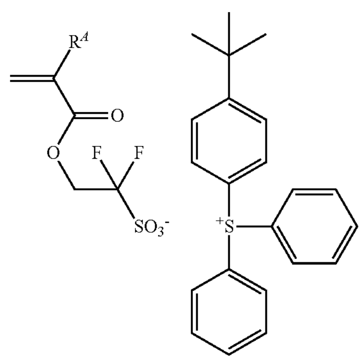
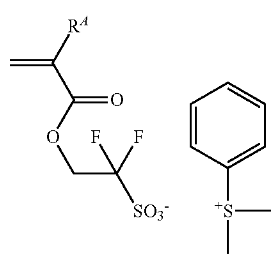
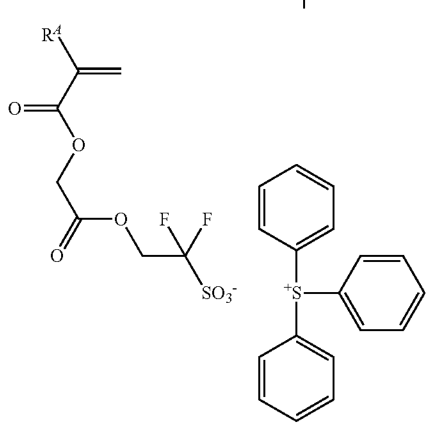
-continued
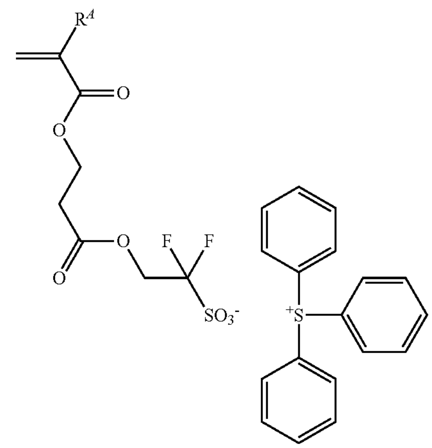
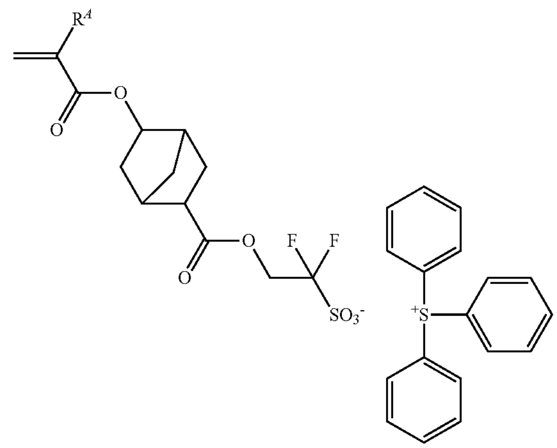
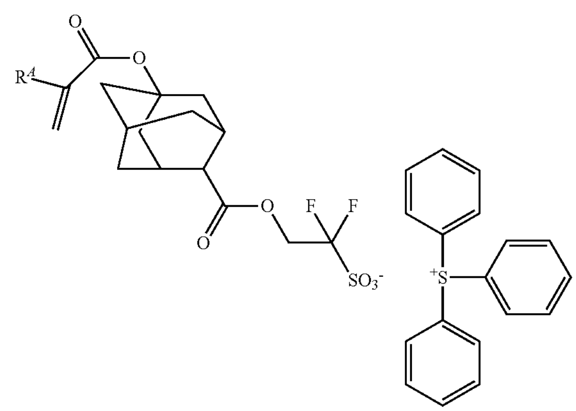
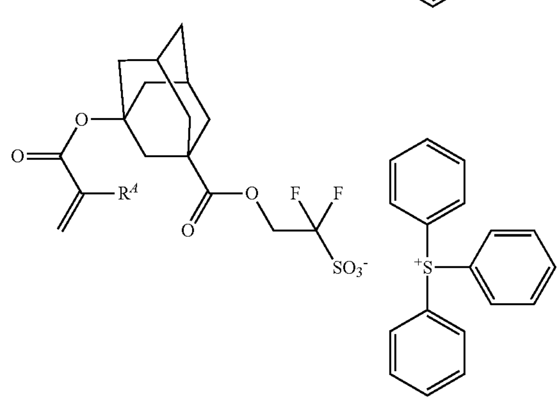

-continued
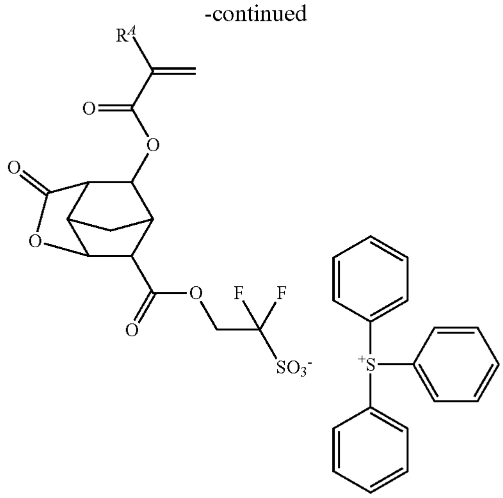
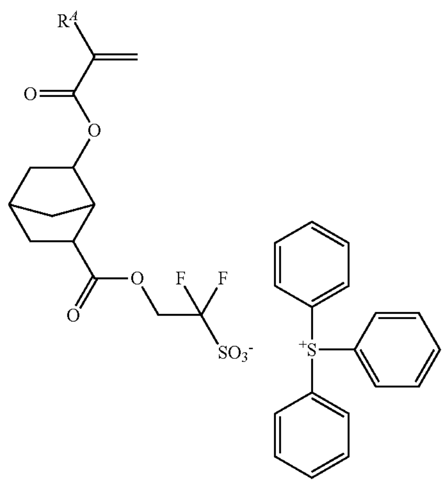
Examples of the monomer from which recurring unit (f3) is derived are shown below, but not limited thereto. $R^A$ is as defined above.
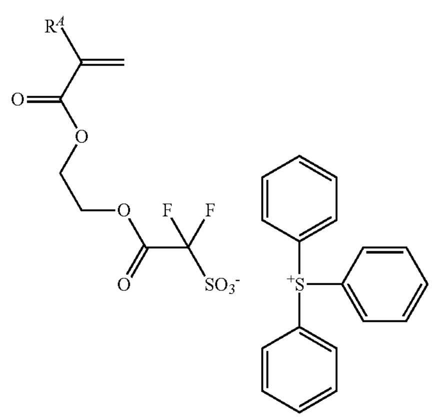
-continued
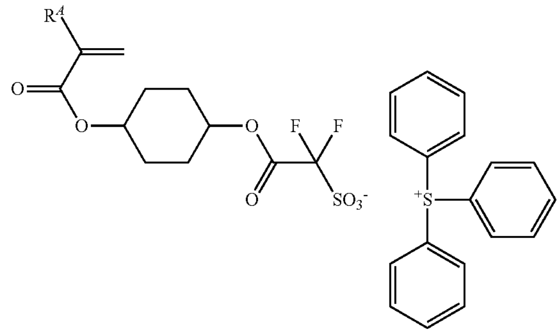
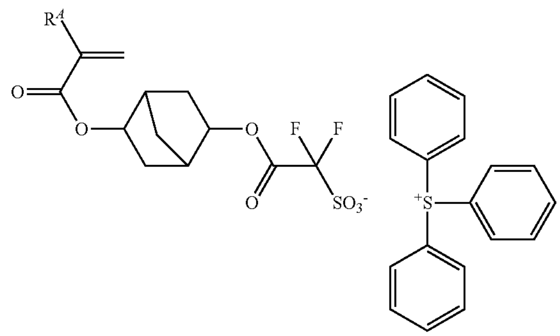
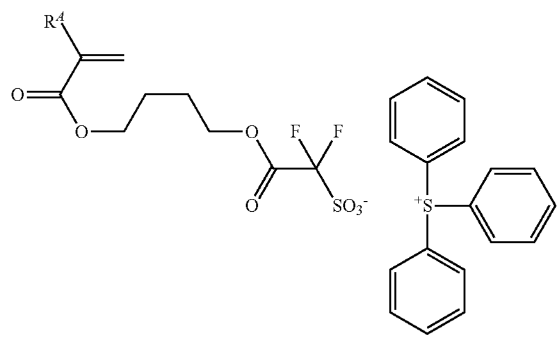
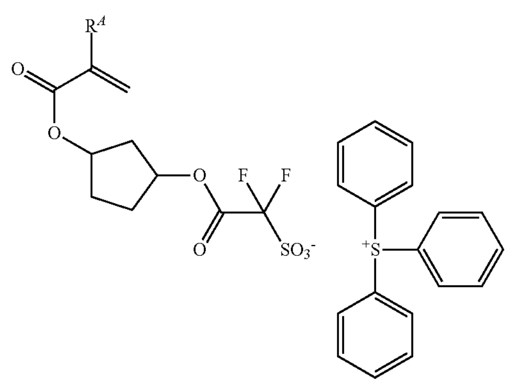
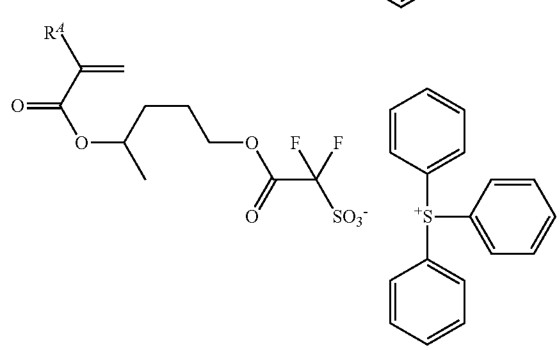

-continued
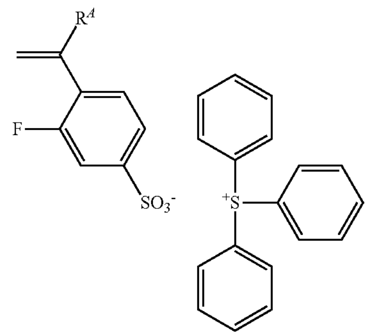
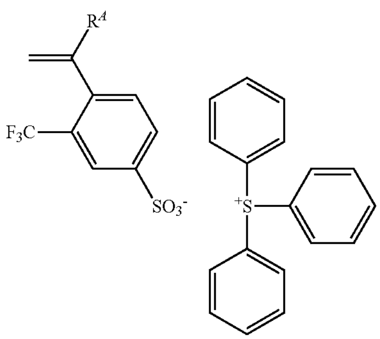
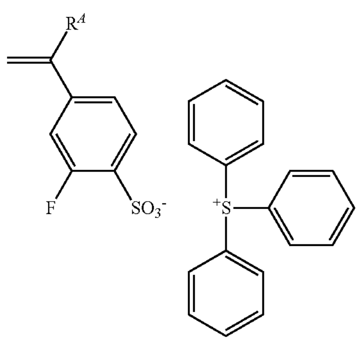
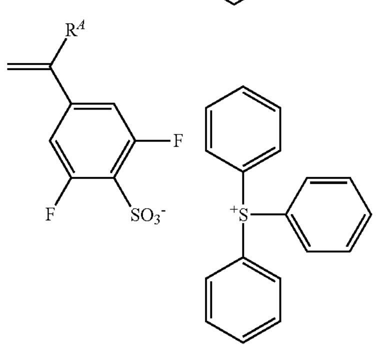
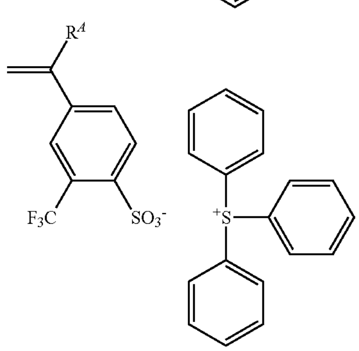
-continued
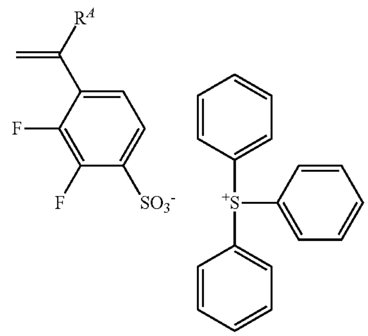
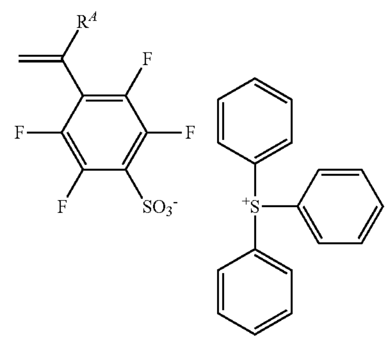
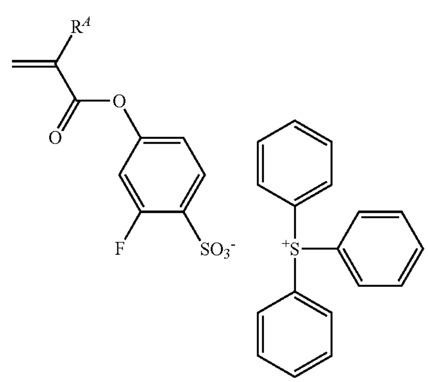
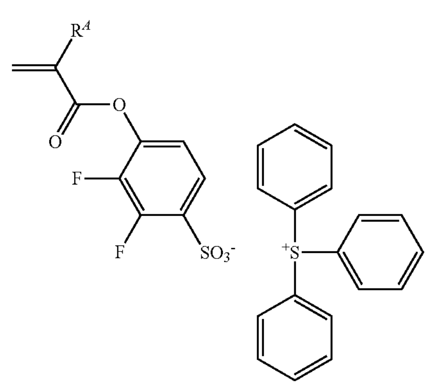

-continued

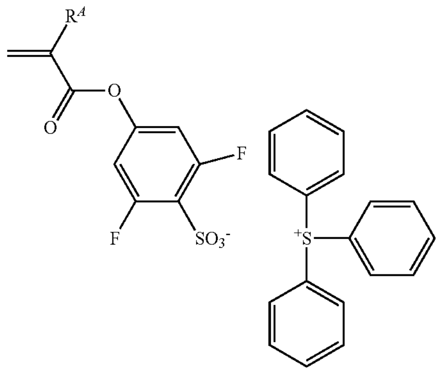

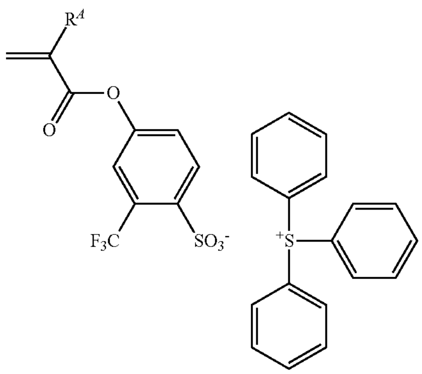

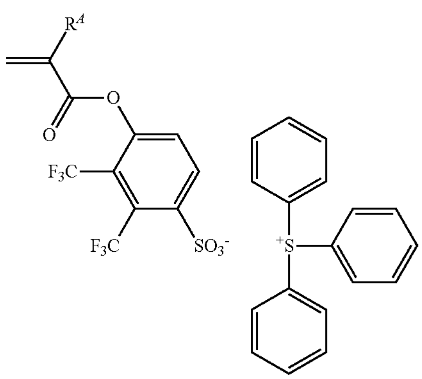

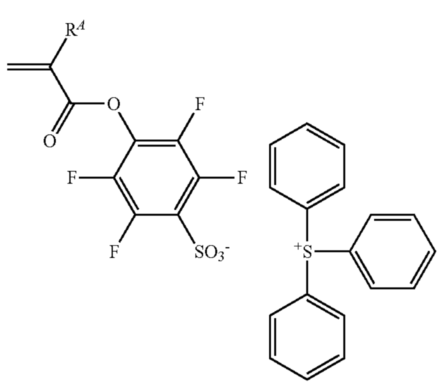

-continued

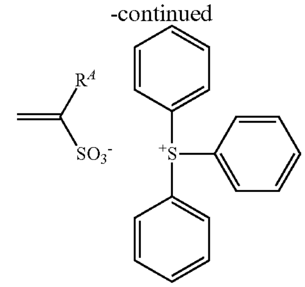

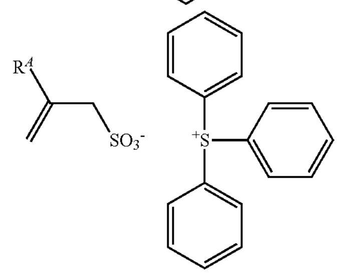

The attachment of an acid generator to the polymer main chain is effective in restraining acid diffusion, thereby preventing a reduction of resolution due to blur by acid diffusion. Also edge roughness is improved since the acid generator is uniformly distributed. Where a base polymer containing recurring units (f) is used, the addition of a separate PAG (to be described later) may be omitted.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0\le a1<1.0$, $0\le a2\le 1.0$, $0<a1+a2<1.0$, $0\le b\le 0.9$, $0\le c\le 0.9$, $0\le d\le 0.8$, $0\le e\le 0.8$, and $0\le f\le 0.5$; more preferably $0\le a1\le 0.9$, $0\le a2\le 0.9$, $0.1\le a1+a2\le 0.9$, $0\le b\le 0.8$, $0\le c\le 0.8$, $0\approx d\le 0.7$, $0\le e\le 0.7$, and $0\le f\le 0.4$; and even more preferably $0\le a1\le 0.8$, $0\le a2\le 0.8$, $0.1\le a1+a2\le 0.8$, $0\le b\le 0.75$, $0\le c\le 0.75$, $0\le d\le 0.6$, $0\le e\le 0.6$, and $0\le f\le 0.3$. Notably, $f=f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (0. A fraction of these units is: preferably $0<b\le 1.0$, $0\le c\le 0.9$, $0\le d\le 0.8$, $0\le e\le 0.8$, and $0\le f\le 0.5$; more preferably $0.2\le b\le 1.0$, $0\le c\le 0.8$, $0\le d\le 0.7$, $0\le e\le 0.7$, and $0\le f\le 0.4$; and even more preferably $0.3\le b\le 1.0$, $0\le c\le 0.75$, $0\le d\le 0.6$, $0\le e\le 0.6$, and $0\le f\le 0.3$. Notably, $f=f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, more preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

The base polymer may be a blend of two or more polymers (defined herein) which differ in compositional ratio, Mw or Mw/Mn. Also the base polymer may or may not contain a polymer different from the polymer defined herein, although it is preferred that the base polymer be free of a different polymer.

Acid Generator

The resist composition may include an acid generator (also referred to as acid generator of addition type) in order for the composition to function as a chemically amplified positive or negative resist composition. As a result of adding an acid generator, the resist composition becomes quite useful because its sensitivity becomes higher and other properties become better. It is noted that no acid generator of addition type need be added when the base polymer contains recurring units (f), that is, an acid generator has been bound in the base polymer.

The acid generator of addition type is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazome thane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, those having the formula (1) are preferred.

(1)

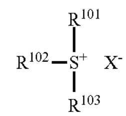

In formula (1), $R^{101}$, $R^{102}$ and $R^{103}$ are each independently a $C_1$-$C_{20}$ monovalent hydrocarbon group which may contain a heteroatom. Any two of $R^{101}$, $R^{102}$ and $R^{103}$ may bond together to form a ring with the sulfur atom to which they are attached. The monovalent hydrocarbon group may be straight, branched or cyclic, and examples thereof are as described above in conjunction with $R^3$ to $R^5$ in formulae (A-1) and (A-2).

Examples of the cation of the sulfonium salt having formula (1) are as exemplified above for the cation of the sulfonium salt having formulae (A-1) or (A-2).

In formula (1), $X^-$ is an anion of the following formula (1A), (1B), (1C) or (1D).

(1A)

$$R^{fa}-CF_2-SO_3^-$$

(1B)

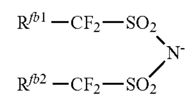

(1C)

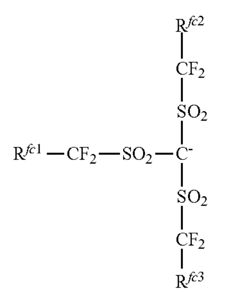

(1D)

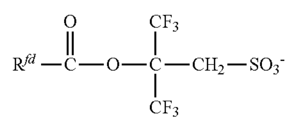

In formula (1A), $R^{fa}$ is fluorine or a $C_1$-$C_{40}$ monovalent hydrocarbon group which may contain a heteroatom. The monovalent hydrocarbon group may be straight, branched or cyclic, and examples thereof are as will be exemplified for $R^{105}$ later.

Of the anions of formula (1A), an anion having the formula (1A') is preferred.

(1A')

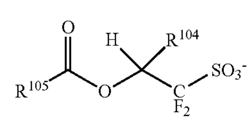

In formula (1A'), $R^{104}$ is hydrogen or trifluoromethyl, preferably trifluoromethyl. $R^{105}$ is a $C_1$-$C_{38}$ monovalent hydrocarbon group which may contain a heteroatom. Suitable heteroatoms include oxygen, nitrogen, sulfur and halogen, with oxygen being preferred. Those monovalent hydrocarbon groups of 6 to 30 carbon atoms are preferred because a high resolution is available in fine pattern formation. The monovalent hydrocarbon groups may be straight, branched or cyclic. Suitable monovalent hydrocarbon groups include straight or branched alkyl groups such as methyl, ethyl, propyl, isopropyl, butyl, isobutyl, s-butyl, t-butyl, pentyl, neopentyl, hexyl, heptyl, 2-ethylhexyl, nonyl, undecyl, tridecyl, pentadecyl, heptadecyl, and icosanyl; monovalent saturated cycloaliphatic hydrocarbon groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; monovalent unsaturated aliphatic hydrocarbon groups such as allyl and 3-cyclohexenyl; and aralkyl groups such as benzyl and diphenylmethyl. Suitable heteroatom-containing monovalent hydrocarbon groups include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. Also included are the foregoing groups in which at least one hydrogen is substituted by a moiety containing a heteroatom such as oxygen, sulfur, nitrogen or halogen, or in which at least one carbon is substituted by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic acid anhydride or haloalkyl moiety.

With respect to the synthesis of the sulfonium salt having an anion of formula (1A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

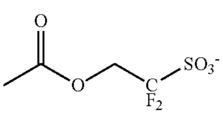

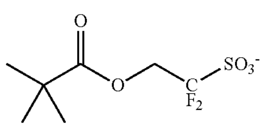

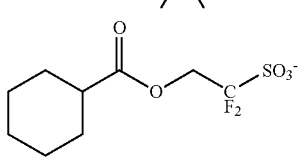

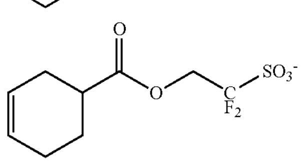

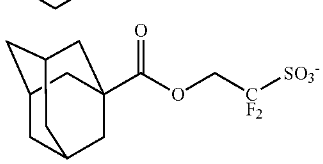

-continued

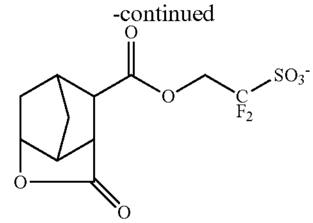

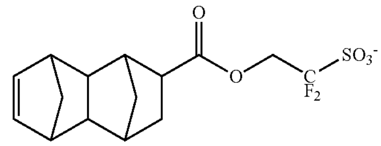

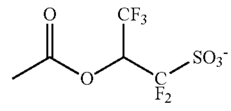

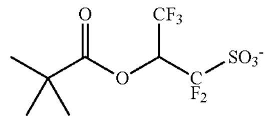

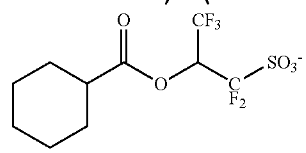

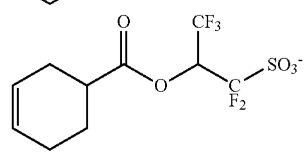

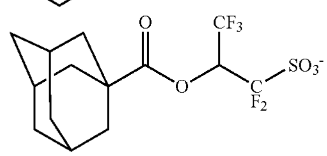

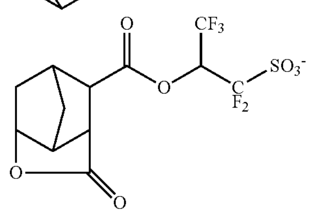

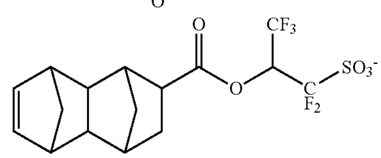

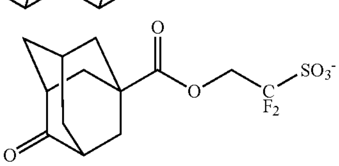

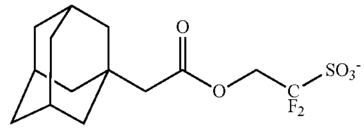

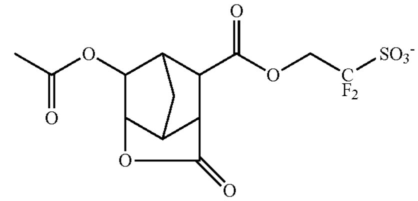

-continued

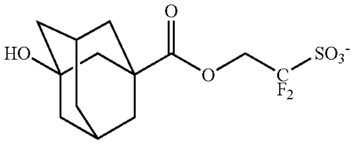

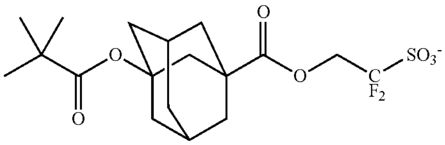

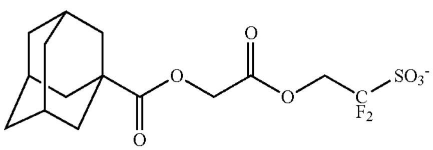

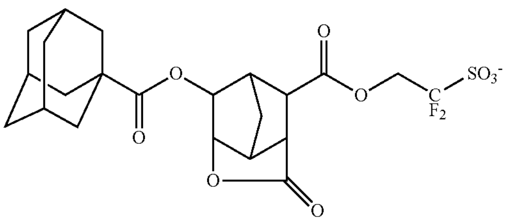

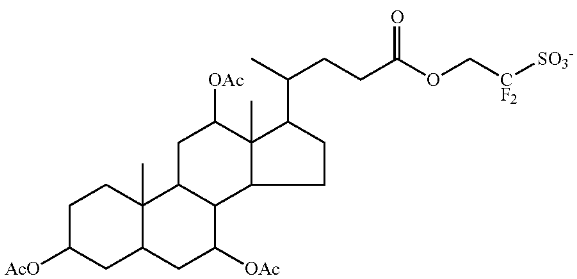

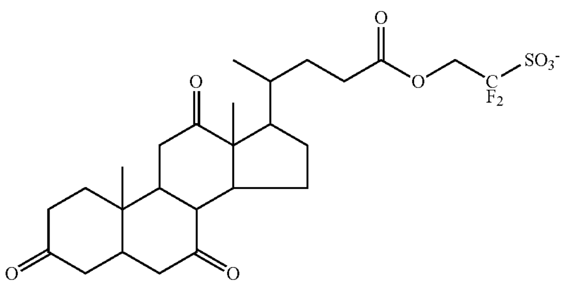

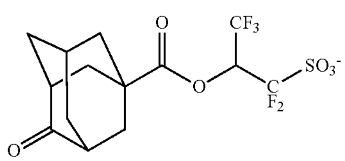

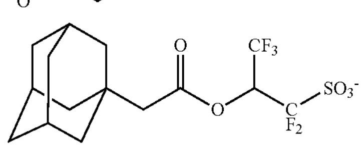

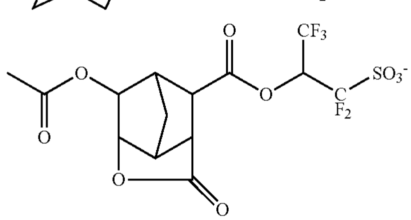

-continued

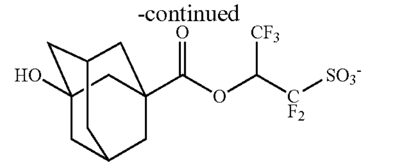

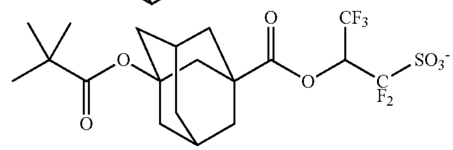

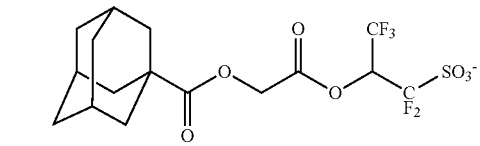

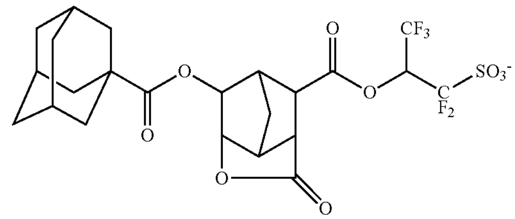

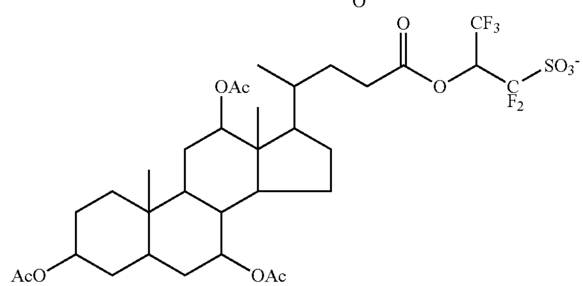

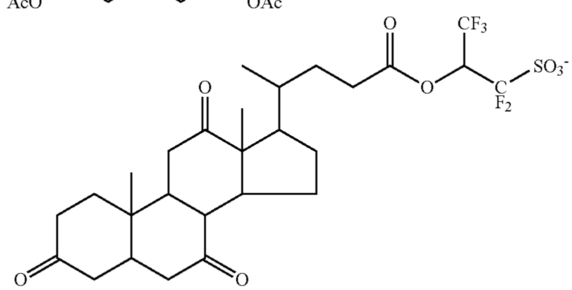

In formula (1B), $R^{fb1}$ and $R^{fb2}$ are each independently fluorine or a $C_1$-$C_{40}$ monovalent hydrocarbon group which may contain a heteroatom. The monovalent hydrocarbon groups may be straight, branched or cyclic, and examples thereof are as exemplified above for $R^{105}$. Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage (—$CF_2$—$SO_2$—$N^-$—$SO_2$—$CF_2$—) to which they are attached, and preferably the pair is a fluorinated ethylene or fluorinated propylene group.

In formula (1C), $R^{fc1}$, $R^{fc2}$ and $R^{fc3}$ are each independently fluorine or a $C_1$-$C_{40}$ monovalent hydrocarbon group which may contain a heteroatom. The monovalent hydrocarbon groups may be straight, branched or cyclic, and examples thereof are as exemplified above for $R^{105}$. Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage (—$CF_2$—

$SO_2$—$C^-$—$SO_2$—$CF_2$—) to which they are attached, and preferably the pair is a fluorinated ethylene or fluorinated propylene group.

In formula (1D), $R^{fd}$ is a $C_1$-$C_{40}$ monovalent hydrocarbon group which may contain a heteroatom. The monovalent hydrocarbon groups may be straight, branched or cyclic, and examples thereof are as exemplified above for $R^{105}$.

With respect to the synthesis of the sulfonium salt having an anion of formula (1D), reference is made to JP-A 2010-215608 and JP-A 2014-133723.

Examples of the sulfonium salt containing the anion of formula (1D) are shown below, but not limited thereto.

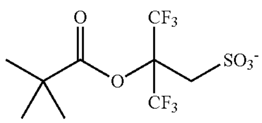

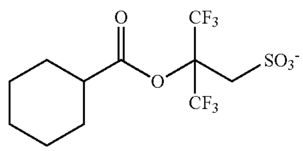

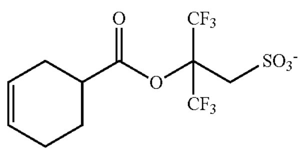

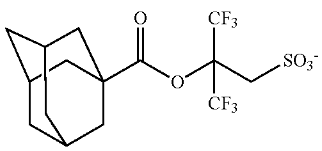

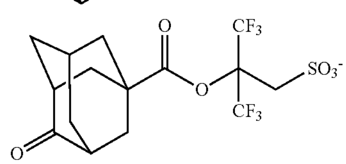

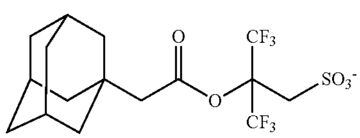

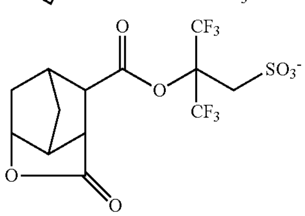

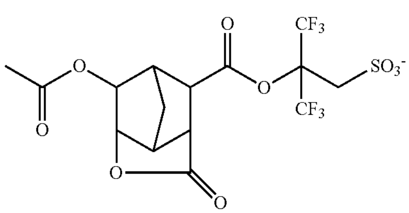

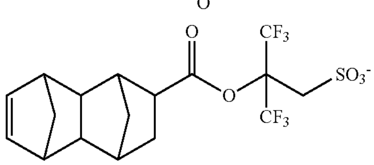

-continued

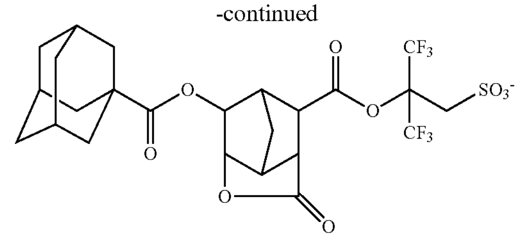

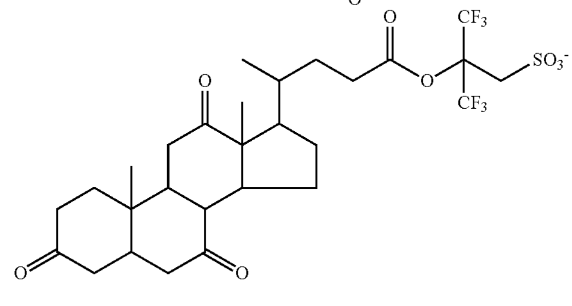

The compound having the anion of formula (1D) has a sufficient acid strength to cleave acid labile groups in the base polymer because it is free of fluorine at α-position of sulfo group, but has two trifluoromethyl groups at β-position. Thus the compound is a useful PAG.

Further, compounds having the formula (2) are useful as the PAG.

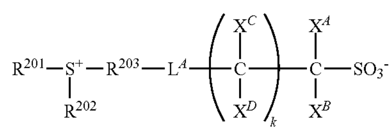

(2)

In formula (2), $R^{201}$ and $R^{202}$ are each independently a $C_1$-$C_{30}$ monovalent hydrocarbon group which may contain a heteroatom. $R^{203}$ is a $C_1$-$C_{30}$ divalent hydrocarbon group which may contain a heteroatom. Any two of $R^{201}$, $R^{202}$ and $R^{203}$ may bond together to form a ring with the sulfur atom to which they are attached. $L^A$ is a single bond or ether bond, or a $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

The monovalent hydrocarbon groups may be straight, branched or cyclic and include straight or branched alkyl groups such as methyl, ethyl, propyl, isopropyl, n-butyl, s-butyl, t-butyl, n-pentyl, t-pentyl, n-hexyl, n-octyl, n-nonyl, n-decyl, and 2-ethylhexyl; monovalent saturated cyclic hydrocarbon groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.$0^{2,6}$]decanyl, and adamantyl; and aryl groups such as phenyl, naphthyl and anthracenyl. Also included are the foregoing groups in which at least one hydrogen is substituted by a heteroatom such as oxygen, sulfur, nitrogen or halogen, or in which at least one carbon is substituted by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety.

The divalent hydrocarbon groups may be straight, branched or cyclic, and examples thereof include linear or branched alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; saturated cyclic divalent hydrocarbon groups such as cyclopentanediyl, cyclohexanediyl, norbomanediyl, and adamantanediyl; and unsaturated cyclic divalent hydrocarbon groups such as phenylene and naphthylene. Also included are the foregoing groups in which at least one hydrogen atom is substituted by an alkyl group such as methyl, ethyl, propyl, n-butyl or t-butyl, or in which at least one hydrogen atom is substituted by a moiety containing a heteroatom such as oxygen, sulfur, nitrogen or halogen, or in which at least one carbon atom is substituted by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic acid anhydride or haloalkyl moiety. Suitable heteroatoms include oxygen, nitrogen, sulfur and halogen, with oxygen being preferred.

Of the PAGs having formula (2), those having formula (2') are preferred.

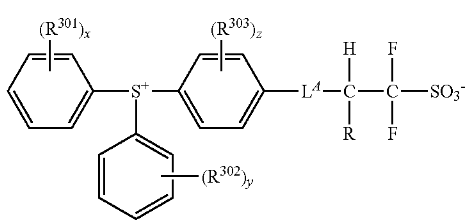

(2')

In formula (2'), $L^A$ is as defined above. R is hydrogen or trifluoromethyl, preferably trifluoromethyl. $R^{301}$, $R^{302}$ and $R^{303}$ are each independently hydrogen or a $C_1$-$C_{20}$ monovalent hydrocarbon group which may contain a heteroatom. The monovalent hydrocarbon groups may be straight, branched or cyclic, and examples thereof are as exemplified above for $R^{105}$. The subscripts x and y each are an integer of 0 to 5, and z is an integer of 0 to 4.

Examples of the PAG having formula (2) are shown below, but not limited thereto. Herein R is as defined above.

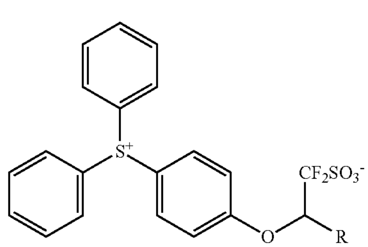

-continued

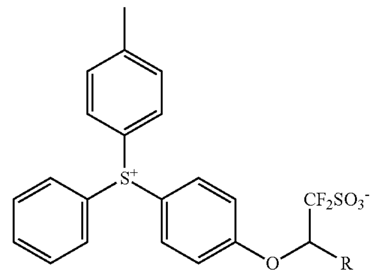

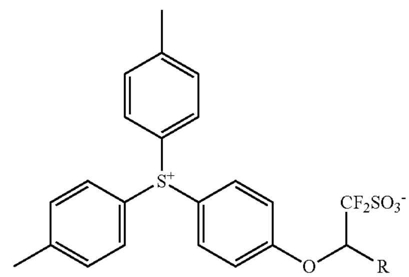

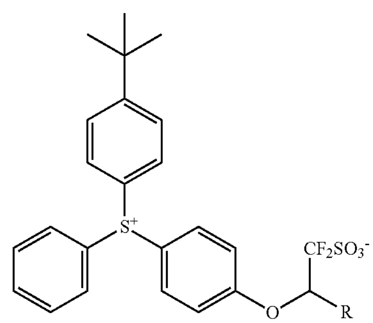

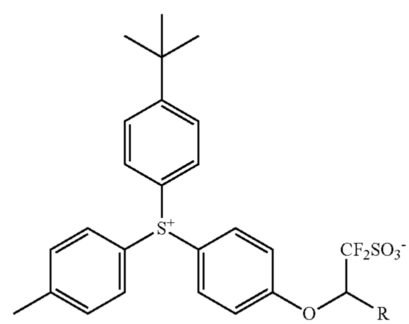

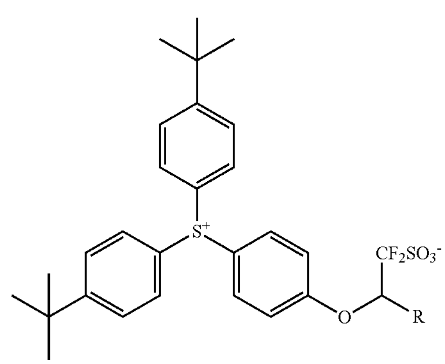

-continued
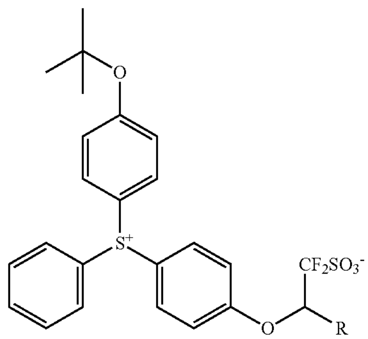
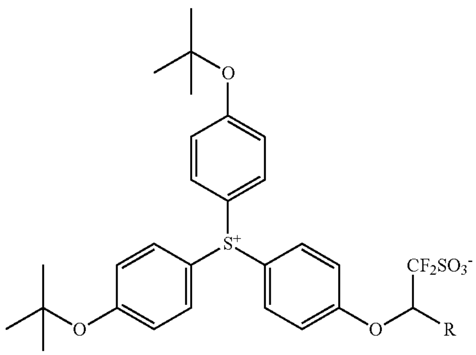
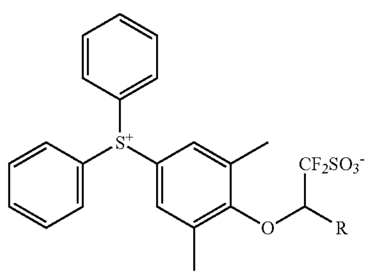
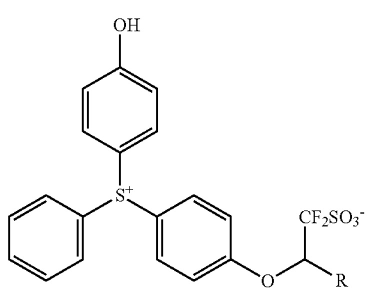
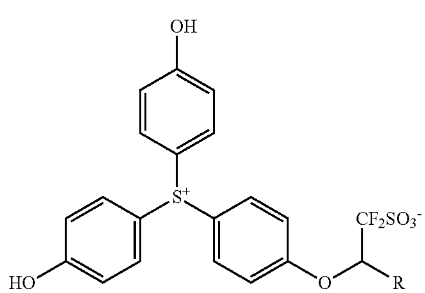
-continued
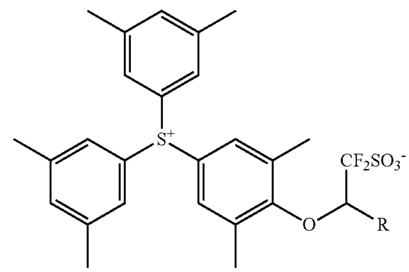
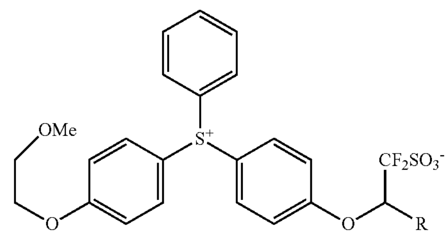
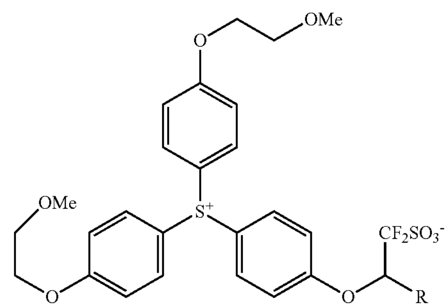
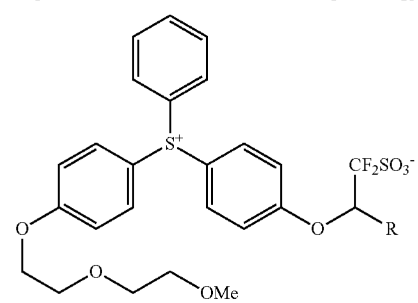
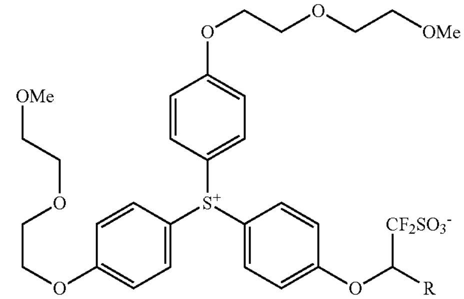
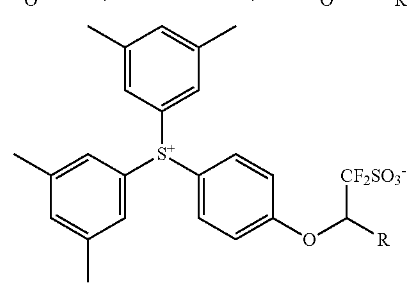

-continued
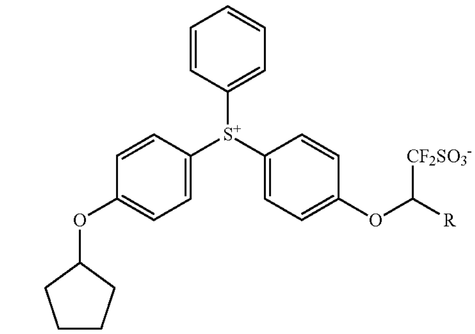
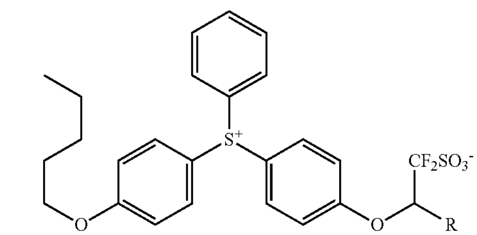
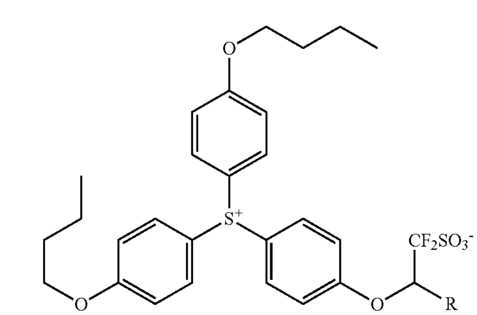
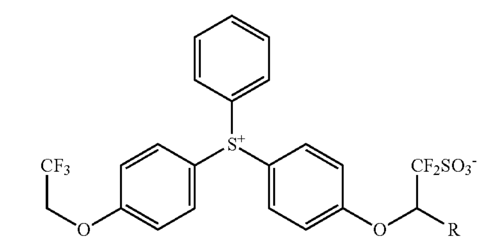
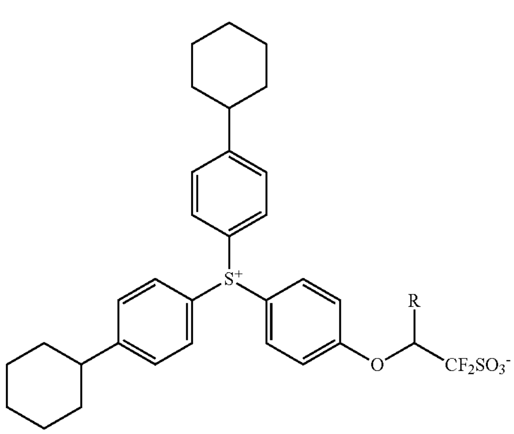
-continued
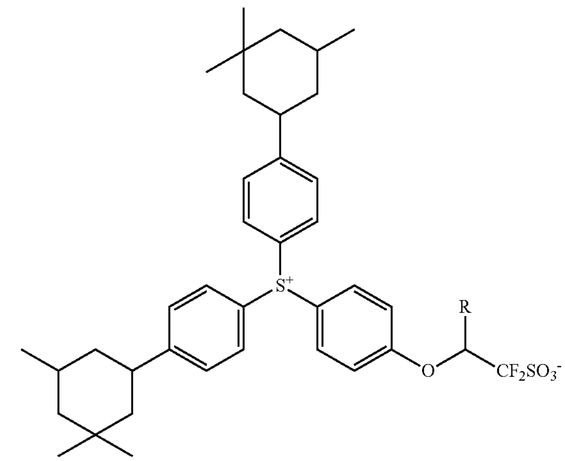
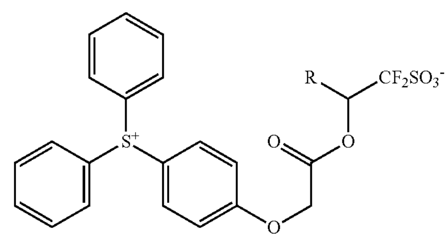
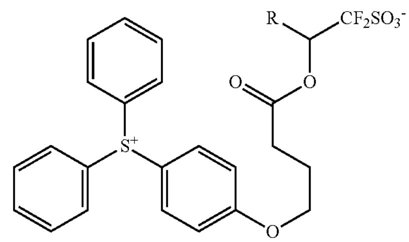
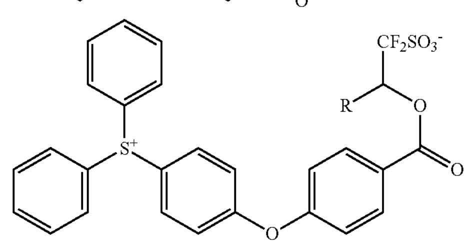
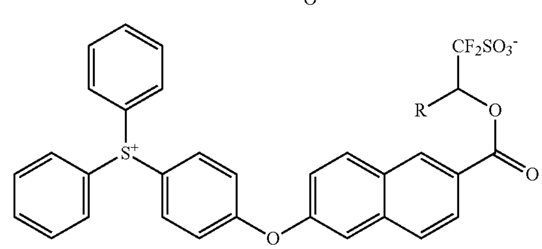
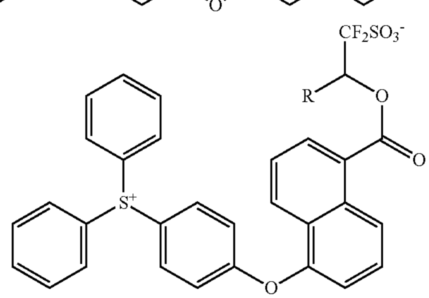

-continued

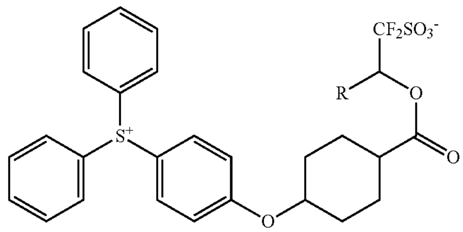

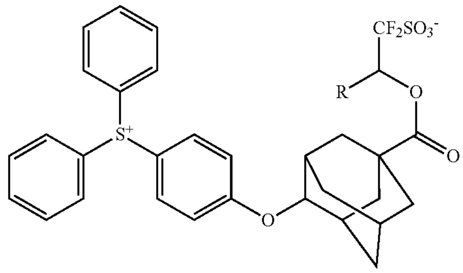

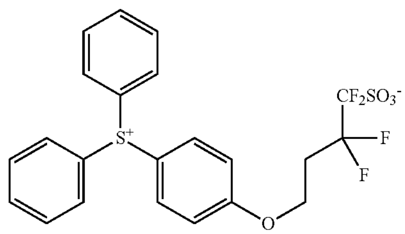

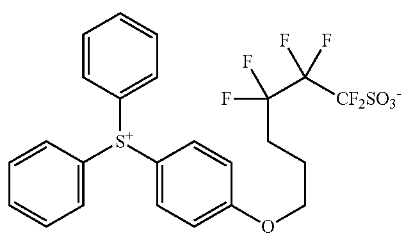

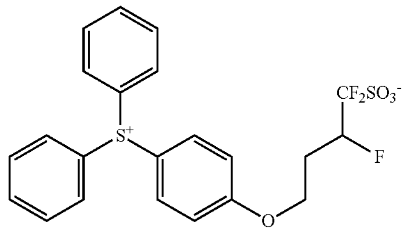

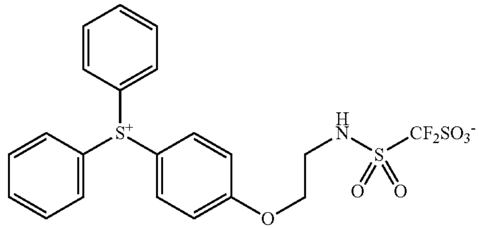

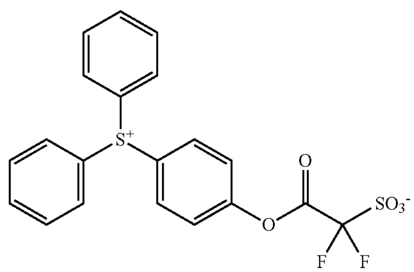

-continued

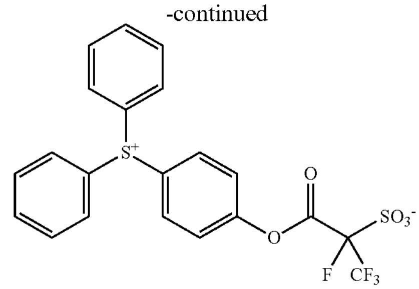

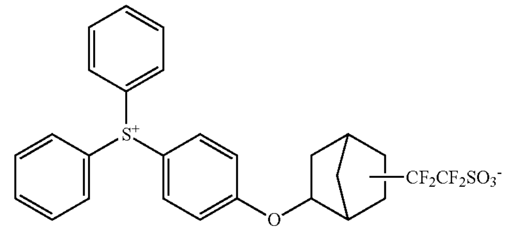

Of the foregoing PAGs, those compounds having an anion of formula (1A') or (1D) are especially preferred because of reduced acid diffusion and high solubility in resist solvent, and those compounds having an anion of formula (2') are especially preferred because of minimized acid diffusion.

Sulfonium and iodonium salts of iodized anions are also useful as the PAG. Preferred are sulfonium and iodonium salts of iodized benzoyloxy-containing fluorinated sulfonic acid having the formulae (3-1) and (3-2).

(3-1)

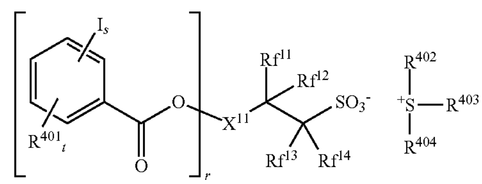

(3-2)

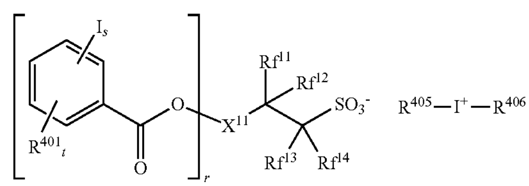

In formulae (3-1) and (3-2), $R^{401}$ is hydrogen, hydroxyl, carboxyl, nitro, cyano, fluorine, chlorine, bromine, amino group, or a $C_1$-$C_{20}$ alkyl, $C_1$-$C_{20}$ alkoxy, $C_2$-$C_{20}$ alkoxycarbonyl, $C_2$-$C_{20}$ acyloxy or $C_1$-$C_4$ alkylsulfonyloxy group, which may contain fluorine, chlorine, bromine, hydroxy, amino or alkoxy moiety, or —$NR^{407}$—C(═O)—$R^{408}$ or —$NR^{407}$—C(═O)—O—$R^{408}$, wherein $R^{407}$ is hydrogen, or a $C_1$-$C_6$ alkyl group which may contain halogen, hydroxy, alkoxy, acyl or acyloxy moiety, R is a $C_1$-$C_6$ alkyl, $C_2$-$C_{16}$ alkenyl, or $C_6$-$C_{12}$ aryl group, which may contain halogen, hydroxy, alkoxy, acyl or acyloxy moiety.

$X^{11}$ is a single bond or a $C_1$-$C_{20}$ divalent linking group when r=1, or a $C_1$-$C_{20}$ tri- or tetravalent linking group when r=2 or 3, the linking group optionally containing an oxygen, sulfur or nitrogen atom. $Rf^{11}$ to $Rf^{14}$ are each independently hydrogen, fluorine or trifluoromethyl, at least one of $Rf^{11}$ to $Rf^{14}$ being fluorine or trifluoromethyl, or $Rf^{11}$ and $Rf^{12}$, taken together, may form a carbonyl group.

$R^{402}$, $R^{403}$, $R^{404}$, $R^{405}$ and $R^{406}$ are each independently a $C_1$-$C_{20}$ monovalent hydrocarbon group which may contain a heteroatom. Any two of $R^{402}$, $R^{403}$ and $R^{404}$ may bond together to form a ring with the sulfur atom to which they are attached. The monovalent hydrocarbon group may be straight, branched or cyclic, and examples thereof are as exemplified above for $R^3$ to $R^5$ in formulae (A-1) and (A-2). The subscript r is an integer of 1 to 3, s is an integer of 1 to 5, and t is an integer of 0 to 3.

The foregoing alkyl, alkoxy, alkoxycarbonyl, acyloxy, alkylsulfonyloxy, alkenyl and alkynyl groups may be straight, branched or cyclic.

Of the sulfonium and iodonium salts having iodized anions, sulfonium and iodonium salts of iodized benzene-containing fluorinated sulfonic acid having the formulae (3-3) and (3-4) are also preferred.

(3-3)

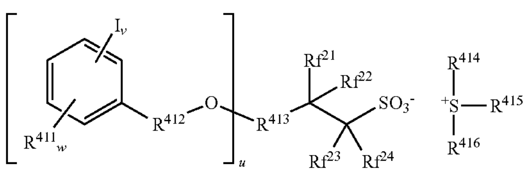

(3-4)

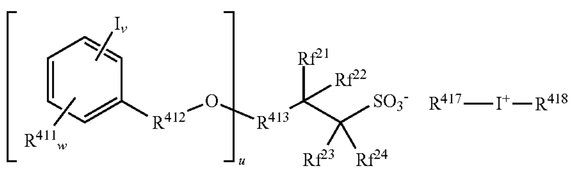

In formulae (3-3) and (3-4), $R^{411}$ is each independently a hydroxyl, $C_1$-$C_{20}$ alkyl or alkoxy group, $C_2$-$C_2$ acyl or acyloxy group, fluorine, chlorine, bromine, amino, or alkoxycarbonyl-substituted amino group. $R^{412}$ is each independently a single bond or $C_1$-$C_4$ alkylene group. $R^{413}$ is a single bond or $C_1$-$C_{20}$ divalent linking group when u=1, or a $C_1$-$C_{20}$ tri- or tetravalent linking group when u=2 or 3, the linking group optionally containing an oxygen, sulfur or nitrogen atom.

$Rf^{21}$ to $Rf^{24}$ are each independently hydrogen, fluorine or trifluoromethyl, at least one of $Rf^{21}$ to $Rf^{24}$ being fluorine or trifluoromethyl, or $Rf^{21}$ and $Rf^{22}$, taken together, may form a carbonyl group.

$R^{414}$, $R^{415}$, $R^{416}$, $R^{417}$ and $R^{418}$ are each independently a $C_1$-$C_{20}$ monovalent hydrocarbon group which may contain a heteroatom. Any two of $R^{414}$, $R^{415}$ and $R^{416}$ may bond together to form a ring with the sulfur atom to which they are attached. The monovalent hydrocarbon group may be straight, branched or cyclic, and examples thereof are as exemplified above for $R^3$ to $R^5$ in formulae (A-1) and (A-2). The subscript u is an integer of 1 to 3, v is an integer of 1 to 5, and w is an integer of 0 to 3.

The foregoing alkyl, alkoxy, acyl, acyloxy and alkenyl groups may be straight, branched or cyclic.

The cation in the sulfonium salt having formula (3-1) or (3-3) is as exemplified above for the cation in the sulfonium salt of formula (A-1) or (A-2). Examples of the cation in the iodonium salt having formula (3-2) or (3-4) are shown below, but not limited thereto.

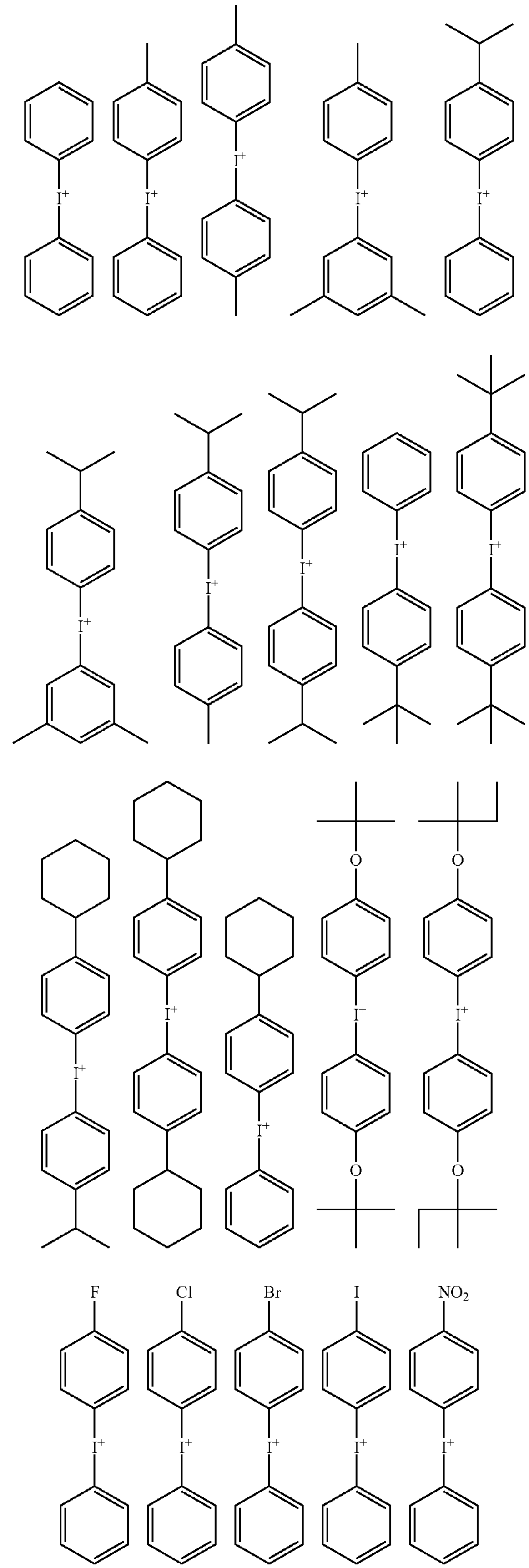

-continued
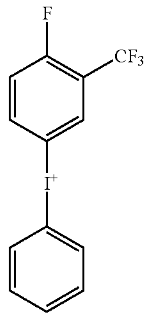
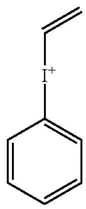
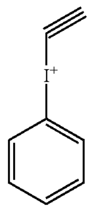
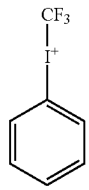
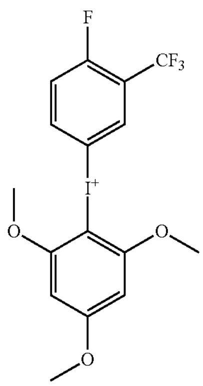
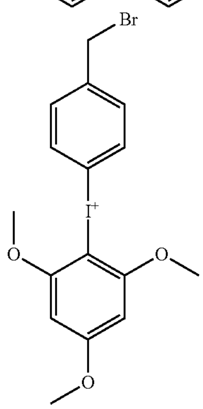
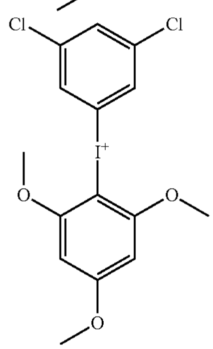
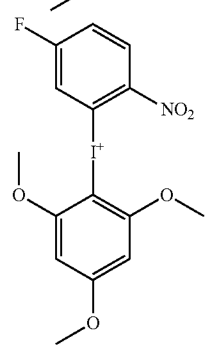
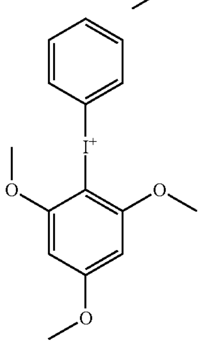
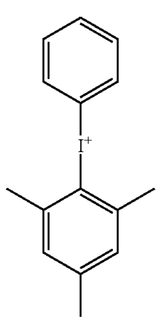
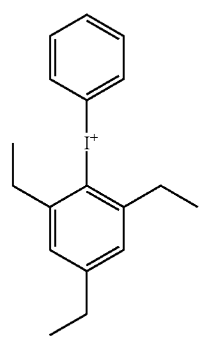
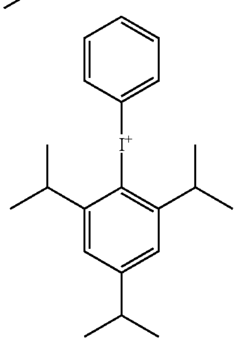
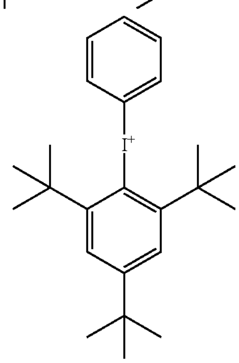
-continued
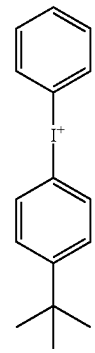 [SMILES: CC(C)(C)c1ccc([I+]c2ccccc2)cc1]
Examples of the anion moiety in the onium salts having formulae (3-1) to (3-4) are given below, but not limited thereto.
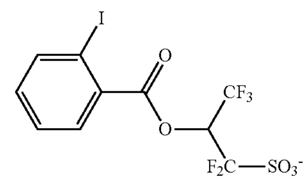
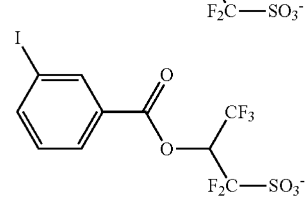
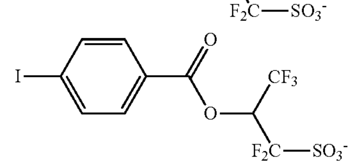
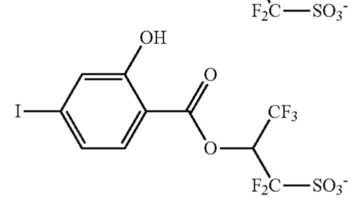
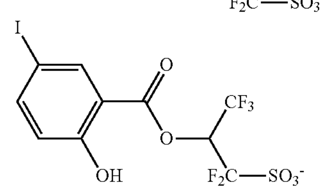
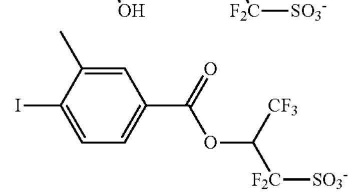
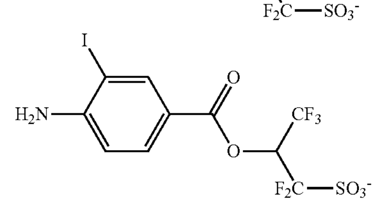

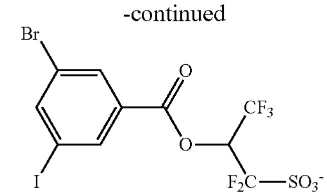
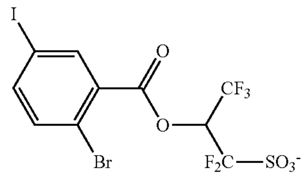
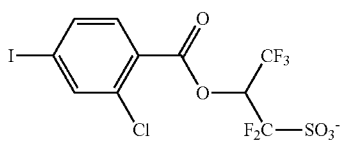
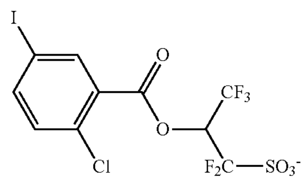
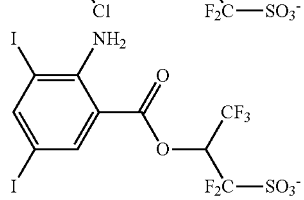
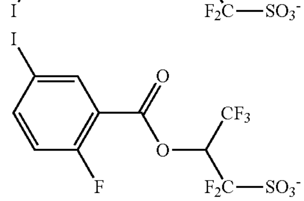
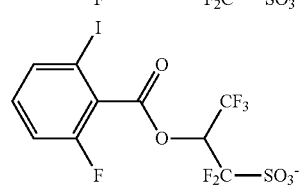
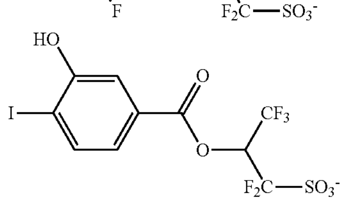
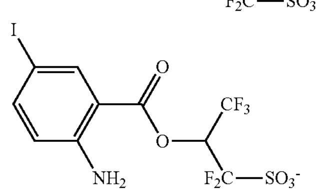
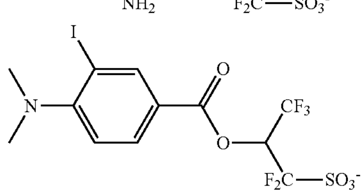
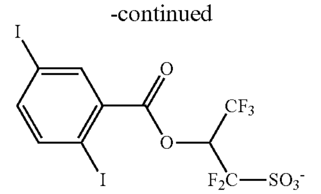
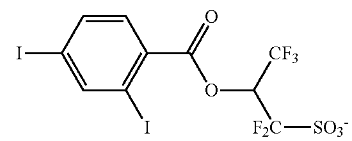
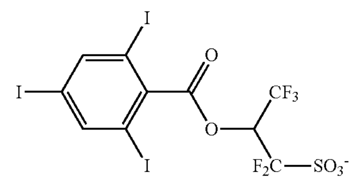
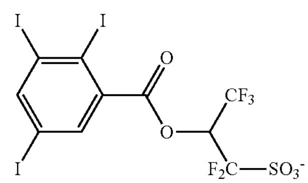
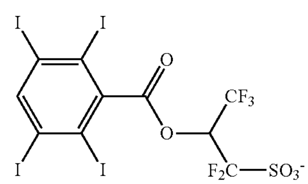
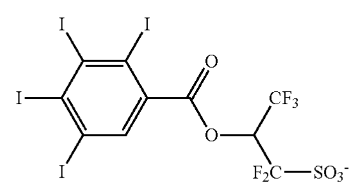
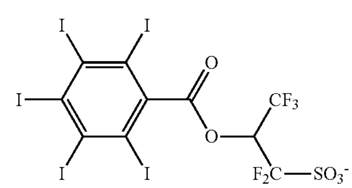
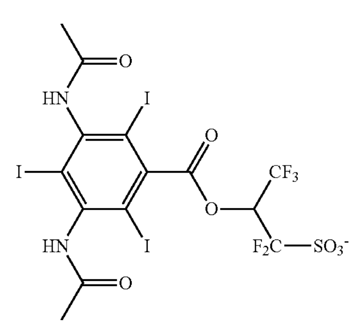

-continued
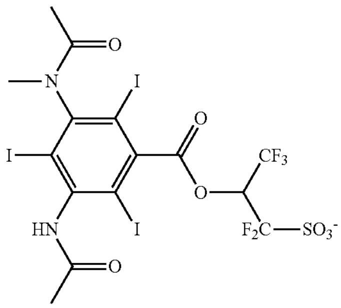
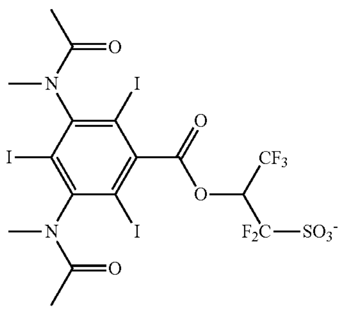
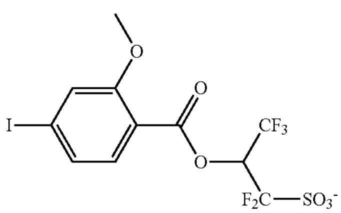
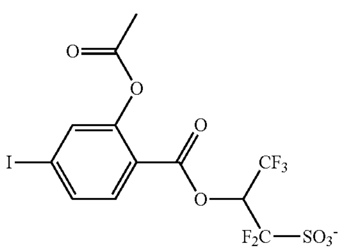
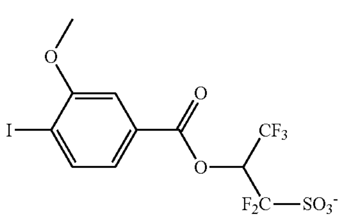
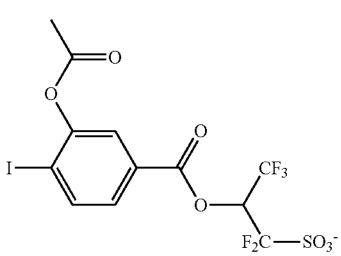
-continued
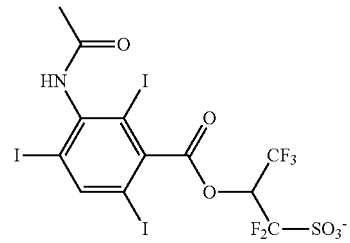
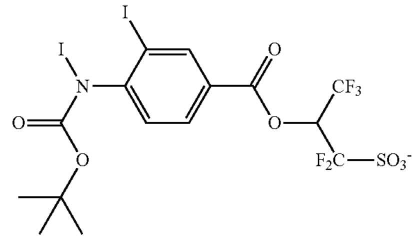
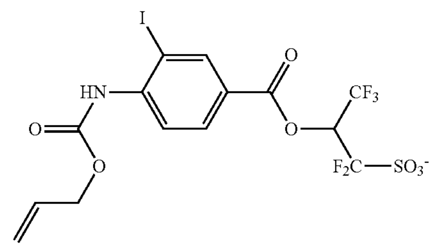
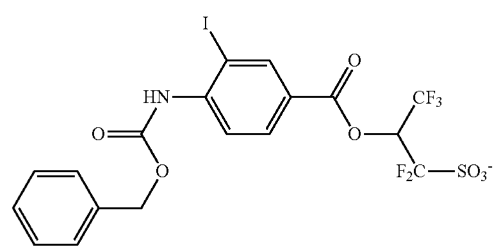
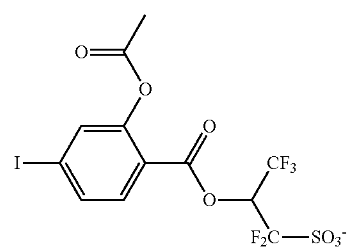
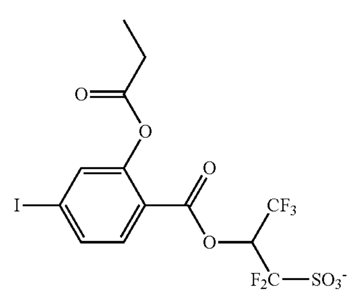

-continued
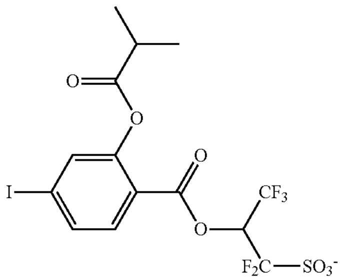
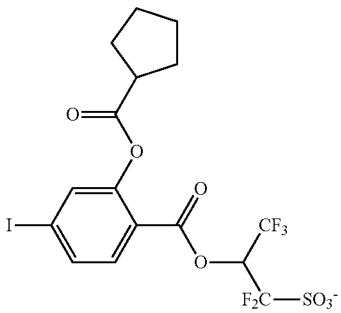
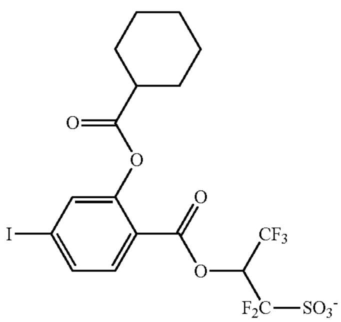
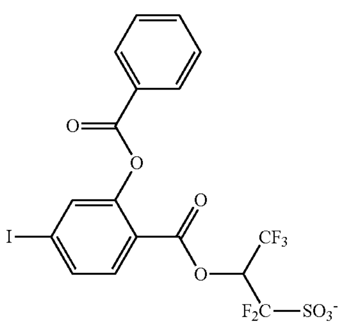
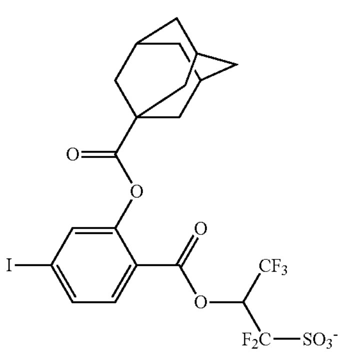
-continued
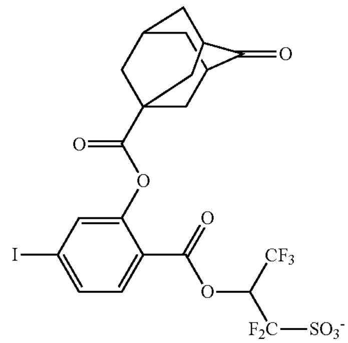
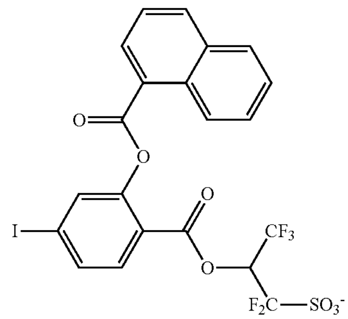
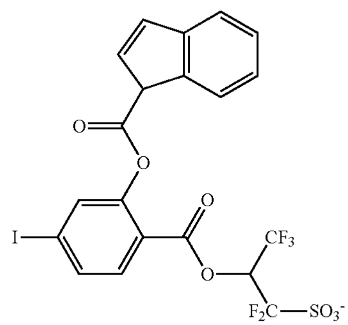
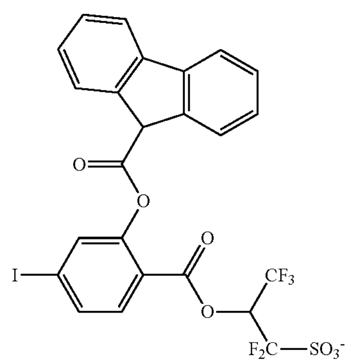
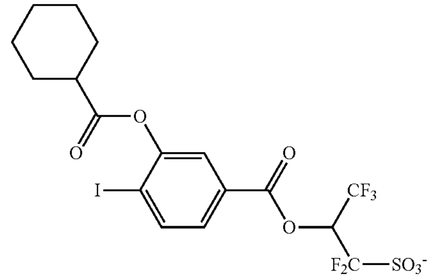

-continued
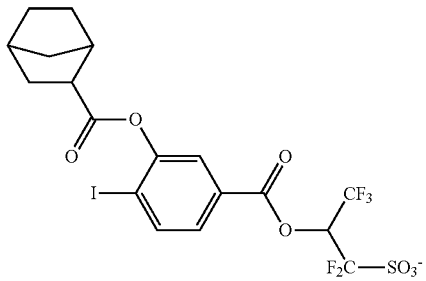
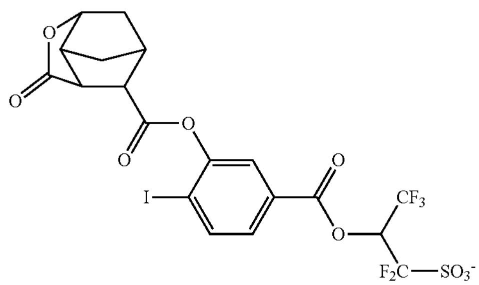
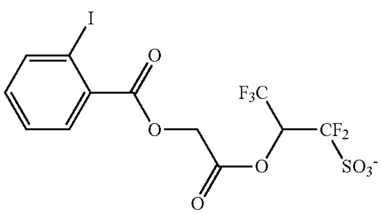
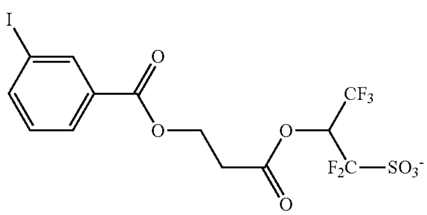
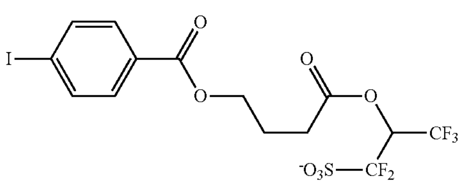
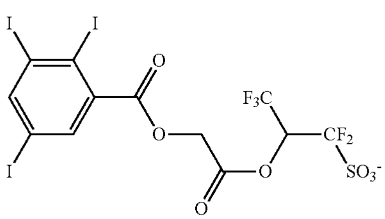
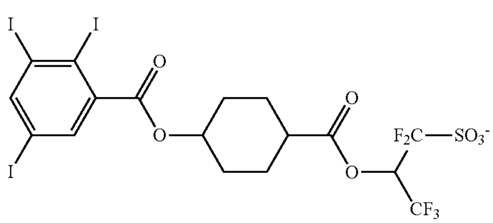
-continued
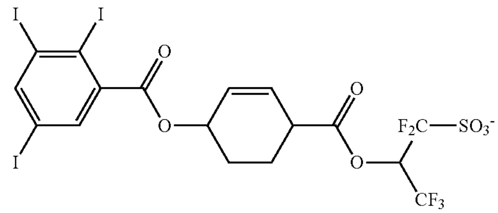
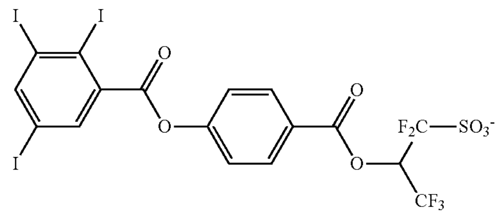
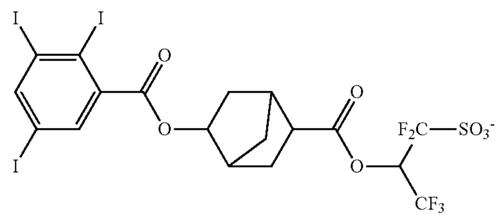
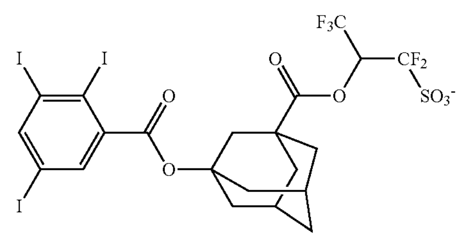
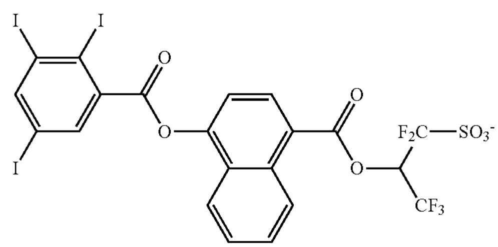
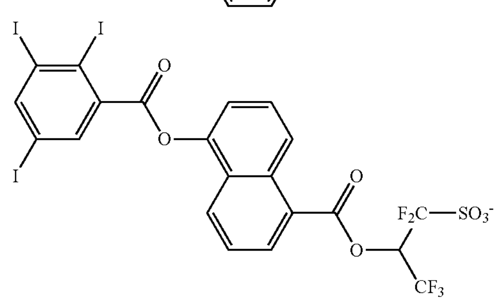
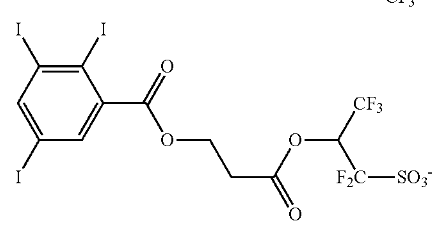

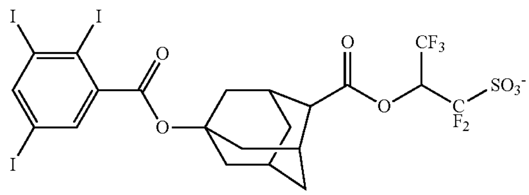
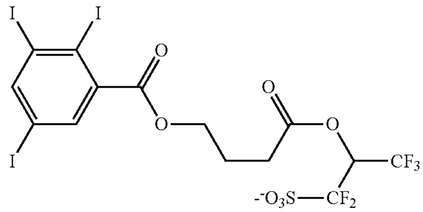
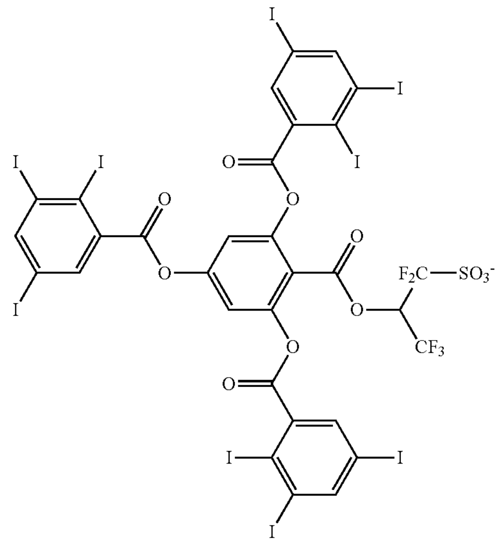
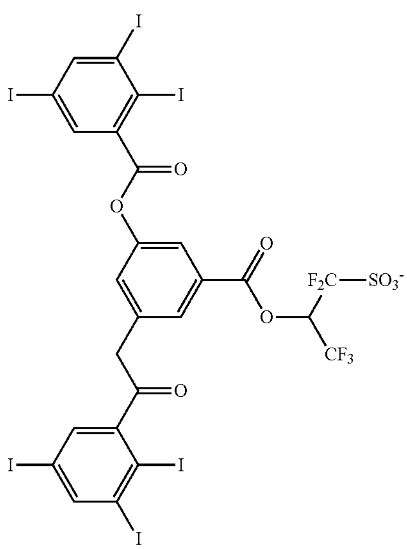
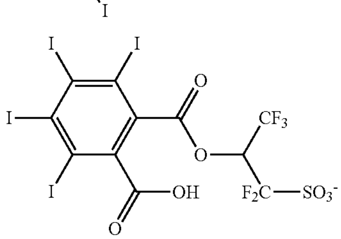
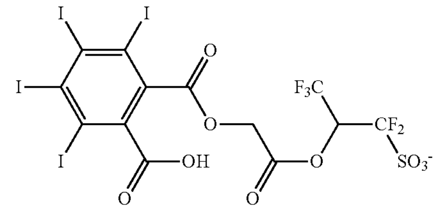
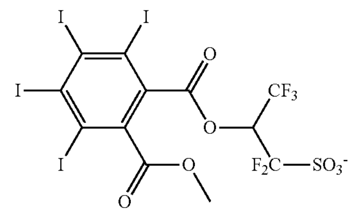
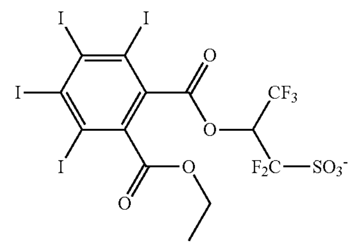
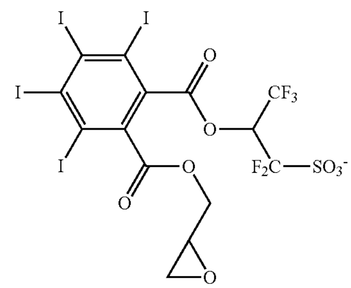
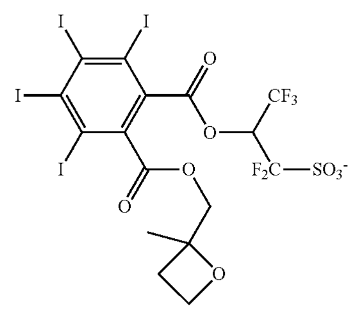
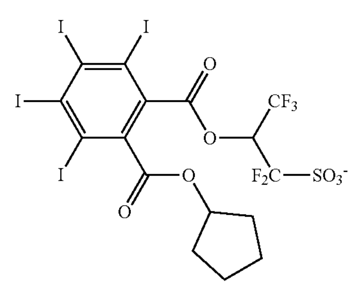

-continued
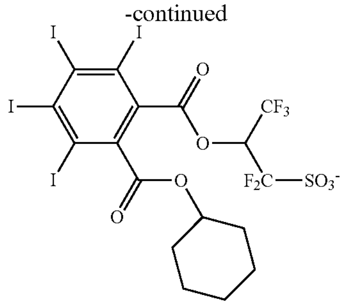
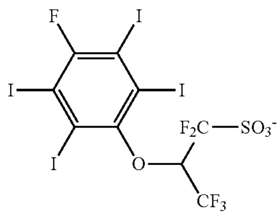
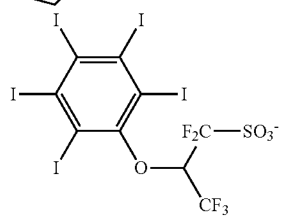
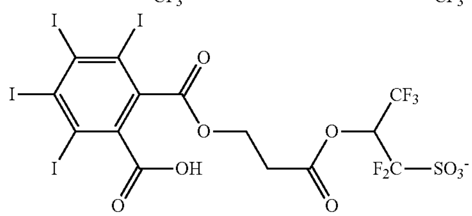
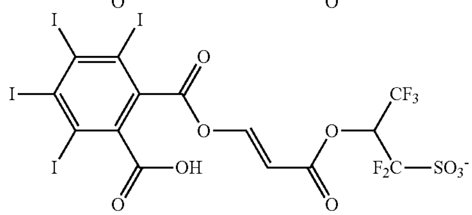
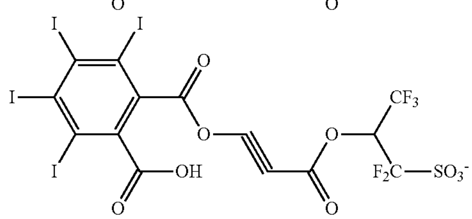
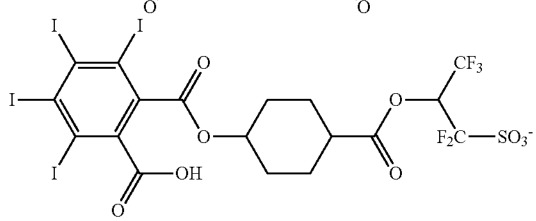
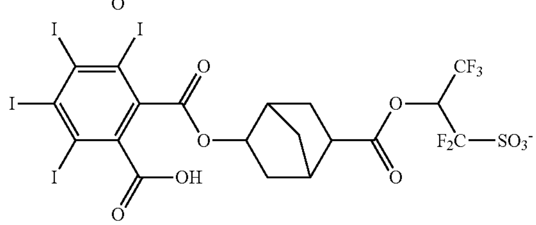
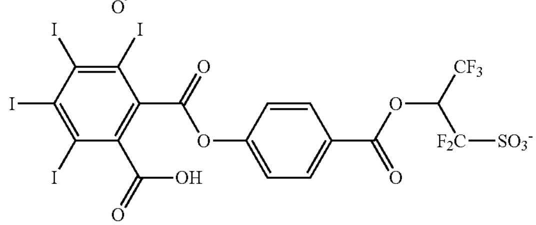
-continued
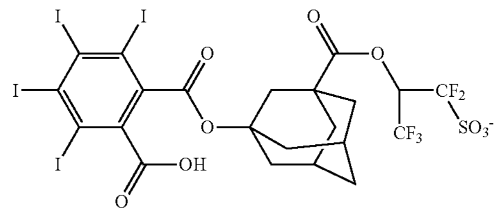
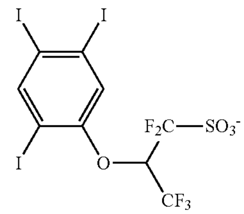
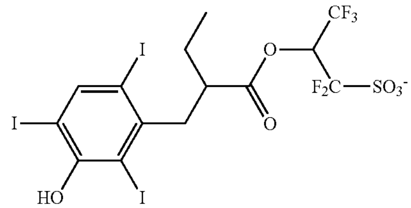
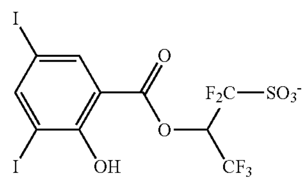
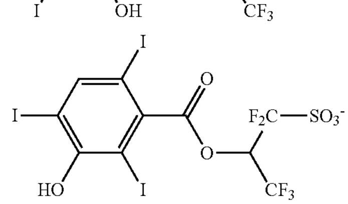
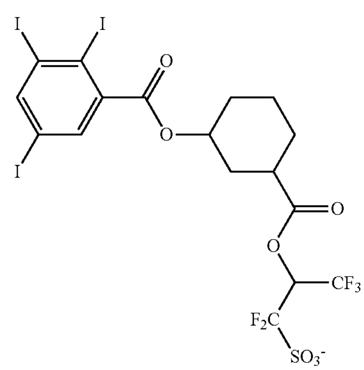
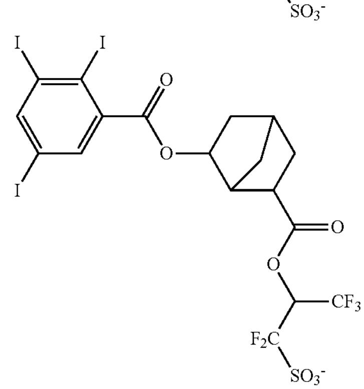

-continued
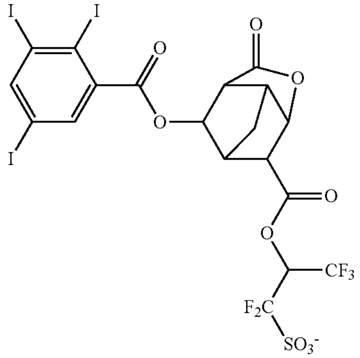
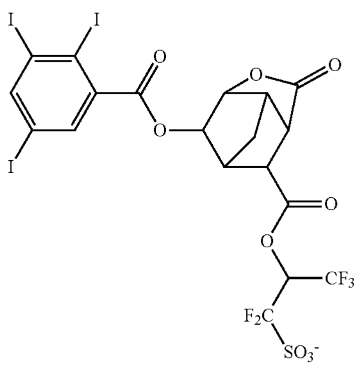
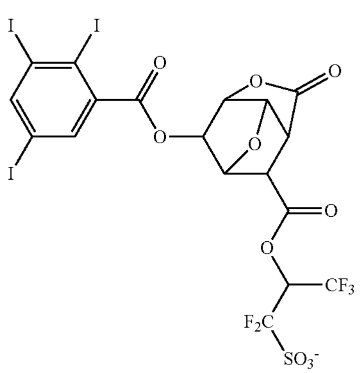
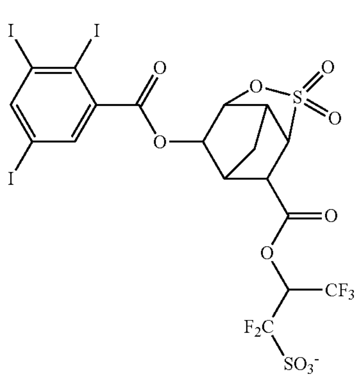
-continued
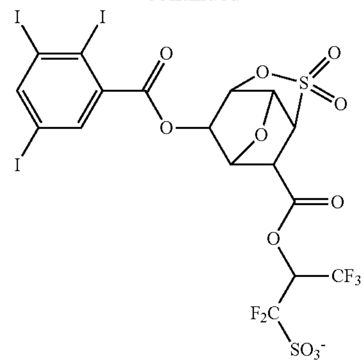
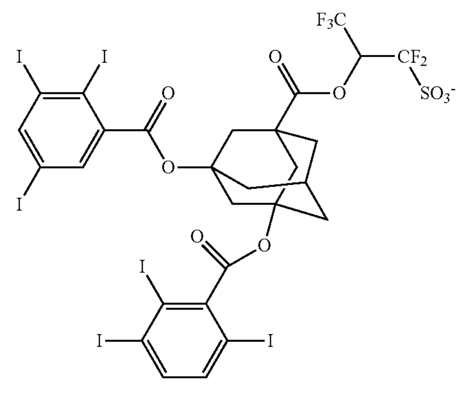
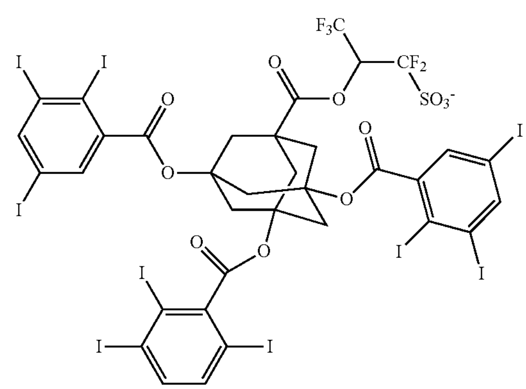
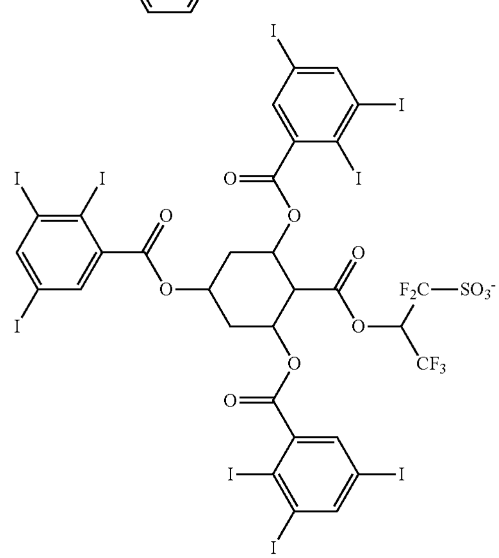

-continued
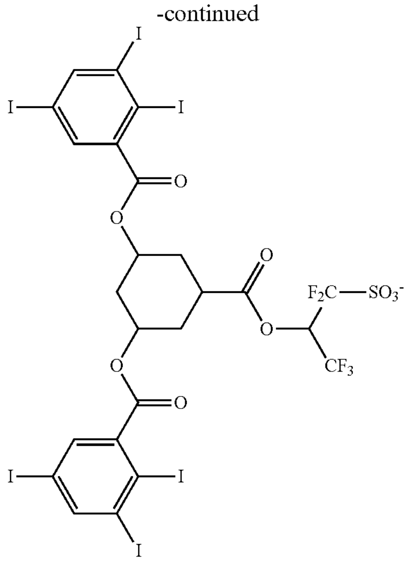
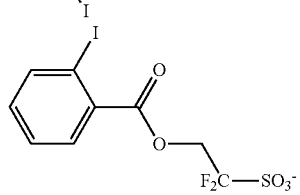
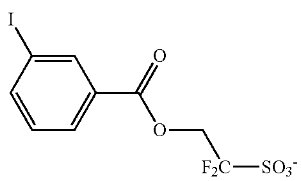
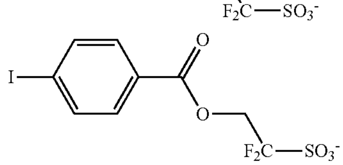
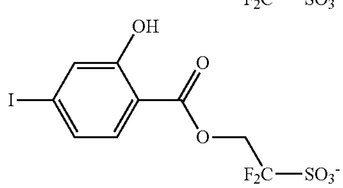
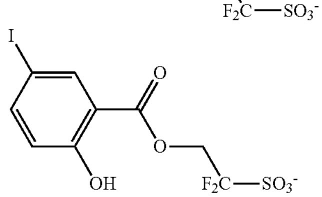
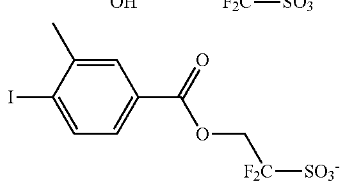
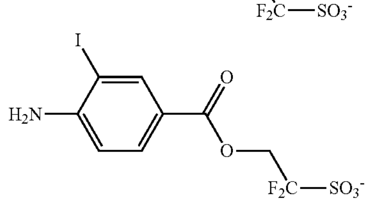
-continued
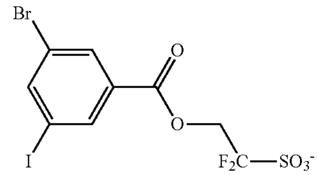
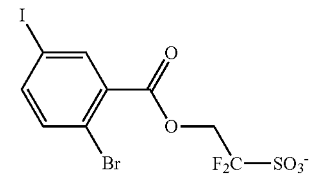
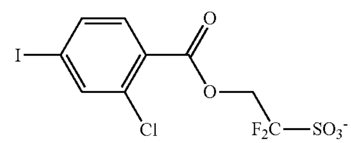
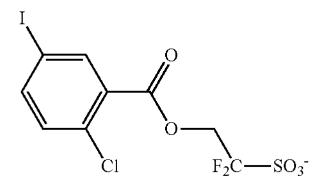
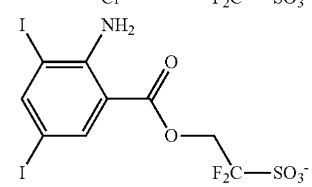
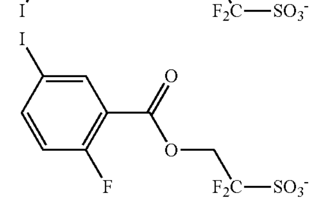
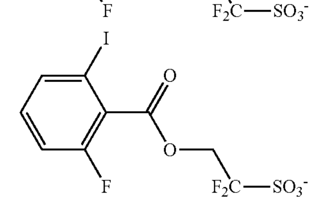
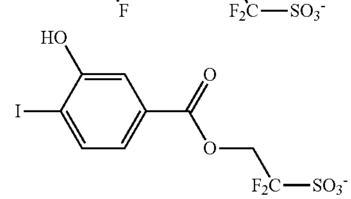
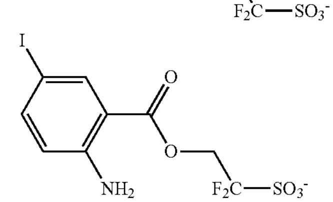
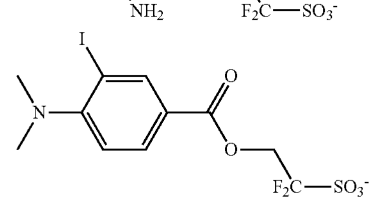

-continued
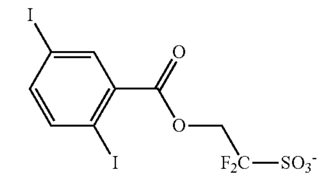
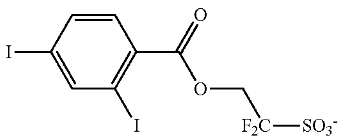
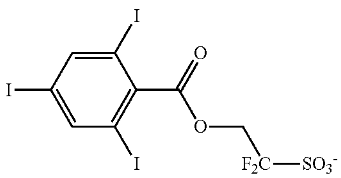
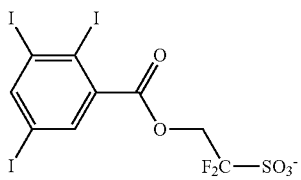
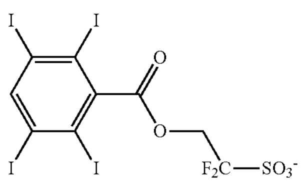
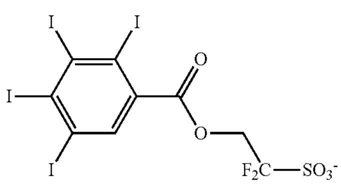
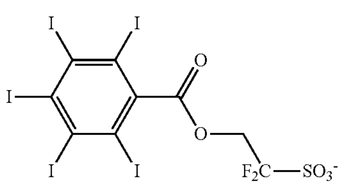
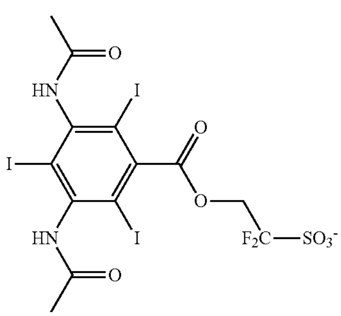
-continued
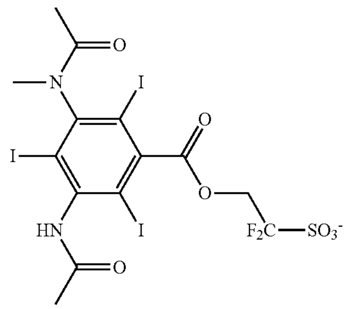
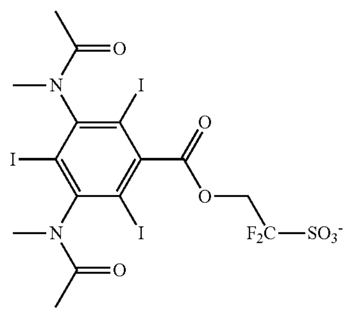
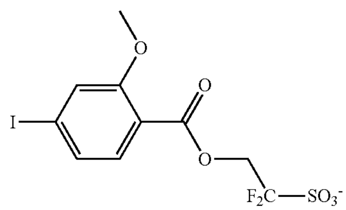
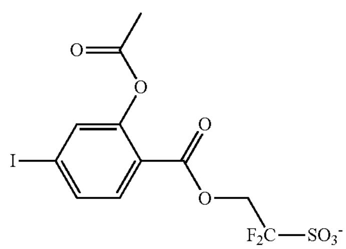
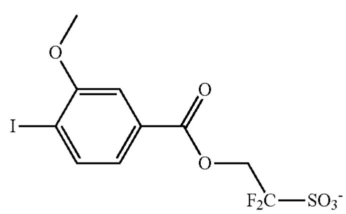
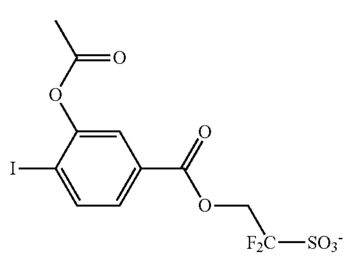

-continued
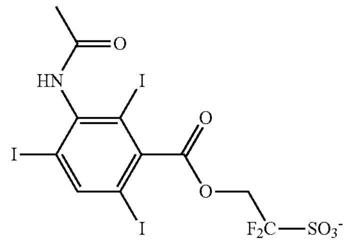
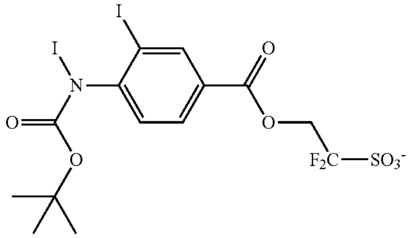
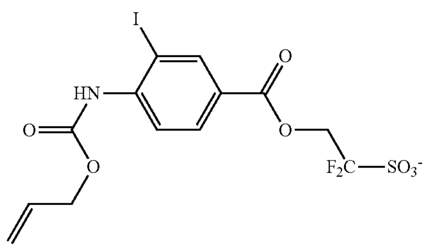
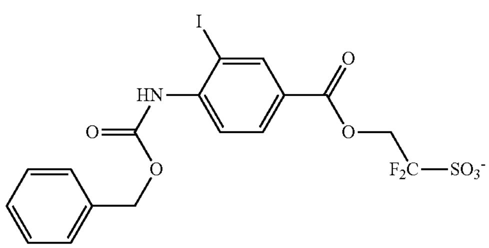
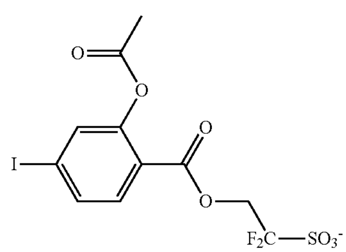
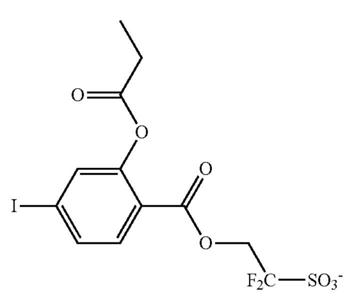
-continued
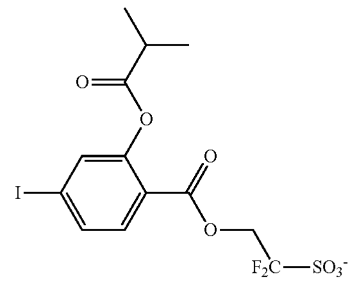
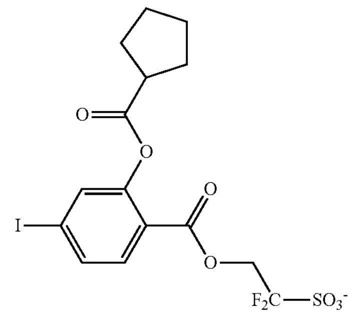
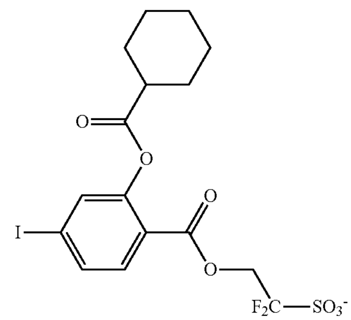
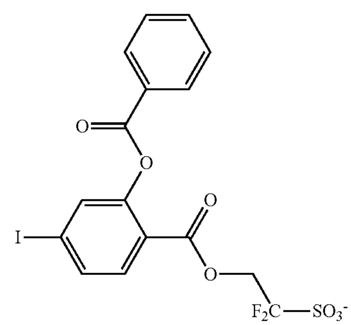
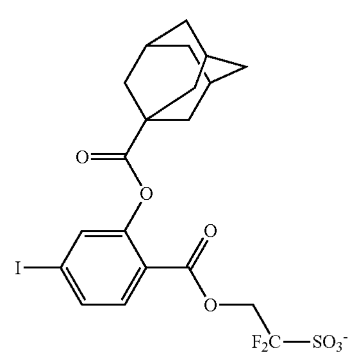

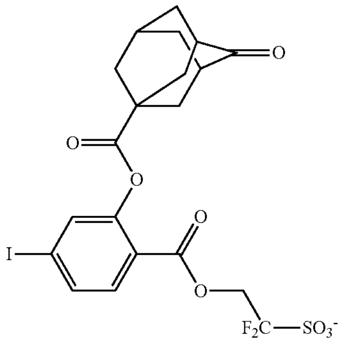
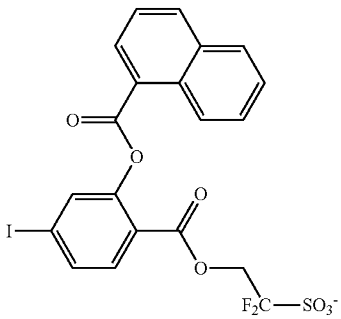
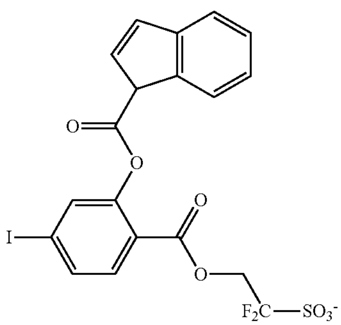
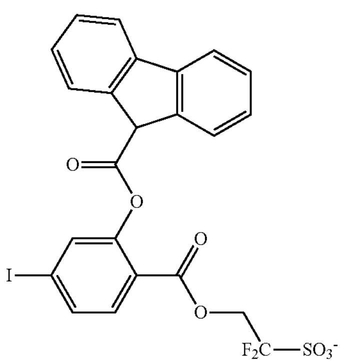
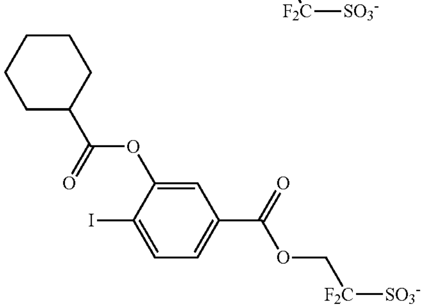
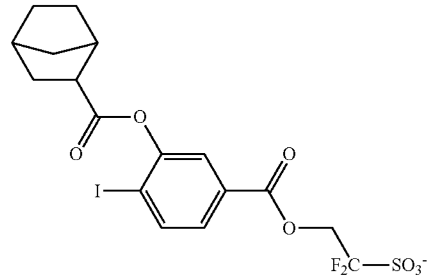
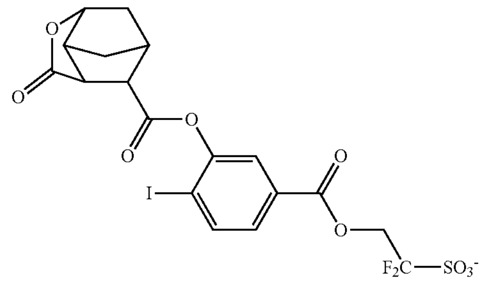
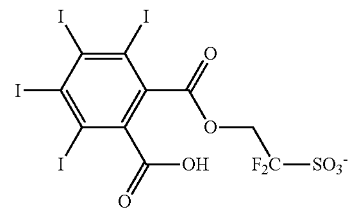
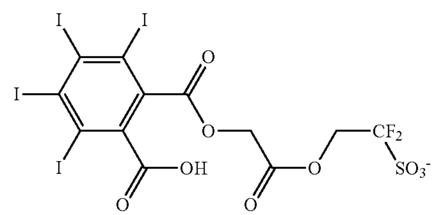
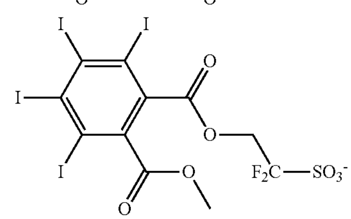
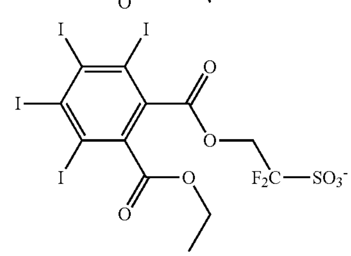
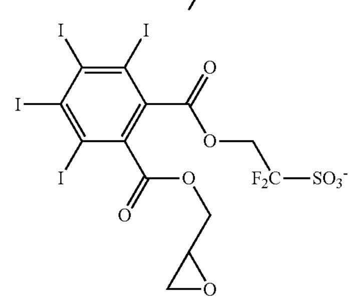

-continued
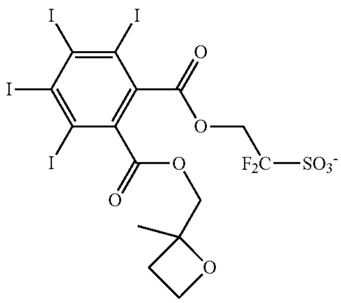
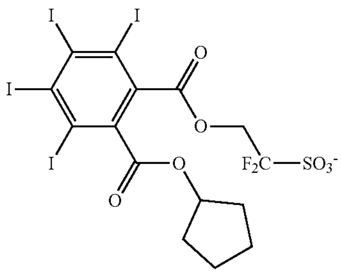
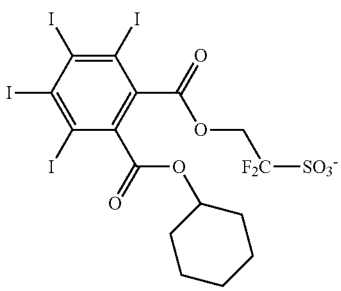
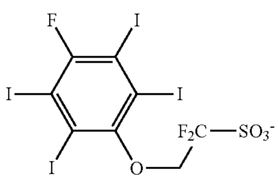
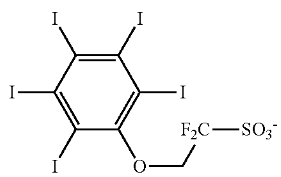
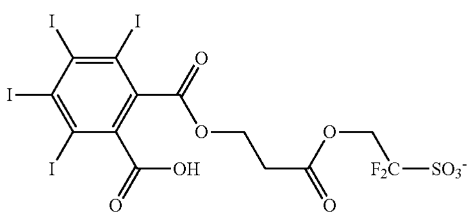
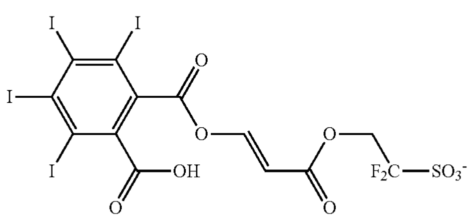
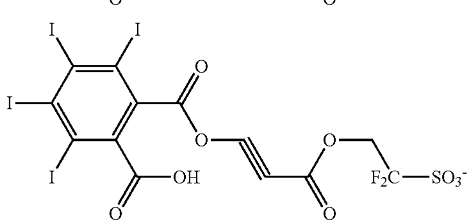
-continued
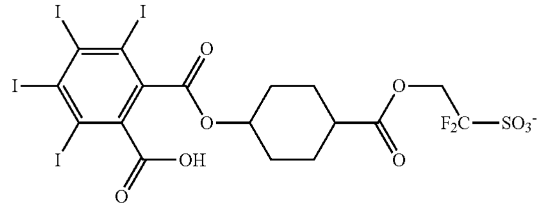
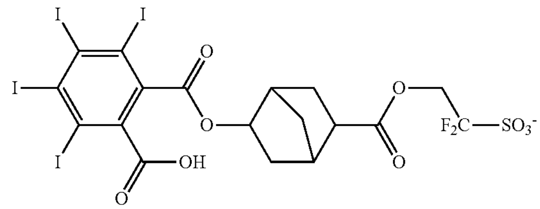
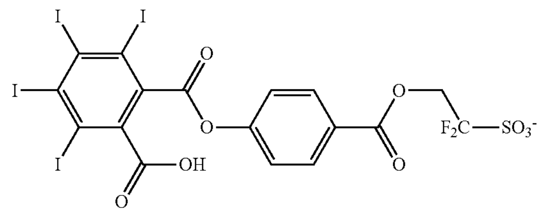
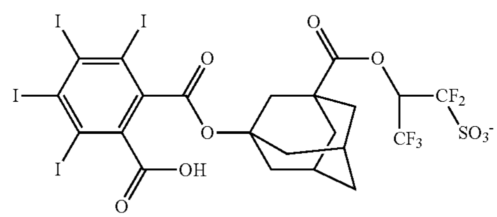
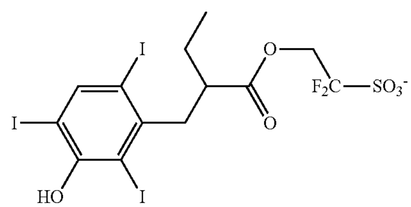
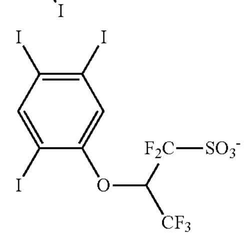
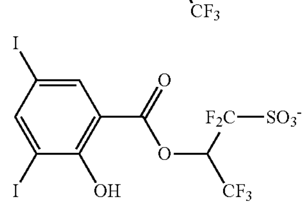
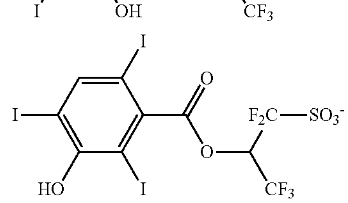

-continued
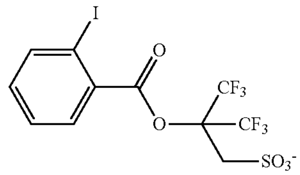
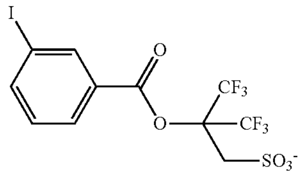
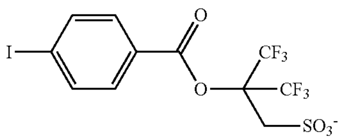
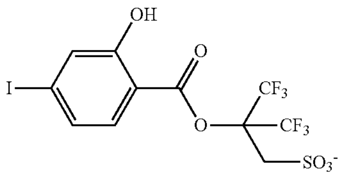
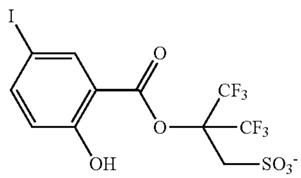
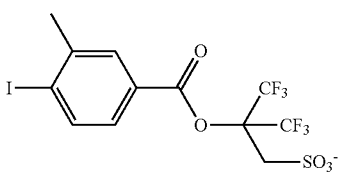
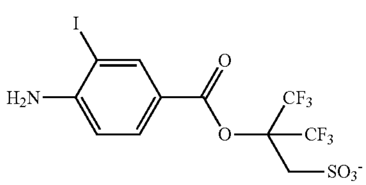
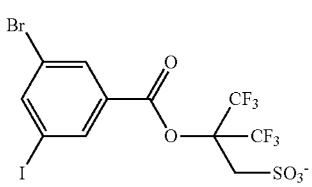
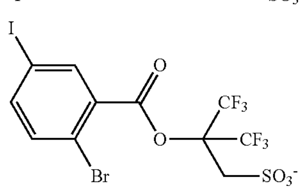
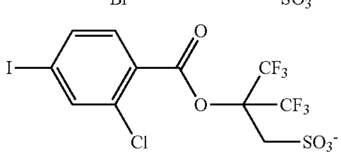
-continued
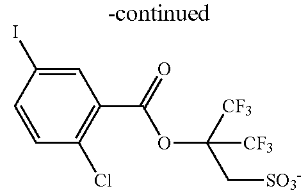
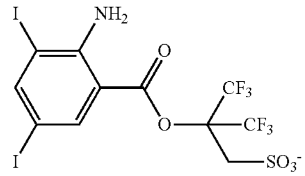
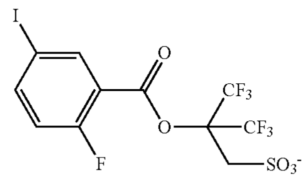
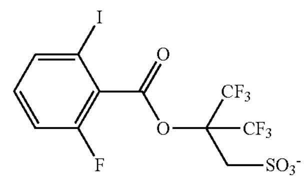
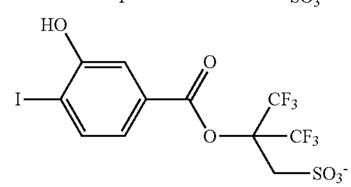
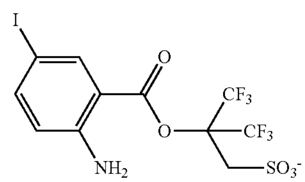
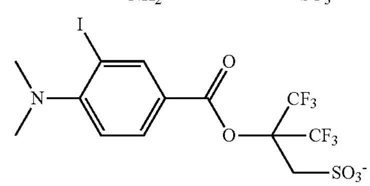
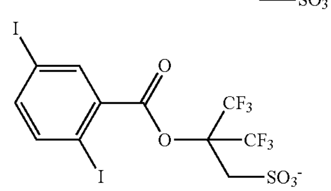
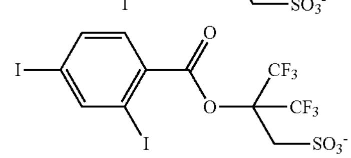
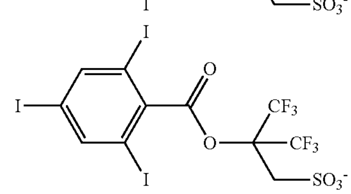

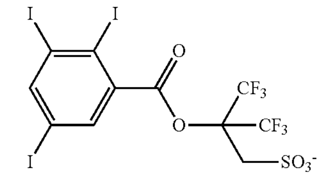
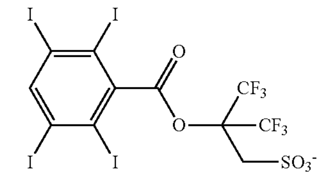
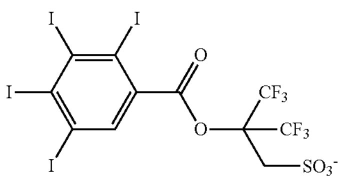
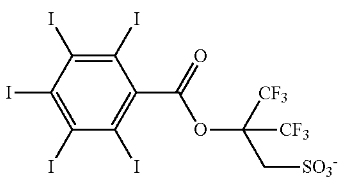
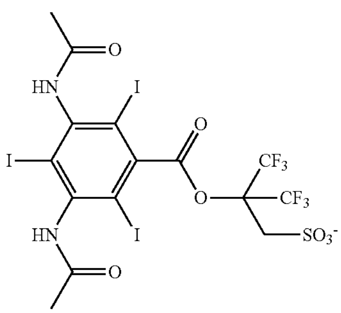
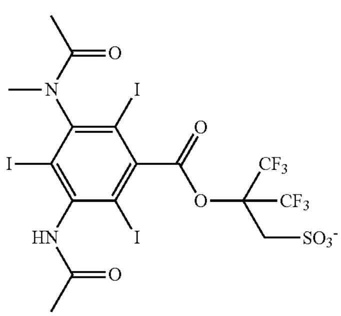
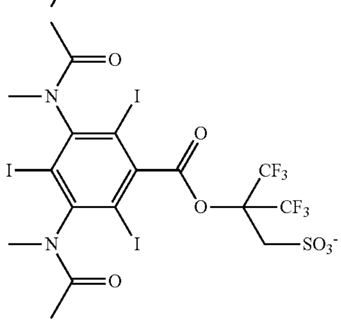
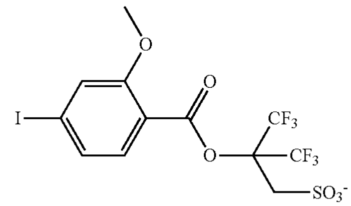
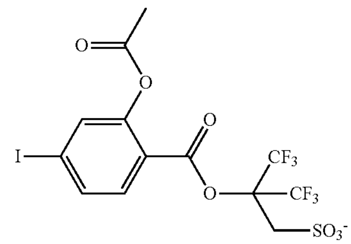
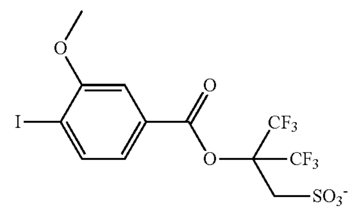
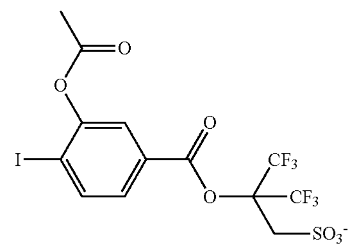
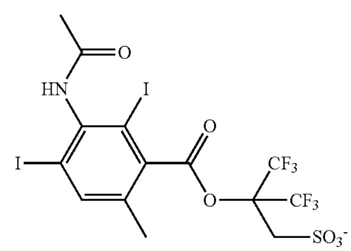
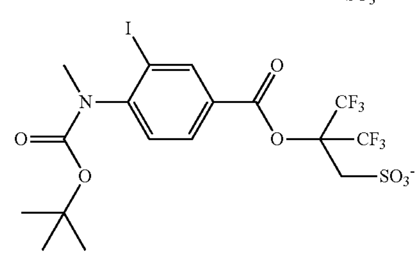
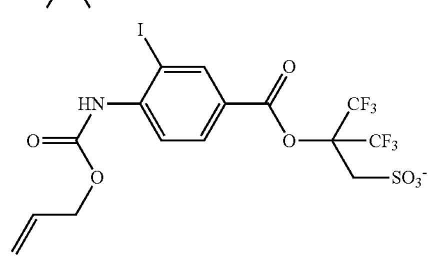

-continued
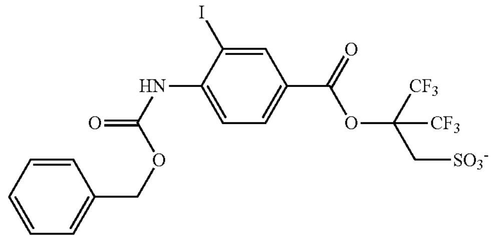
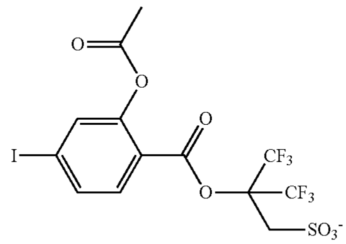
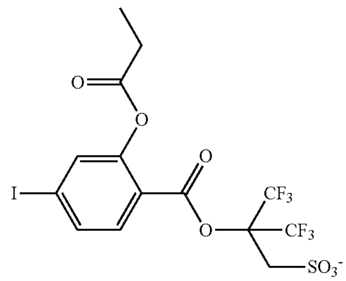
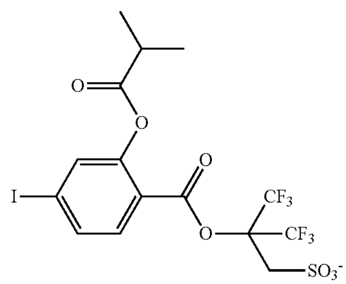
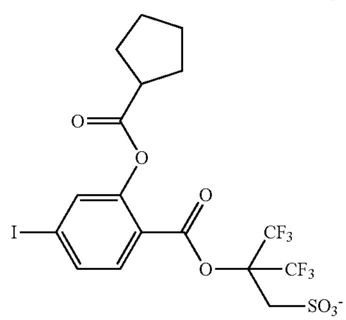
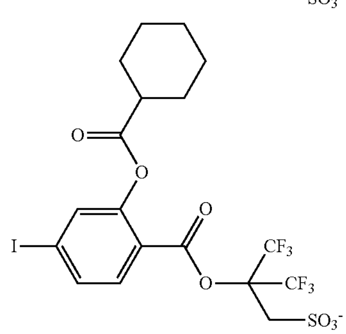
-continued
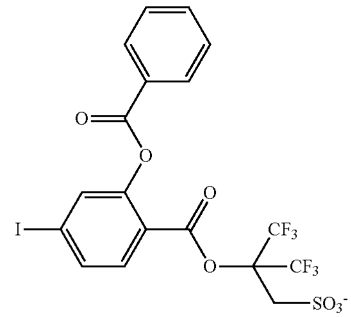
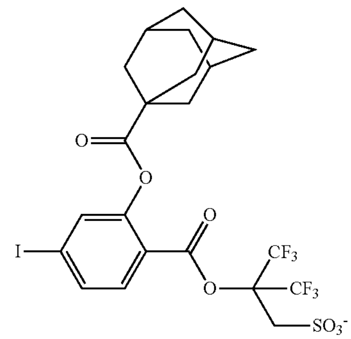
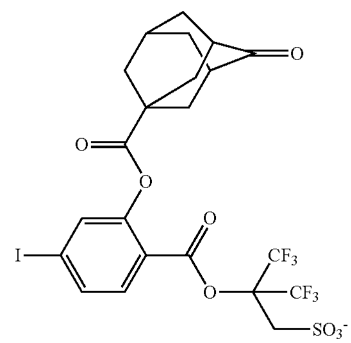
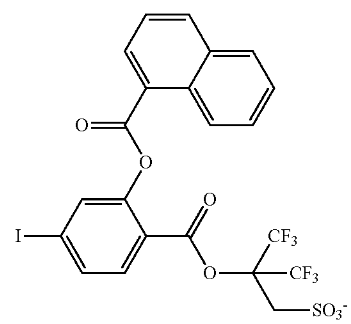
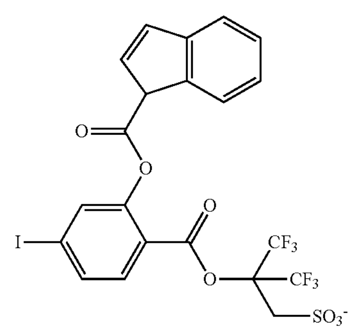

-continued
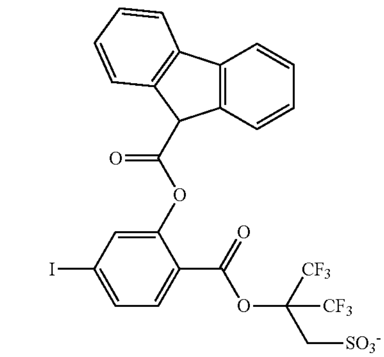
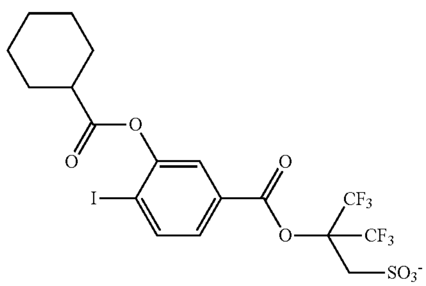
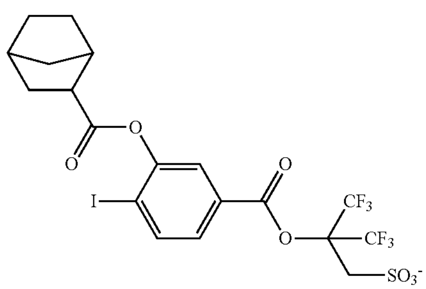
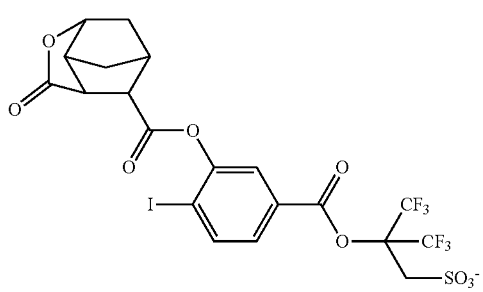
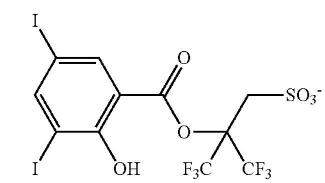
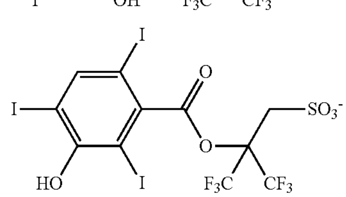
-continued
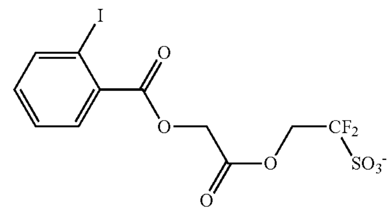
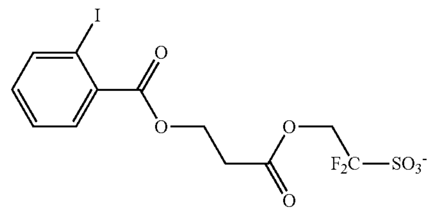
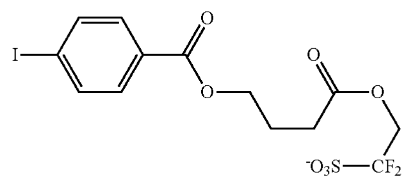
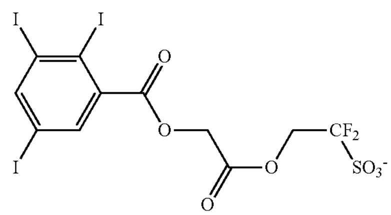
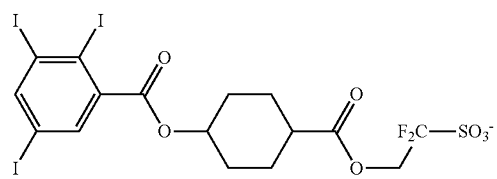
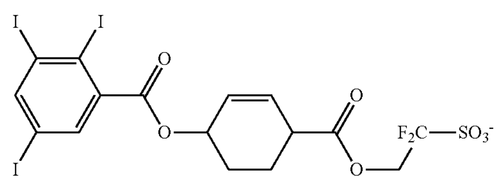
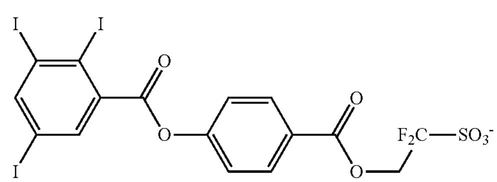
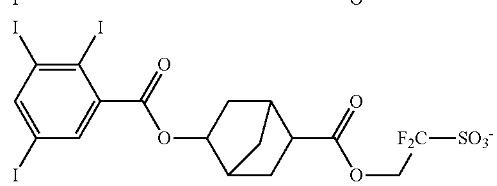
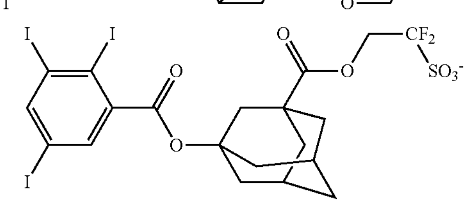

-continued
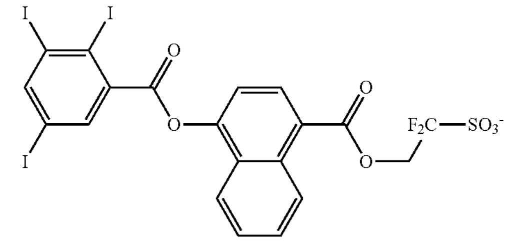
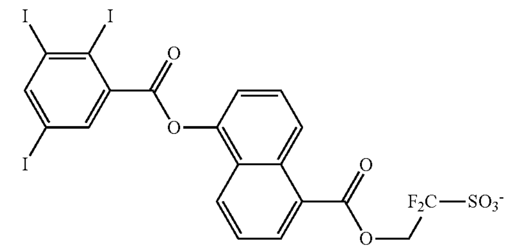
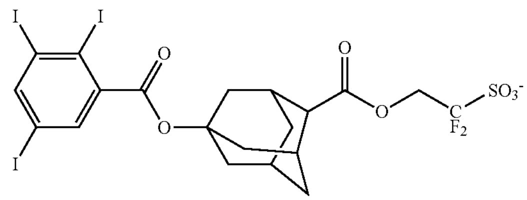
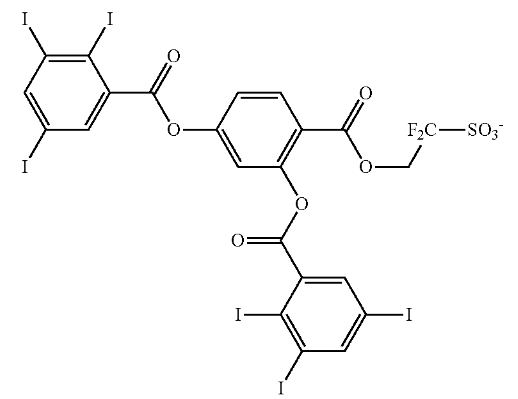
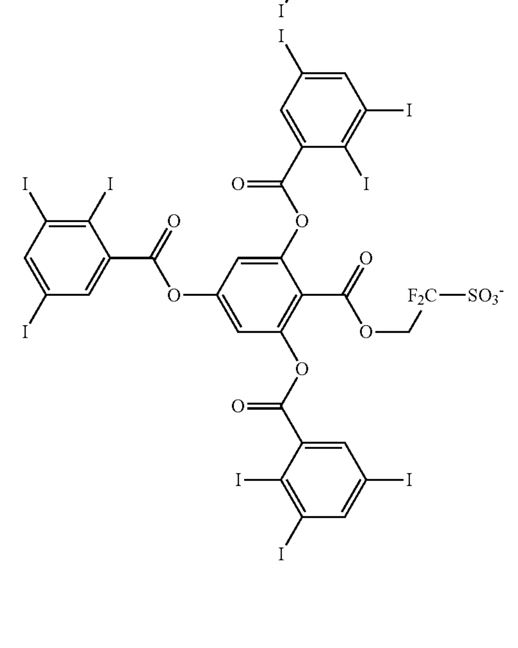
-continued
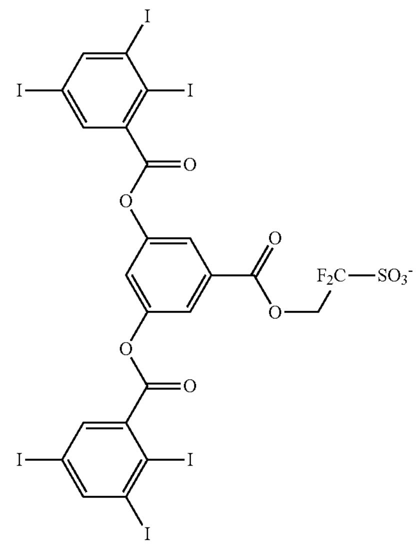
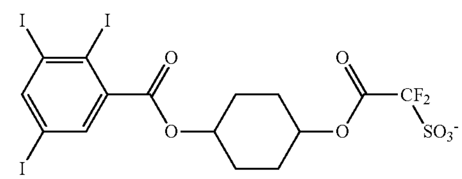
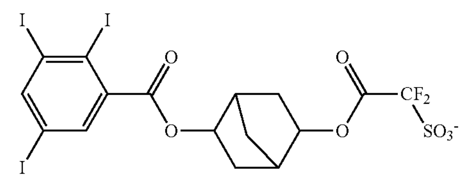
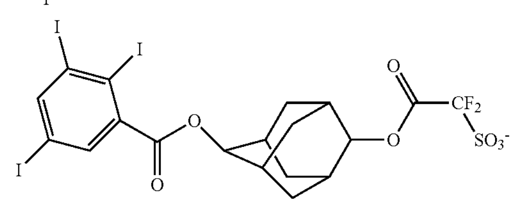
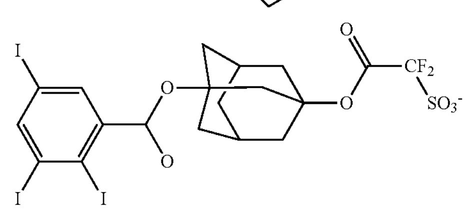
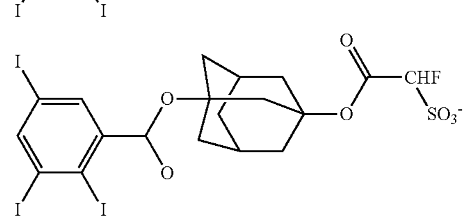
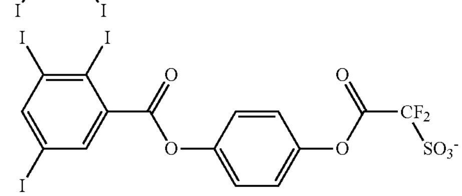

-continued
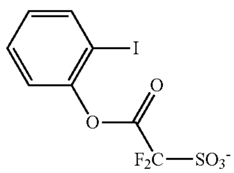
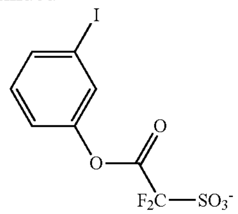
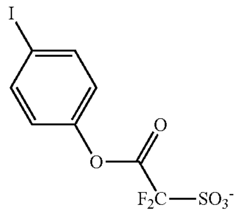
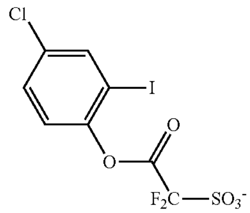
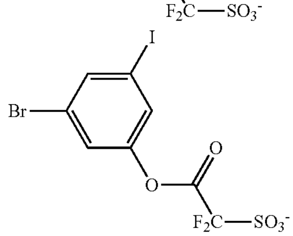
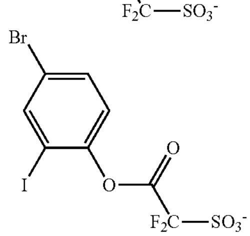
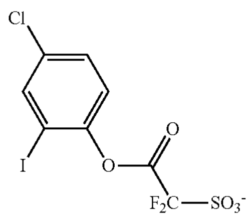
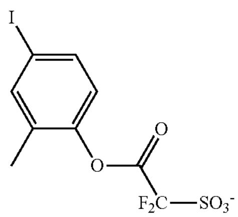
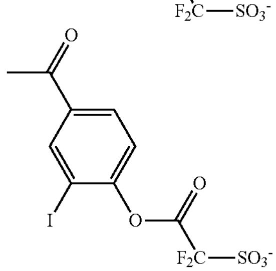
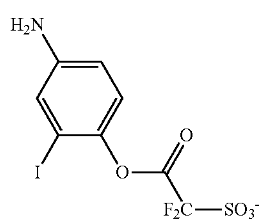
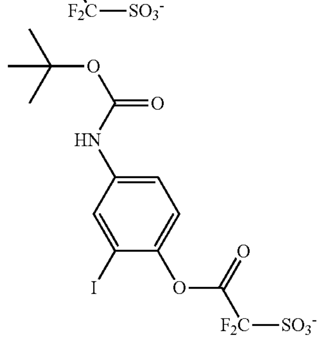
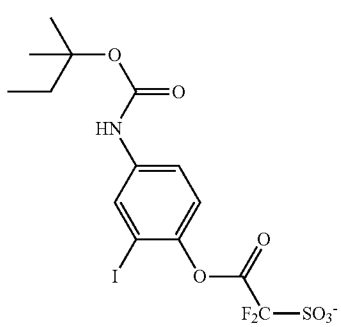
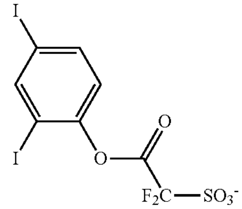
-continued
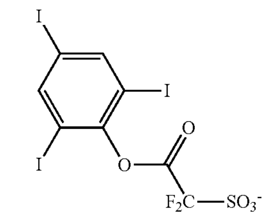
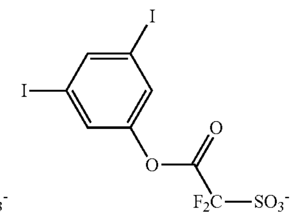
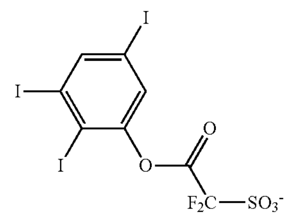
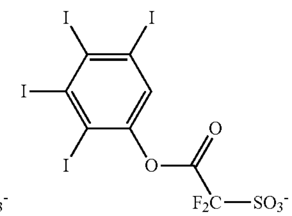
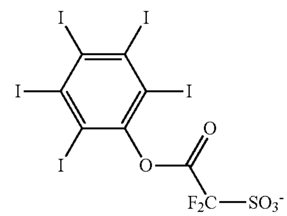
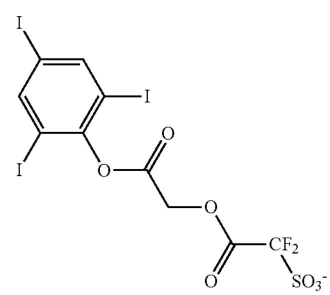
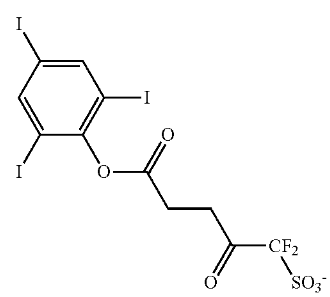
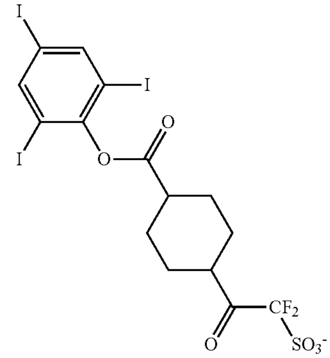

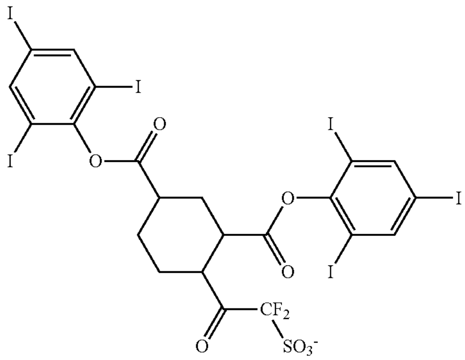
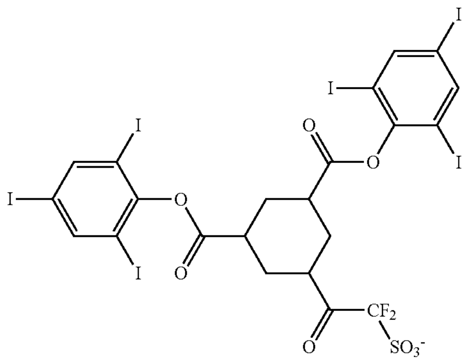
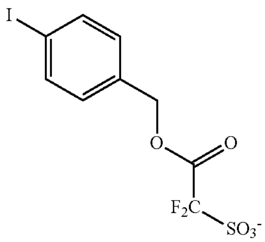
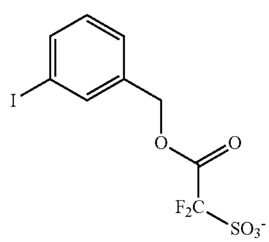
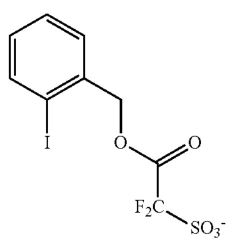
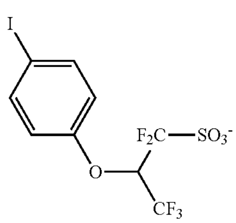
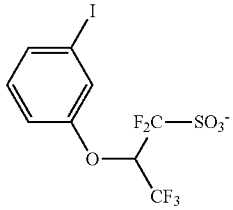
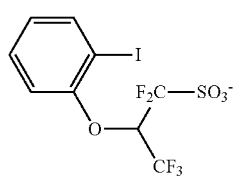
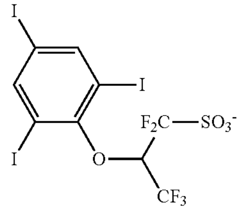
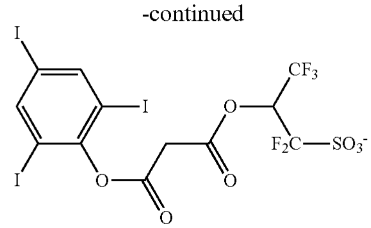
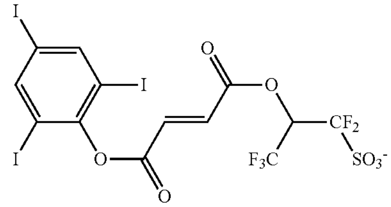
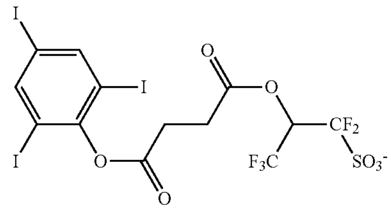
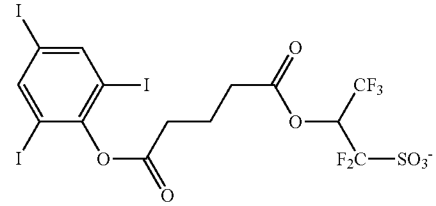
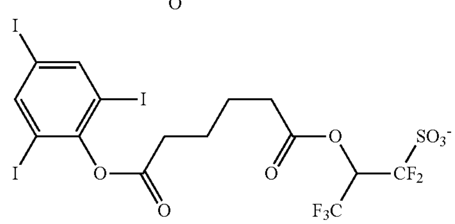
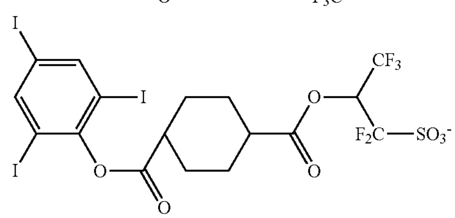
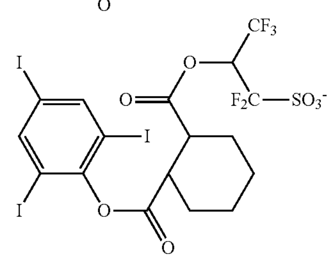
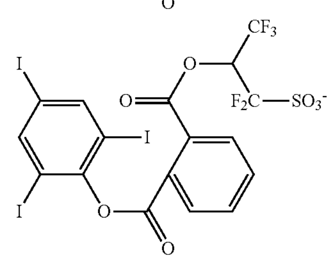

-continued
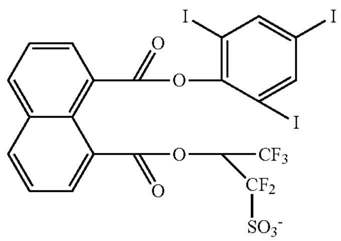
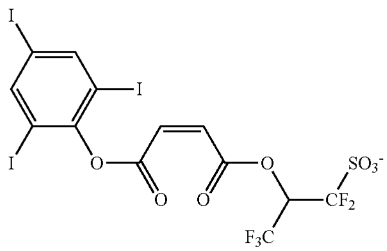
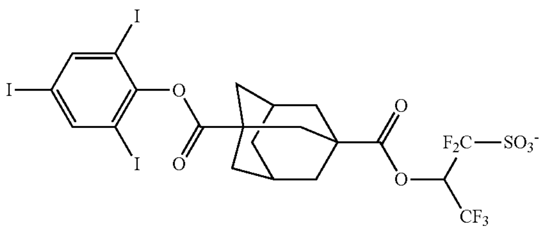
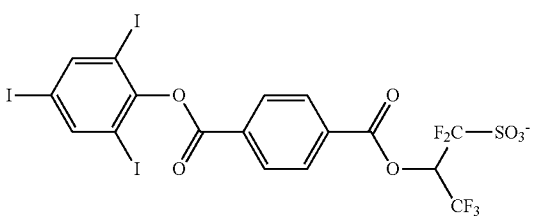
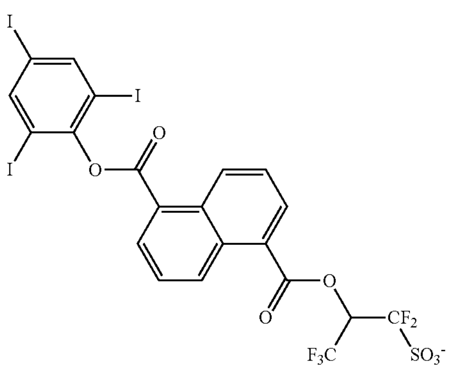
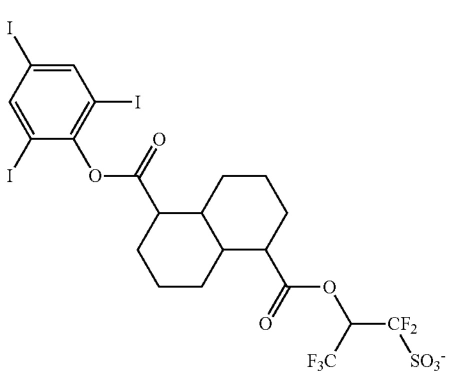
-continued
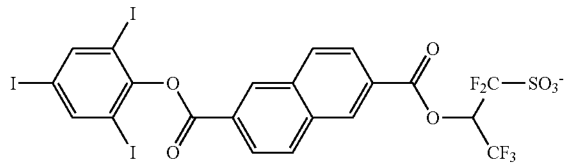
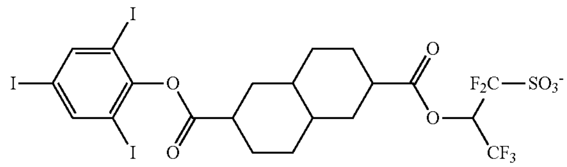
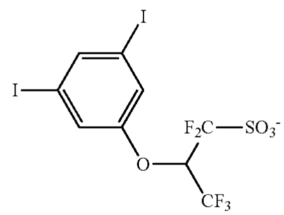
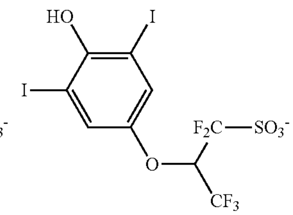
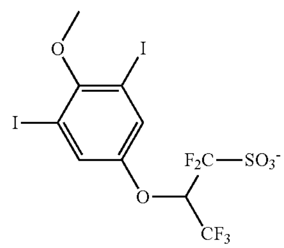
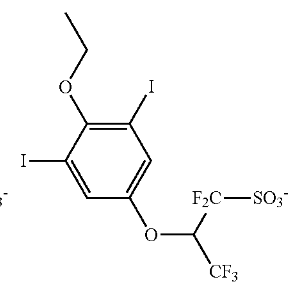
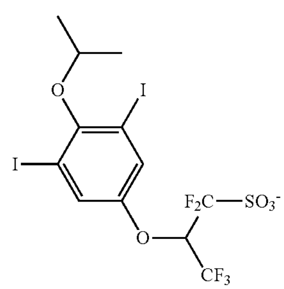
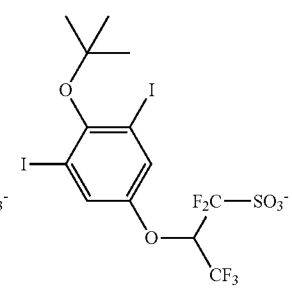
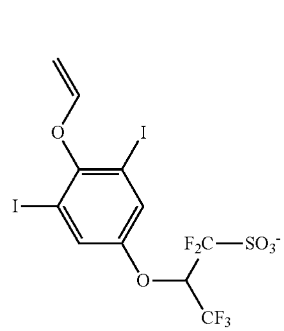
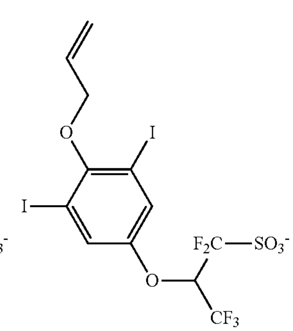

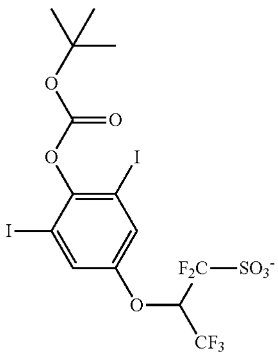
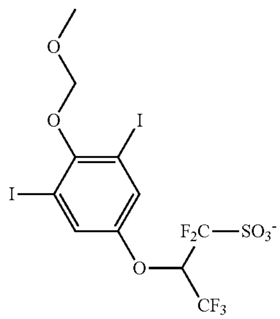
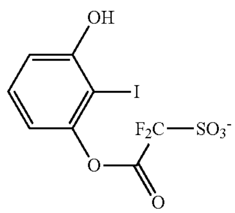
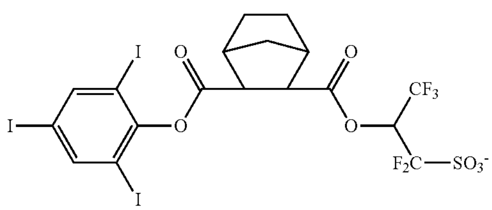
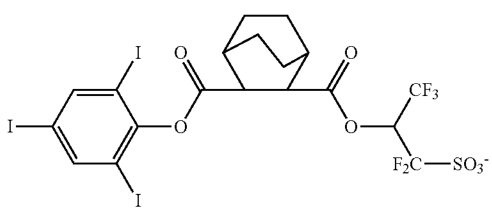
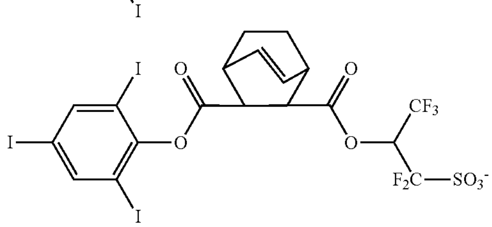
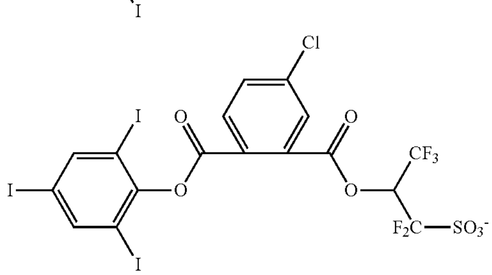
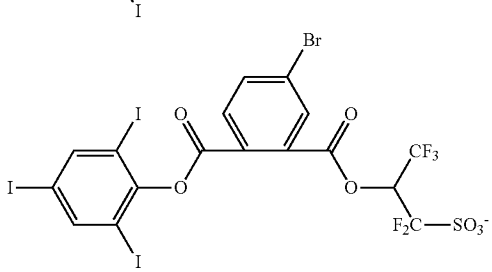
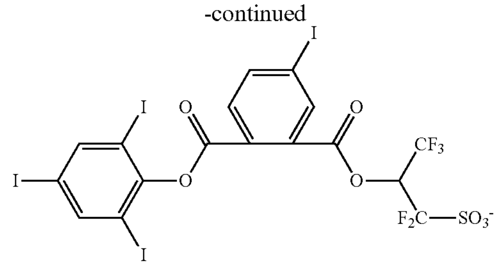
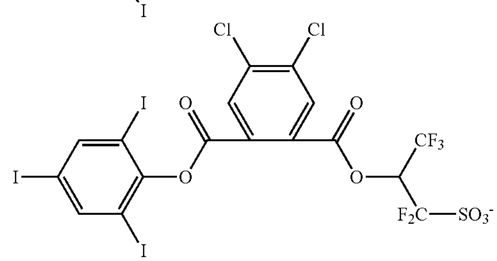
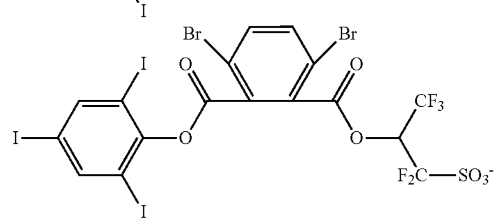
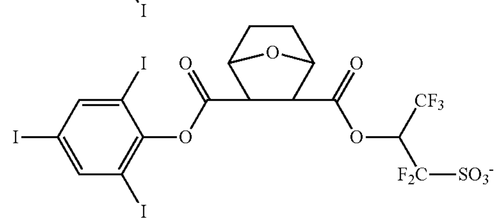
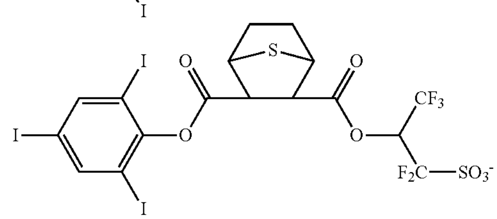
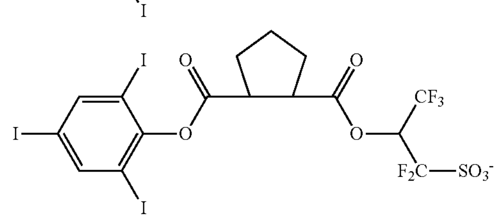
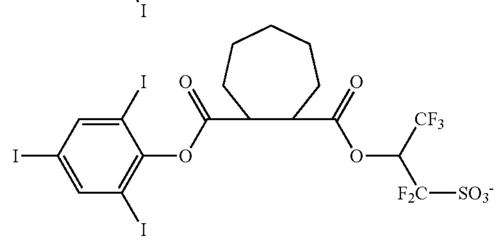
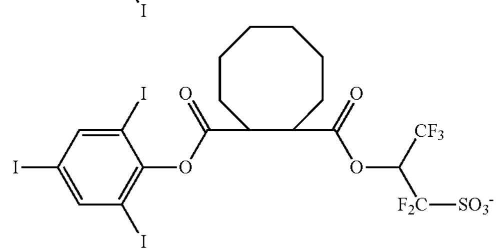

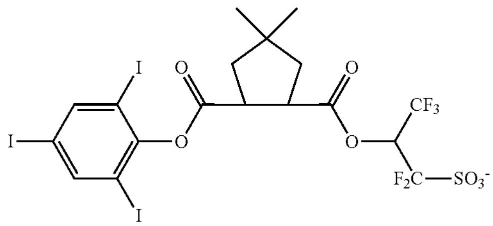
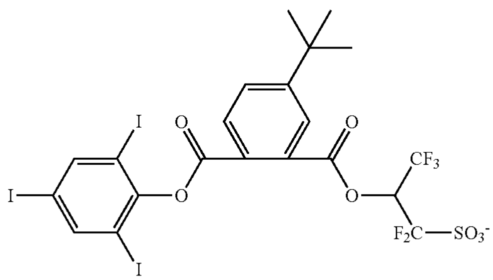
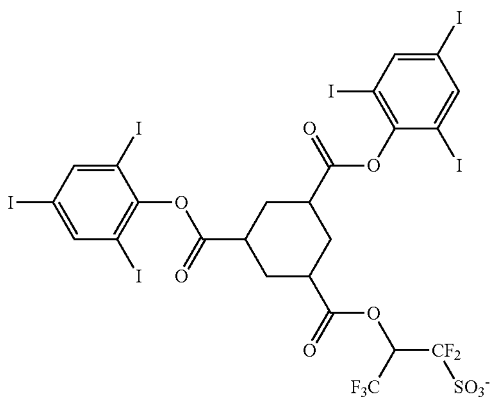
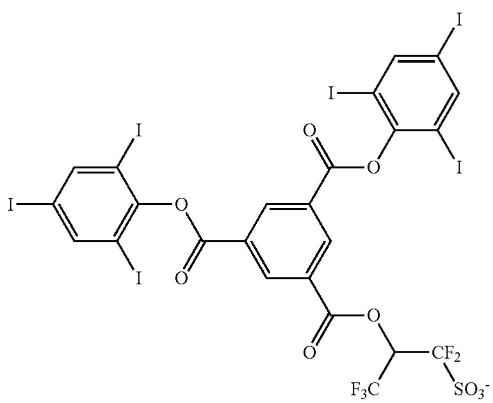
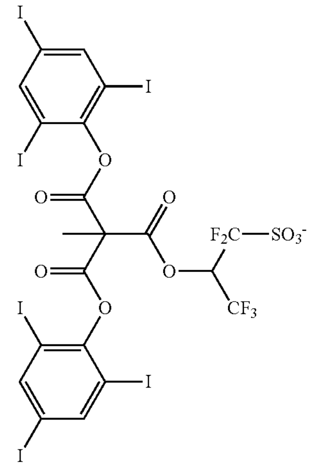
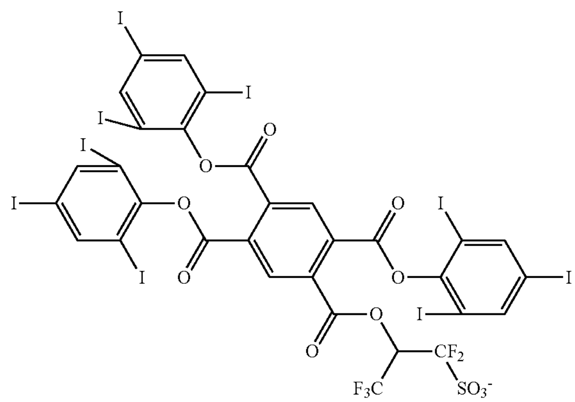
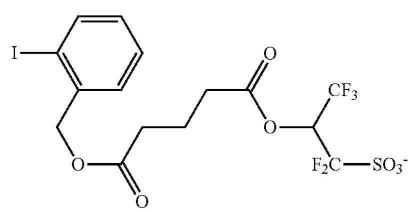
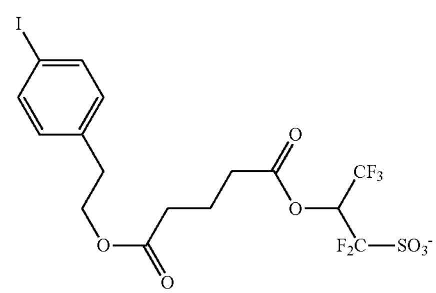
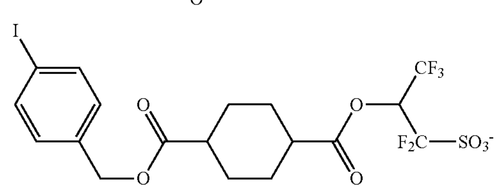

-continued
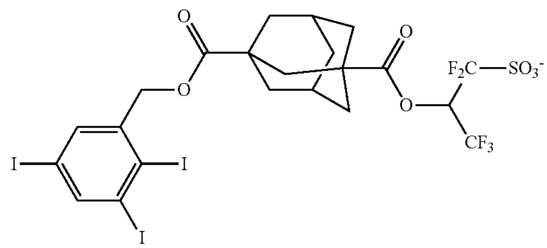
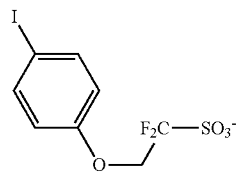
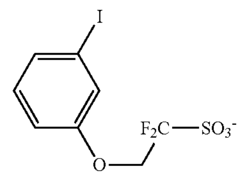
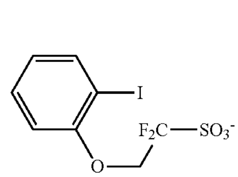
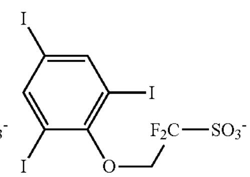
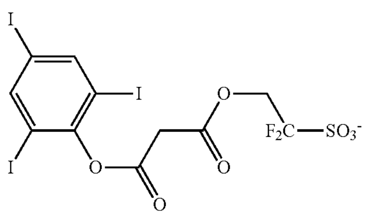
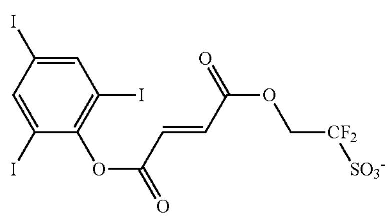
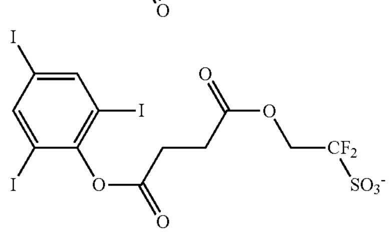
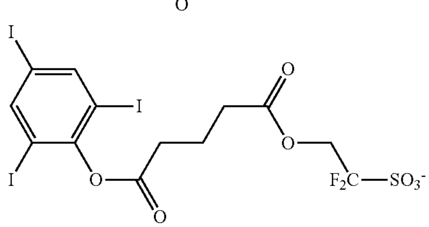
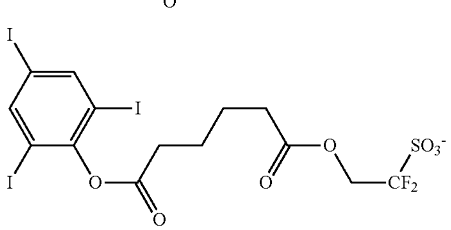
-continued
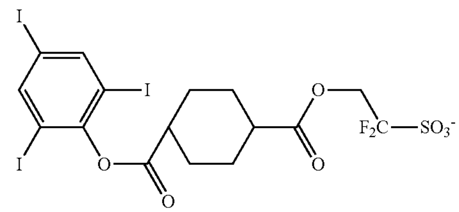
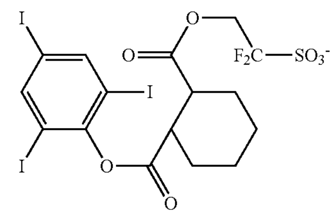
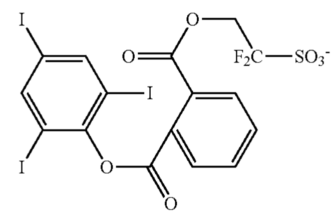
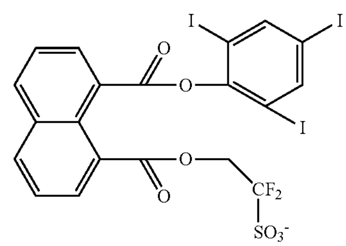
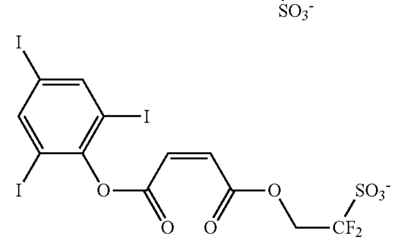
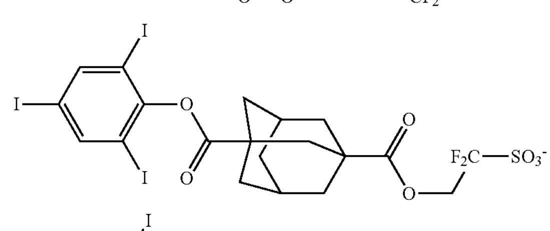
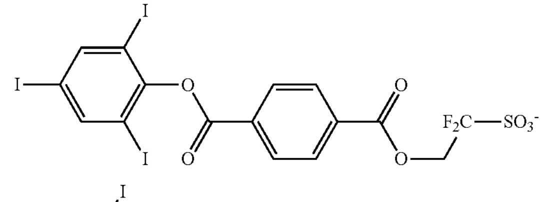
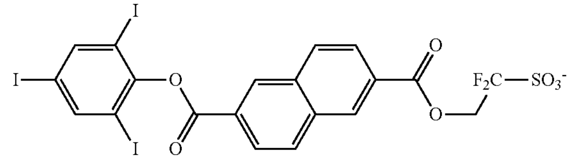

-continued
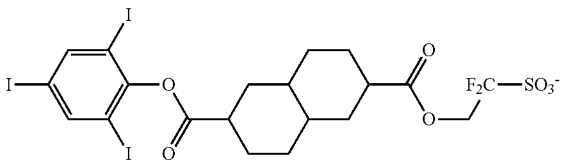
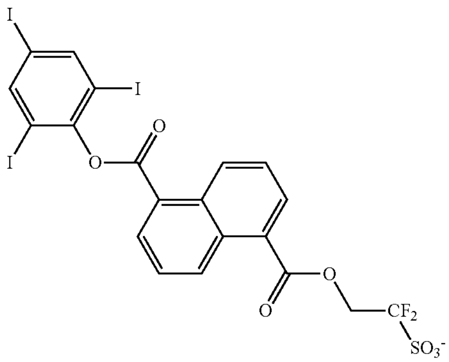
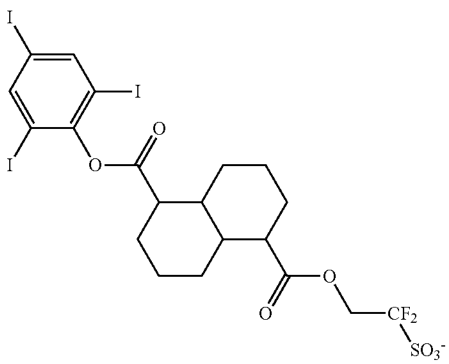
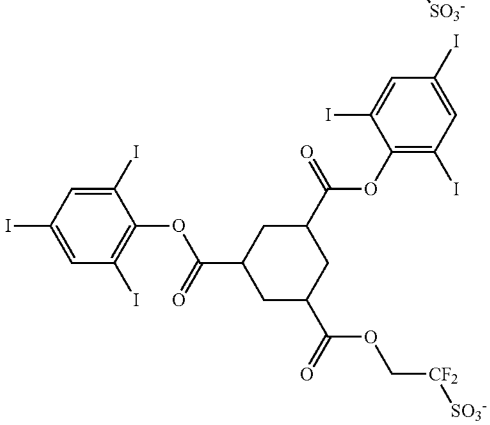
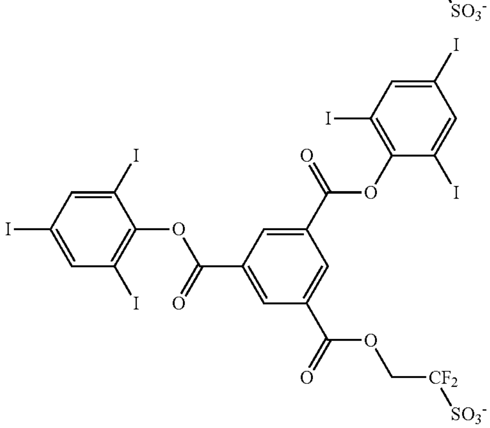
-continued
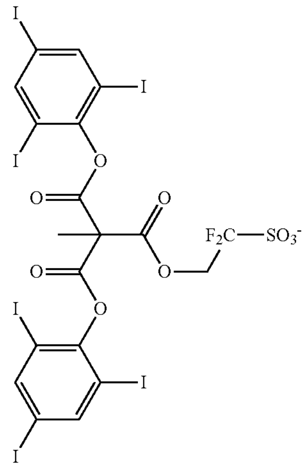
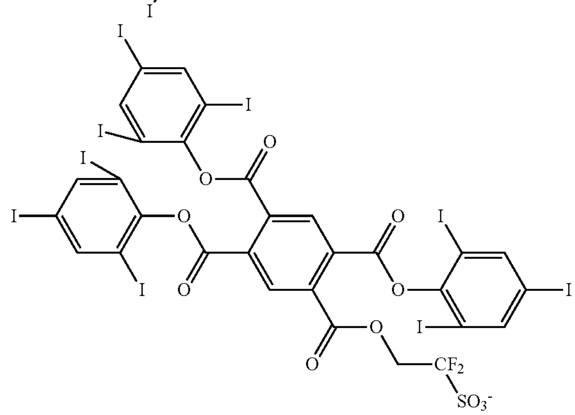
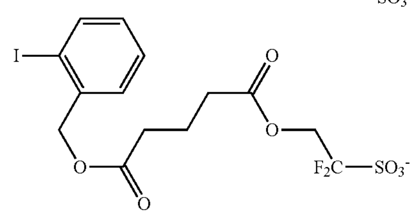
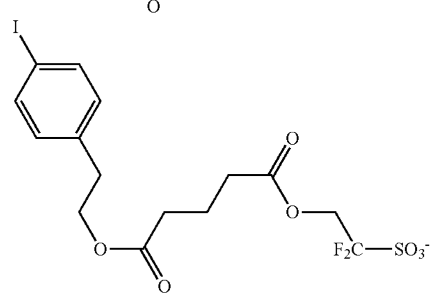
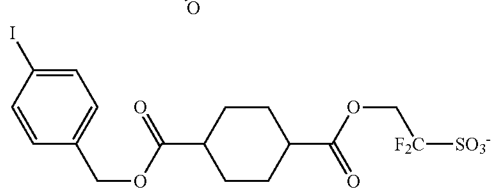
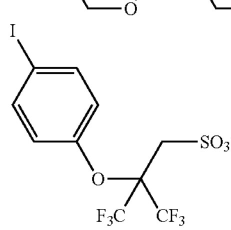
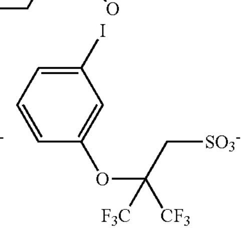

-continued
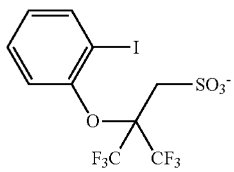
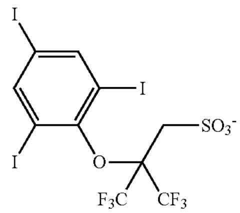
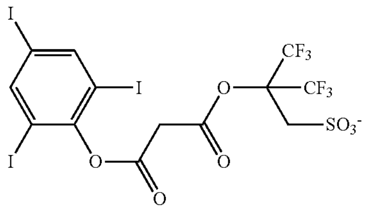
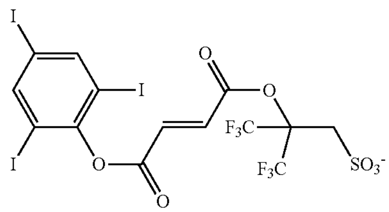
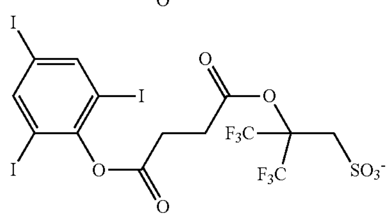
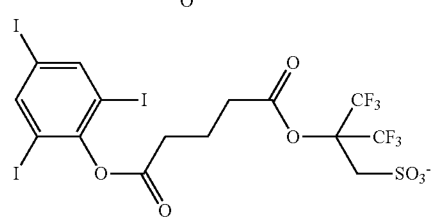
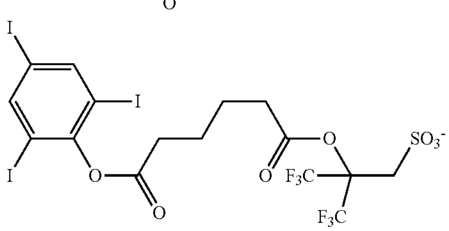
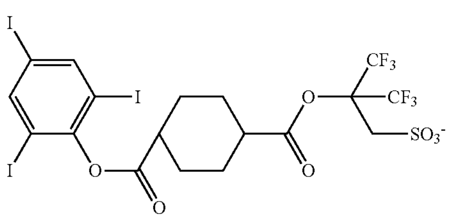
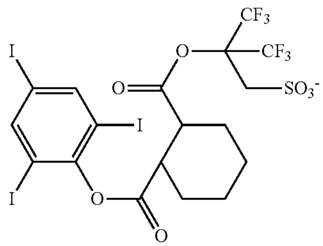
-continued
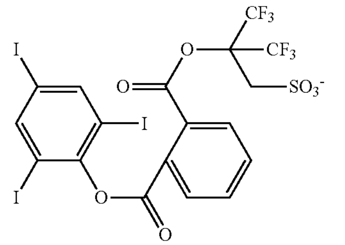
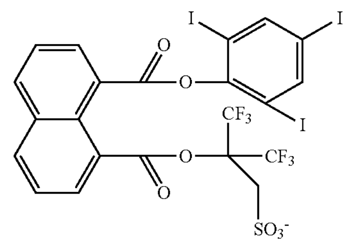
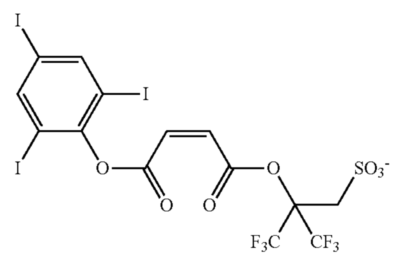
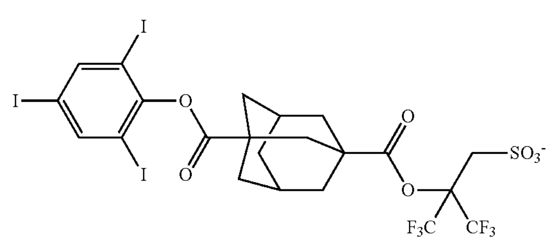
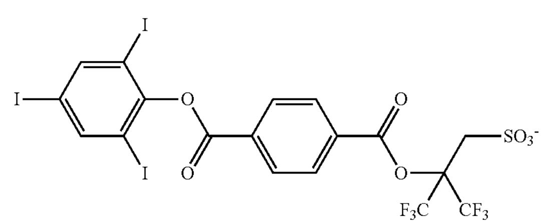
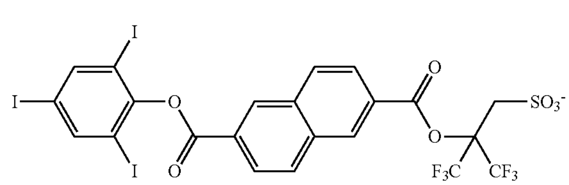
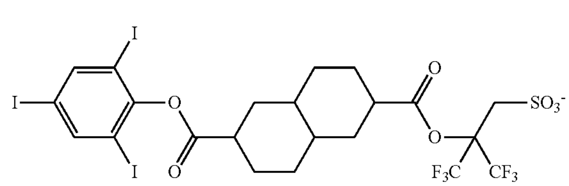

-continued

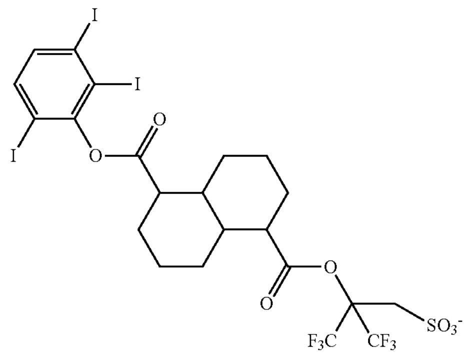

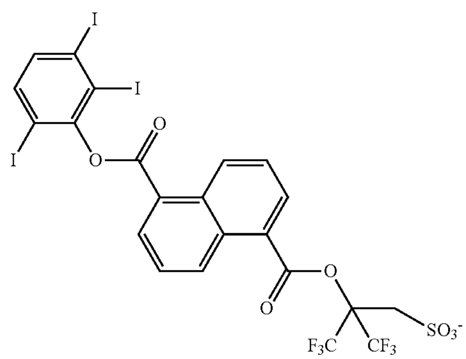

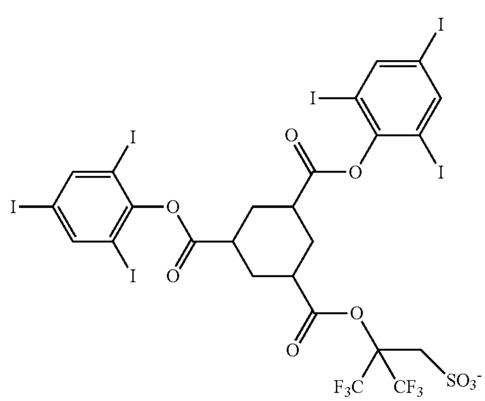

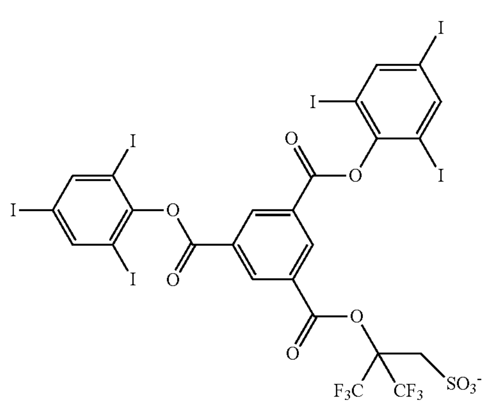

-continued

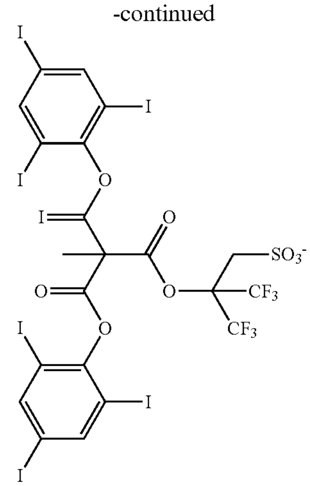

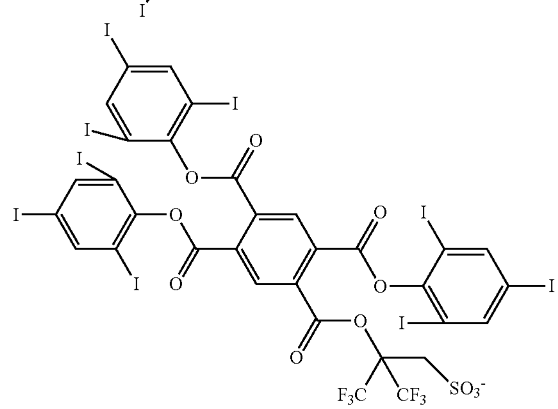

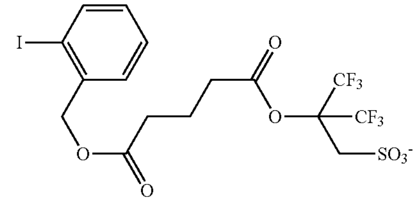

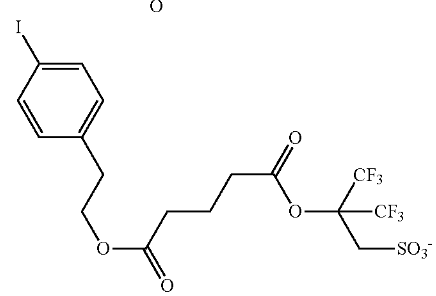

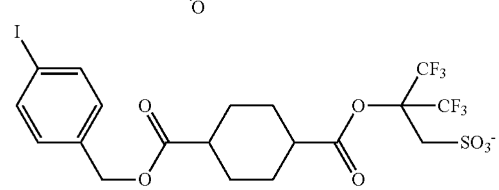

Further, a sulfonium or iodonium salt having a brominated anion may be used as the PAG. Examples of the brominated anion are those having formulae (3-1) to (3-4) wherein iodine is replaced by bromine. Examples of the brominated anion are the same as examples of the iodized anion except that iodine is replaced by bromine.

When the resist composition contains the acid generator of addition type, an appropriate amount of the generator added is 0.1 to 50 parts, more preferably 1 to 40 parts by weight per 100 parts by weight of the base polymer.

Other Components

With the base polymer and sulfonium salt as described above, other components such as an organic solvent, surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

Examples of the organic solvent used herein are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. The surfactant may be used alone or in admixture. The surfactant is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer.

Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. The crosslinker may be used alone or in admixture.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition of the invention, a quencher other than the brominated indole or indazole carboxylic acid sulfonium salt may be blended. The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the other quencher. While an α-fluorinated sulfonic acid, imide acid, and methide acid are necessary to deprotect the acid labile group of carboxylic acid ester, an α-non-fluorinated sulfonic acid or carboxylic acid is released by salt exchange with an α-non-fluorinated onium salt. An α-non-fluorinated sulfonic acid and a carboxylic acid function as a quencher because they do not induce deprotection reaction.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

The other quencher is preferably added in an amount of 0 to 5 parts, more preferably 0 to 4 parts by weight per 100 parts by weight of the base polymer. The other quencher may be used alone or in admixture.

To the resist composition, a polymeric additive (or water repellency improver) may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Process

The resist composition is used in the fabrication of various integrated circuits.

Pattern formation using the resist composition may be performed by well-known lithography processes. The process generally involves coating, prebaking, exposure, post-exposure baking (PEB), and development. If necessary, any additional steps may be added.

For example, the positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate at a temperature of 60 to 150° C. for 10 seconds to 30 minutes, preferably at 80 to 120° C. for 30 seconds to 20 minutes. The resulting resist film is generally 0.01 to 2.0 μm thick.

The resist film is then exposed to a desired pattern of high-energy radiation such as UV, deep-UV, EB, EUV, x-ray, soft x-ray, excimer laser light, γ-ray or synchrotron radiation, directly or through a mask. The exposure dose is preferably about 1 to 200 $mJ/cm^2$, more preferably about 10 to 100 $mJ/cm^2$, or about 0.1 to 100 $\mu C/cm^2$, more preferably about 0.5 to 50 $\mu C/cm^2$. The resist film is further baked (PEB) on a hotplate at 60 to 150° C. for 10 seconds to 30 minutes, preferably at 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV, x-ray, soft x-ray, γ-ray and synchrotron radiation.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLE

Examples of the invention are given below by way of illustration and not by way of limitation. The abbreviation “pbw” is parts by weight.

Sulfonium salts 1 to 12 of brominated indole or indazole carboxylic acid used in resist compositions are identified below. Sulfonium salts 1 to 12 were synthesized by ion exchange between a sodium salt of brominated indole or indazole carboxylic acid or derivative thereof providing the anion shown below and a sulfonium chloride providing the cation shown below.

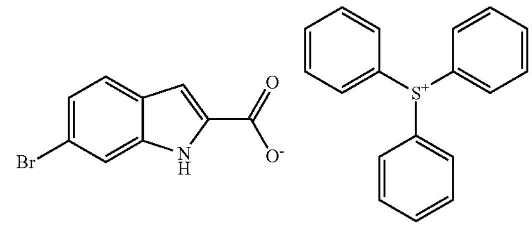

Sulfonium salt 1

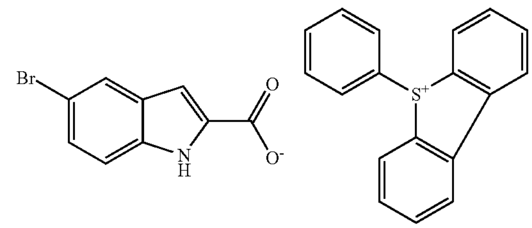

Sulfonium salt 2

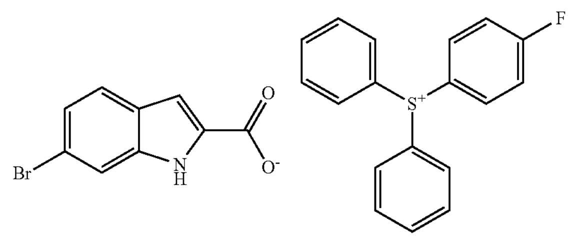

Sulfonium salt 3

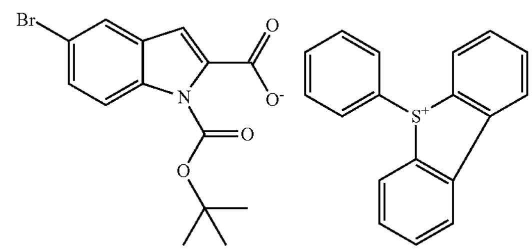

Sulfonium salt 4

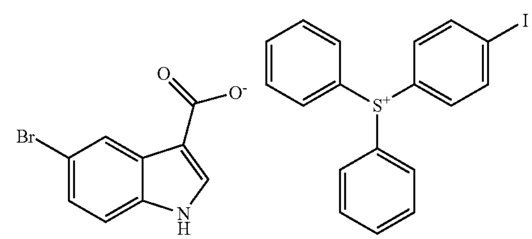

Sulfonium salt 5

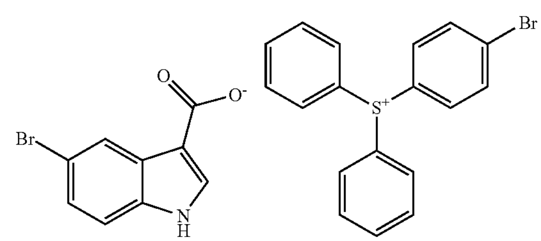

Sulfonium salt 6

-continued

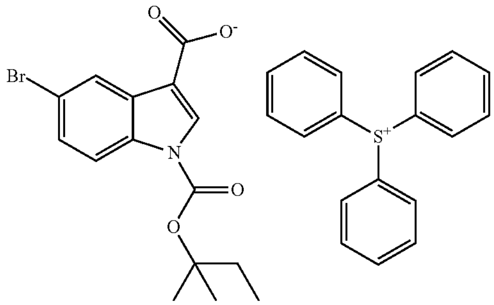

Sulfonium salt 7

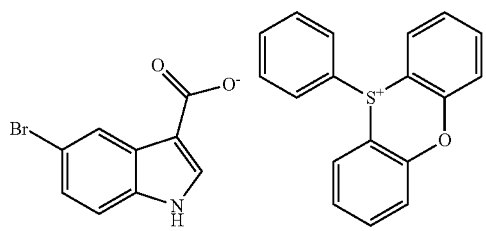

Sulfonium salt 8

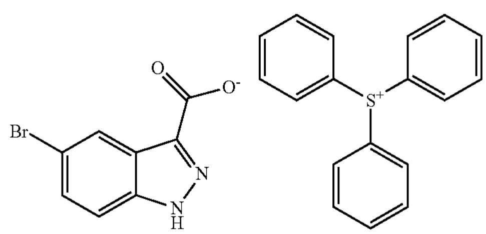

Sulfonium salt 9

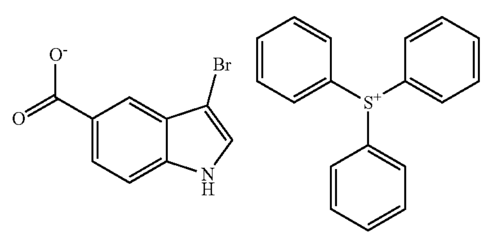

Sulfonium salt 10

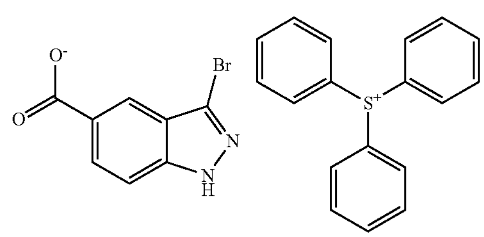

Sulfonium salt 11

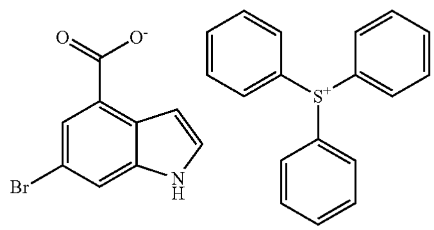

Sulfonium salt 12

SYNTHESIS EXAMPLE

Synthesis of Base Polymers (Polymers 1 to 6)

Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 6, were analyzed for composition by $^{1}$H-NMR spectroscopy, and for Mw and Mw/Mn by GPC versus polystyrene standards using THF solvent.

Polymer 1

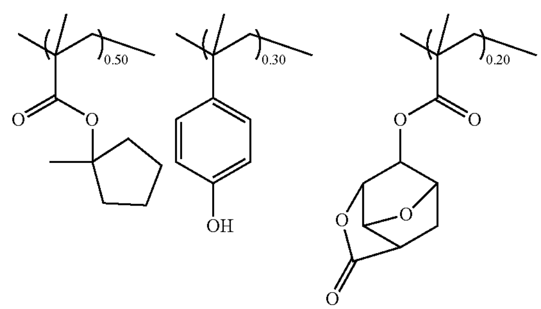

Mw = 8,600
Mw/Mn = 1.73

Polymer 2

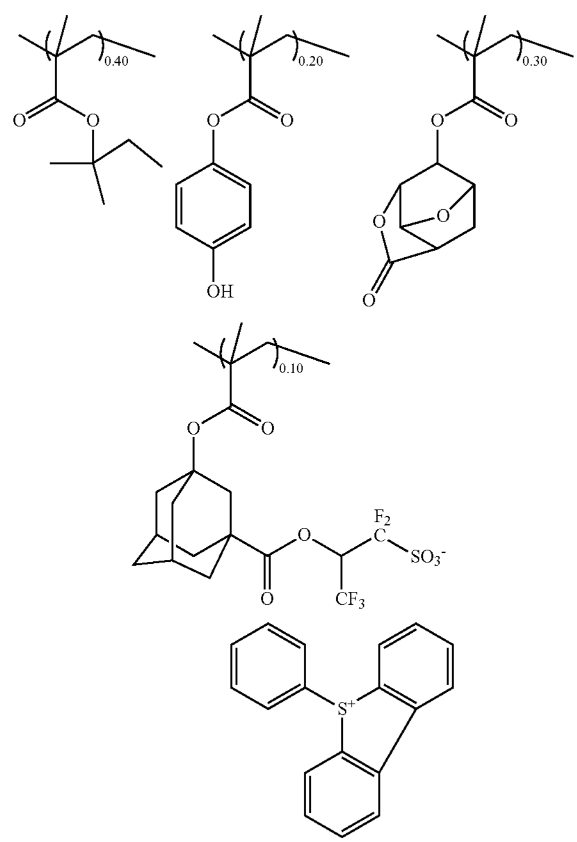

Mw = 8,900
Mw/Mn = 1.73

-continued

Polymer 3

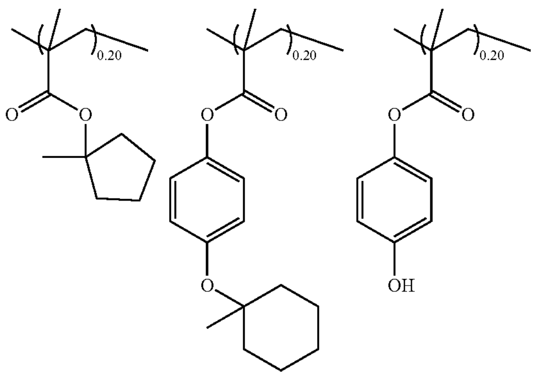

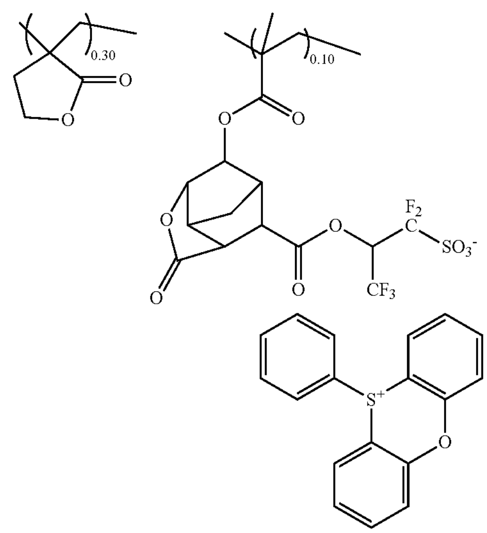

Mw = 7,600
Mw/Mn = 1.73

Polymer 4

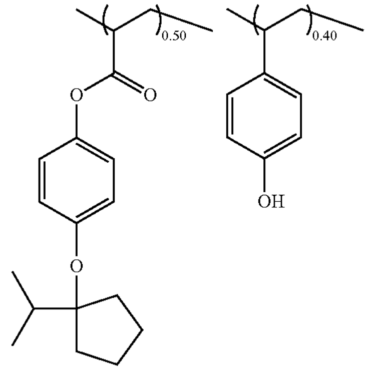

-continued

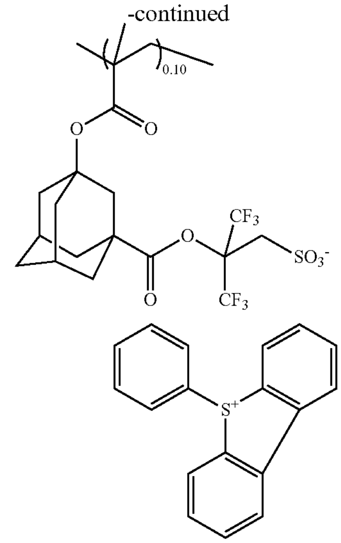

Mw = 8,800
Mw/Mn = 1.77

Polymer 5

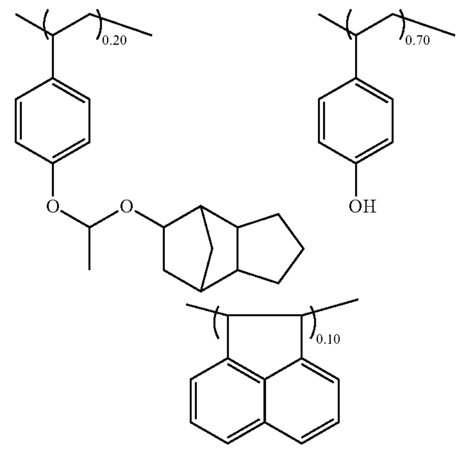

Mw = 6,100
Mw/Mn = 1.68

Polymer 6

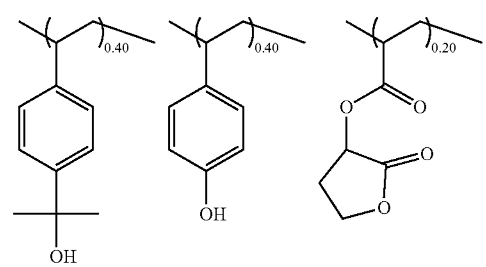

Mw = 6,900
Mw/Mn = 1.62

EXAMPLES AND COMPARATIVE EXAMPLES

Resist compositions were prepared by dissolving the polymer and selected components in a solvent in accordance with the recipe shown in Tables 1 and 2, and filtering through a filter having a pore size of 0.2 μm. The solvent contained 100 ppm of surfactant FC-4430 (3M). The components in Tables 1 and 2 are as identified below.

Organic Solvents:
- PGMEA (propylene glycol monomethyl ether acetate)
- GBL (γ-butyrolactone)
- CyH (cyclohexanone)
- PGME (propylene glycol monomethyl ether)
Acid Generators: PAG 1 to PAG 6 of the Following Structural Formulae
PAG 1
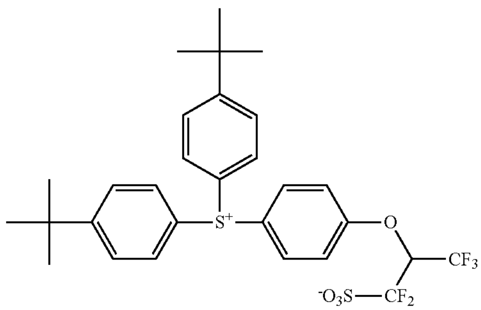
PAG 2
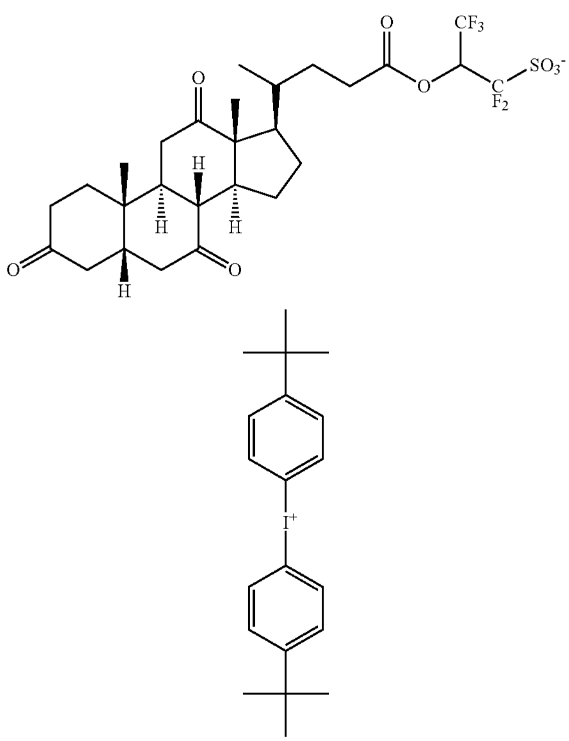
PAG 3
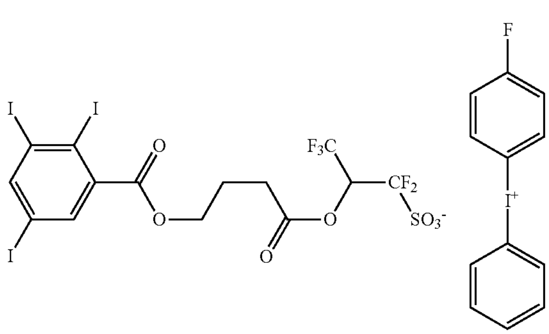
-continued
PAG 4
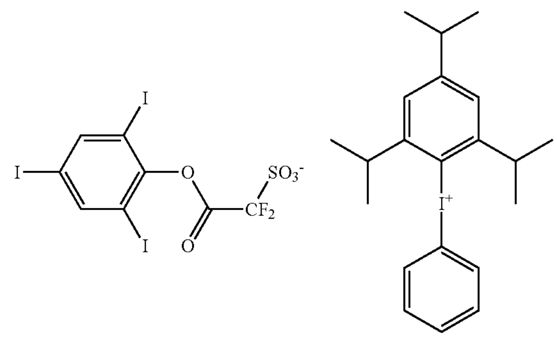
PAG 5
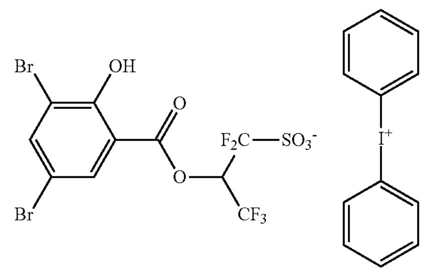
PAG 6
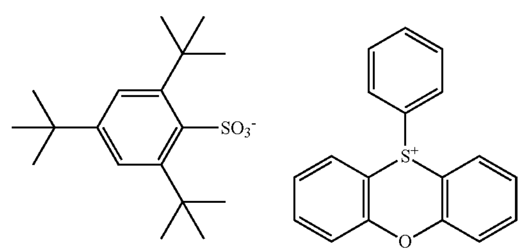
Comparative Quenchers 1 to 8 of the Following Structural Formulae
Comparative Quencher 1
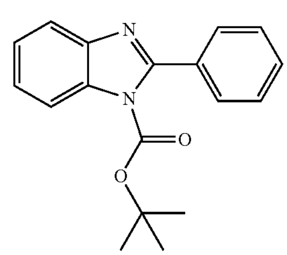
Comparative Quencher 2
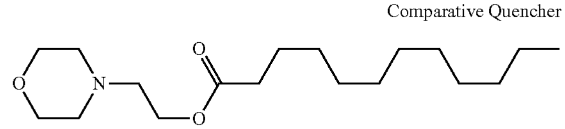

-continued

Comparative Quencher 3

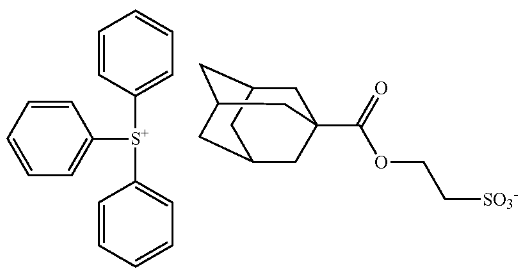

Comparative Quencher 4

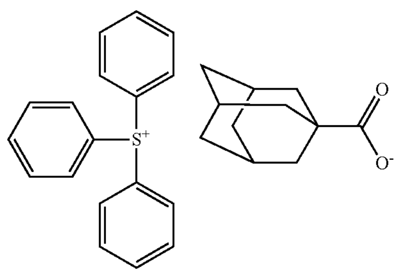

Comparative Quencher 5

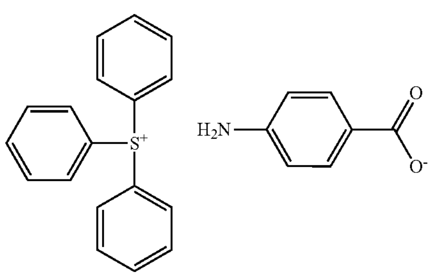

Comparative Quencher 6

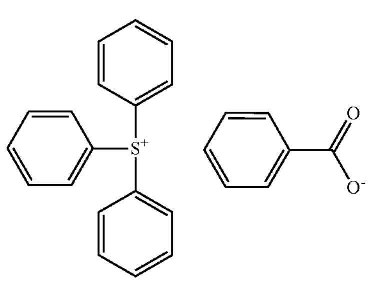

-continued

Comparative Quencher 7

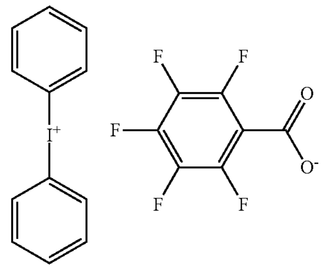

Comparative Quencher 8

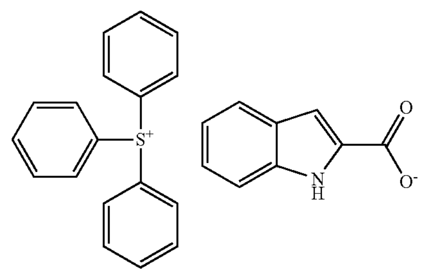

EB Lithography Test

Examples 1 to 16 and Comparative Examples 1 to 8

A silicon substrate was coated with an antireflective coating of 60 nm thick (DUV-62, Nissan Chemical Corp.). Each of the resist compositions in Tables 1 and 2 was spin coated on the substrate and prebaked on a hotplate at 105° C. for 60 seconds to form a resist film of 50 nm thick. The resist film was exposed to electron beam using an EB lithography system ELS-F125 (Elionix Co., Ltd., accelerating voltage 125 kV), then baked (PEB) on a hotplate at the temperature shown in Tables 1 and 2 for 60 seconds, and developed with a 2.38 wt % TMAH aqueous solution for 30 seconds to form a pattern. In Examples 1 to 15 and Comparative Examples 1 to 7, a positive resist pattern, i.e., hole pattern having a size of 24 nm was formed. In Example 16 and Comparative Example 8, a negative resist pattern, i.e., dot pattern having a size of 24 nm was formed.

The resist pattern was observed under CD-SEM (CG-5000, Hitachi High-Technologies Corp.). The exposure dose that provides a hole or dot pattern having a size of 24 nm is reported as sensitivity. The diameter of 50 holes or dots was measured, from which a size variation (3σ) was computed and reported as CDU.

The resist composition is shown in Tables 1 and 2 together with the sensitivity and CDU of EB lithography.

TABLE 1

| | | Polymer (pbw) | Acid generator (pbw) | Quencher (pbw) | Organic solvent (pbw) | PEB temp. (° C.) | Sensitivity (μC/cm²) | CDU (nm) |
|---|---|---|---|---|---|---|---|---|
| Example | 1 | Polymer 1 (100) | PAG 1 (30) | Sulfonium salt 1 (2.90) | PGMEA (400)<br>CyH (2,000)<br>PGME (100) | 90 | 360 | 2.9 |
| | 2 | Polymer 1 (100) | PAG 2 (30) | Sulfonium salt 2 (2.90) | PGMEA (400)<br>CyH (2,000)<br>PGME (100) | 90 | 370 | 2.9 |
| | 3 | Polymer 1 (100) | PAG 2 (30) | Sulfonium salt 3 (3.00) | PGMEA (400)<br>CyH (2,000)<br>PGME (100) | 90 | 340 | 2.9 |
| | 4 | Polymer 1 (100) | PAG 2 (30) | Sulfonium salt 4 (2.40) | PGMEA (400)<br>CyH (2,000)<br>PGME (100) | 90 | 340 | 2.8 |
| | 5 | Polymer 1 (100) | PAG 2 (30) | Sulfonium salt 5 (2.90) | PGMEA (400)<br>CyH (2,000)<br>PGME (100) | 90 | 360 | 2.9 |
| | 6 | Polymer 1 (100) | PAG 2 (30) | Sulfonium salt 6 (2.90) | PGMEA (400)<br>CyH (2,000)<br>PGME (100) | 90 | 340 | 2.9 |
| | 7 | Polymer 1 (100) | PAG 2 (30) | Sulfonium salt 7 (3.50) | PGMEA (400)<br>CyH (2,000)<br>PGME (100) | 90 | 360 | 2.8 |
| | 8 | Polymer 1 (100) | PAG 2 (30) | Sulfonium salt 8 (3.00) | PGMEA (2,200)<br>GBL (400) | 90 | 340 | 2.9 |
| | 9 | Polymer 2 (100) | — | Sulfonium salt 9 (2.40) | PGMEA (400)<br>CyH (2,000)<br>PGME (100) | 100 | 310 | 2.2 |
| | 10 | Polymer 3 (100) | — | Sulfonium salt 10 (2.40) | PGMEA (400)<br>CyH (2,000)<br>PGME (100) | 90 | 320 | 1.9 |
| | 11 | Polymer 3 (100) | PAG 3 (12) | Sulfonium salt 11 (2.40) | PGMEA (400)<br>CyH (2,000)<br>PGME (100) | 90 | 230 | 2.1 |
| | 12 | Polymer 3 (100) | PAG 4 (12) | Sulfonium salt 12 (2.40) | PGMEA (400)<br>CyH (2,000)<br>PGME (100) | 90 | 220 | 2.0 |
| | 13 | Polymer 3 (100) | PAG 5 (12) | Sulfonium salt 4 (2.40) | PGMEA (400)<br>CyH (2,000)<br>PGME (100) | 90 | 230 | 2.2 |
| | 14 | Polymer 4 (100) | — | Sulfonium salt 4 (2.40) | PGMEA (400)<br>CyH (2,000)<br>PGME (100) | 110 | 330 | 2.3 |
| | 15 | Polymer 5 (100) | PAG 6 (15) | Sulfonium salt 4 (2.40) | PGMEA (400)<br>CyH (2,000)<br>PGME (100) | 110 | 360 | 3.1 |
| | 16 | Polymer 6 (100) | PAG 5 (15) | Sulfonium salt 8 (4.50) | PGMEA (400)<br>CyH (2,000)<br>PGME (100) | 100 | 340 | 3.3 |

TABLE 2

| | | Polymer (pbw) | Acid generator (pbw) | Quencher (pbw) | Organic solvent (pbw) | PEB temp. (° C.) | Sensitivity (μC/cm²) | CDU (nm) |
|---|---|---|---|---|---|---|---|---|
| Comparative Example | 1 | Polymer 1 (100) | PAG 2 (30) | Comparative Quencher 1 (1.20) | PGMEA (400)<br>CyH (2,000)<br>PGME (100) | 90 | 390 | 4.0 |
| | 2 | Polymer 1 (100) | PAG 2 (30) | Comparative Quencher 2 (1.20) | PGMEA (400)<br>CyH (2,000)<br>PGME (100) | 90 | 410 | 3.9 |
| | 3 | Polymer 1 (100) | PAG 2 (30) | Comparative Quencher 3 (3.20) | PGMEA (400)<br>CyH (2,000)<br>PGME (100) | 90 | 380 | 3.4 |
| | 4 | Polymer 1 (100) | PAG 2 (30) | Comparative Quencher 4 (2.60) | PGMEA (400)<br>CyH (2,000)<br>PGME (100) | 90 | 410 | 3.4 |
| | 5 | Polymer 1 (100) | PAG 2 (30) | Comparative Quencher 5 (2.20) | PGMEA (400)<br>CyH (2,000)<br>PGME (100) | 90 | 430 | 3.8 |
| | 6 | Polymer 1 (100) | PAG 2 (30) | Comparative Quencher 6 (2.20) | PGMEA (400)<br>CyH (2,000)<br>PGME (100) | 90 | 400 | 3.8 |

TABLE 2-continued

| | Polymer (pbw) | Acid generator (pbw) | Quencher (pbw) | Organic solvent (pbw) | PEB temp. (° C.) | Sensitivity (μC/cm$^2$) | CDU (nm) |
|---|---|---|---|---|---|---|---|
| 7 | Polymer 1 (100) | PAG 2 (30) | Comparative Quencher 7 (2.80) | PGMEA (400)<br>CyH (2,000)<br>PGME (100) | 90 | 410 | 4.9 |
| 8 | Polymer 6 (100) | PAG 6 (15) | Comparative Quencher 8 (2.50) | PGMEA (400)<br>CyH (2,000)<br>PGME (100) | 110 | 480 | 5.8 |

It is demonstrated in Tables 1 and 2 that resist compositions comprising a sulfonium salt of formula (A-1) or (A-2) offer a high sensitivity and improved CDU.

Japanese Patent Application No. 2017-199476 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and a quencher containing a sulfonium salt having the formula (A-1) or (A-2):

(A-1)

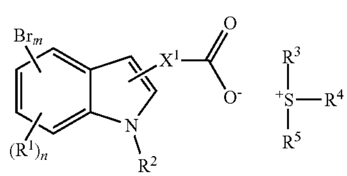

(A-2)

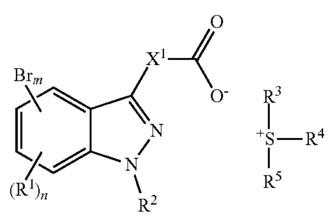

wherein $R^1$ is hydrogen, hydroxyl, $C_1$-$C_6$ alkyl, $C_1$-$C_6$ alkoxy, $C_2$-$C_7$ acyl, $C_2$-$C_7$ alkoxycarbonyl, $C_6$-$C_{10}$ aryl group, fluorine, or chlorine, $X^1$ is a single bond or a $C_1$-$C_{10}$ divalent aliphatic hydrocarbon group in which at least one hydrogen may be substituted by halogen, or at least one carbon may be substituted by an ether bond, ester bond or carbonyl moiety, $R^2$ is hydrogen, $C_1$-$C_6$ alkyl, $C_2$-$C_8$ alkenyl, $C_2$-$C_8$ alkynyl, $C_2$-$C_{15}$ alkoxycarbonyl, $C_3$-$C_{15}$ alkenyloxycarbonyl, or $C_3$-$C_{15}$ alkynyloxycarbonyl group, $R^3$, $R^4$ and $R^5$ are each independently halogen or a $C_1$-$C_{20}$ monovalent hydrocarbon group which may contain a heteroatom, any two of $R^3$, $R^4$ and $R^5$ may bond together to form a ring with the sulfur atom to which they are attached, in formula (A-1), m is an integer of 1 to 5, n is an integer of 0 to 4, and 1≤m+n≤5, and in formula (A-2), m is an integer of 1 to 4, n is an integer of 0 to 3, and 1≤m+n≤4.

2. The resist composition of claim 1, further comprising an acid generator capable of generating sulfonic acid, imide acid or methide acid.

3. The resist composition of claim 1, further comprising an organic solvent.

4. The resist composition of claim 1 wherein the base polymer comprises recurring units having the formula (a1) or recurring units having the formula (a2):

(a1)

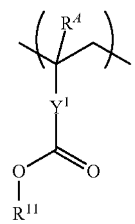

(a2)

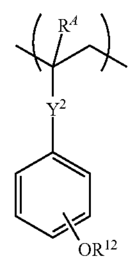

wherein $R^A$ is each independently hydrogen or methyl, $Y^1$ is a single bond, phenylene group, naphthylene group, or $C_1$-$C_{12}$ linking group containing an ester bond or lactone ring, $Y^2$ is a single bond or ester bond, $R^{11}$ and $R^{12}$ each are an acid labile group.

5. The resist composition of claim 4, further comprising a dissolution inhibitor.

6. The resist composition of claim 4 which is a chemically amplified positive resist composition.

7. The resist composition of claim 1 wherein the base polymer is free of an acid labile group.

8. The resist composition of claim 7, further comprising a crosslinker.

9. The resist composition of claim 7 which is a chemically amplified negative resist composition.

10. The resist composition of claim 1, further comprising a surfactant.

11. The resist composition of claim 1 wherein the base polymer further comprises recurring units of at least one type selected from the formulae (f1) to (f3):

(f1)

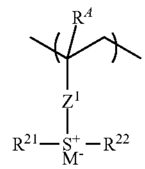

(f2)

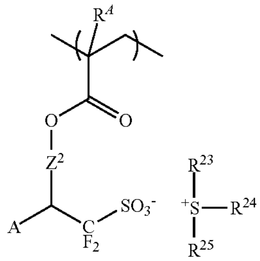

(f3)

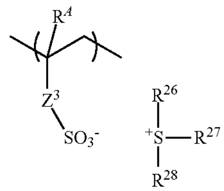

wherein $R^A$ is each independently hydrogen or methyl, $Z^1$ is a single bond, phenylene group, —O—$Z^{12}$—, or —C(=O)—$Z^{11}$—$Z^{12}$—, $Z^{11}$ is —O— or —NH—, $Z^{12}$ is a $C_1$-$C_6$ alkylene group, $C_2$-$C_6$ alkenylene group, or phenylene group, which may contain a carbonyl, ester bond, ether bond or hydroxyl moiety, $Z^2$ is a single bond, —$Z^{21}$—C(=O)—O—, —$Z^{21}$—O— or —$Z^{21}$—O—C(=O)—, $Z^{21}$ is a $C_1$-$C_{12}$ alkylene group which may contain a carbonyl, ester bond or ether bond, $Z^3$ is a single bond, methylene, ethylene, phenylene, fluorinated phenylene, —O—$Z^{32}$—, or —C(=O)—$Z^{31}$—$Z^{32}$—, $Z^{31}$ is —O— or —NH—, $Z^{32}$ is a $C_1$-$C_6$ alkylene group, phenylene group, fluorinated phenylene group, trifluoromethyl-substituted phenylene group, or $C_2$-$C_6$ alkenylene group, which may contain a carbonyl, ester bond, ether bond or hydroxyl moiety, and $R^{21}$ to $R^{28}$ are each independently a $C_1$-$C_{20}$ monovalent hydrocarbon group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached, A is hydrogen or trifluoromethyl, and $M^-$ is a non-nucleophilic counter ion.

12. A process for forming a pattern comprising the steps of applying the resist composition of claim 1 onto a substrate, baking to form a resist film, exposing the resist film to high-energy radiation, and developing the exposed film in a developer.

13. The process of claim 12 wherein the high-energy radiation is ArF excimer laser radiation of wavelength 193 nm or KrF excimer laser radiation of wavelength 248 nm.

14. The process of claim 12 wherein the high-energy radiation is EB or EUV of wavelength 3 to 15 nm.

15. The resist composition of claim 1 wherein the anion in the sulfonium salt having formula (A-1) is selected from the group consisting of the following formulae:

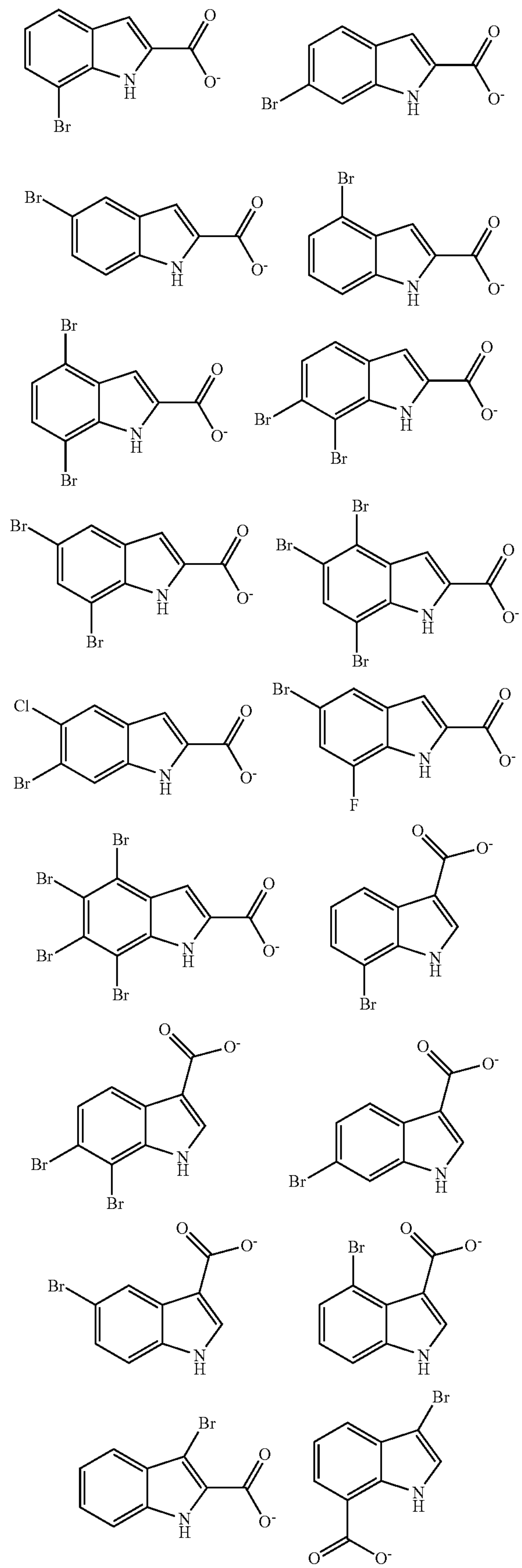

-continued
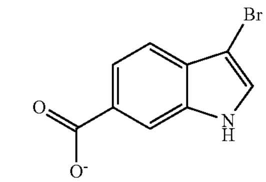
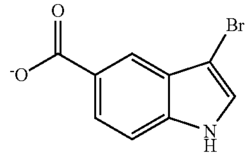
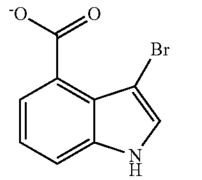
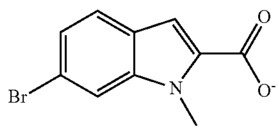
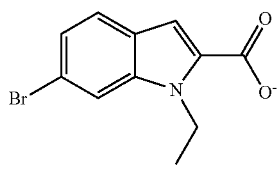
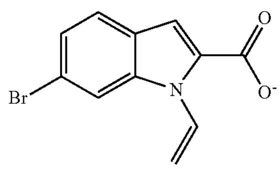
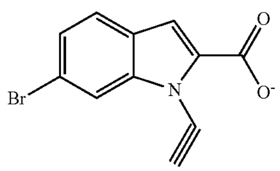
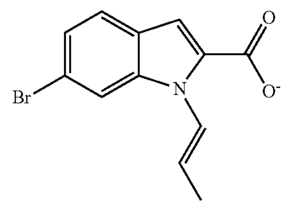
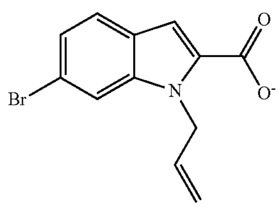
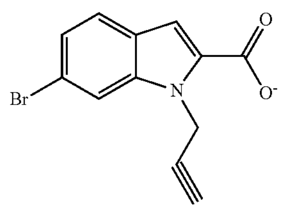
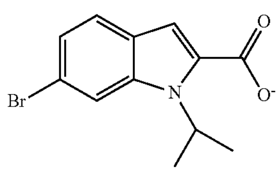
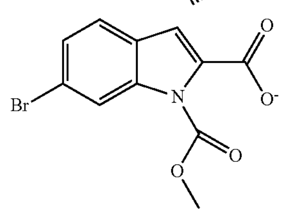
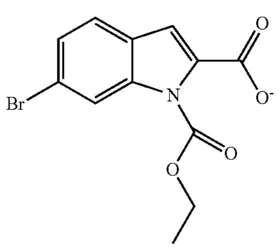
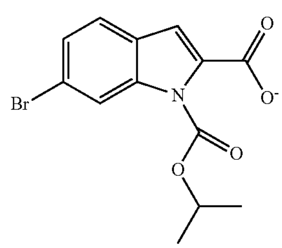
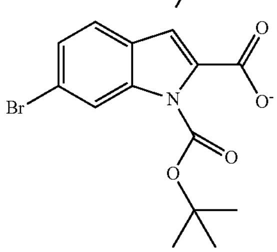
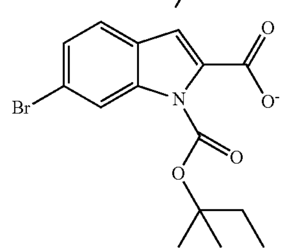
-continued
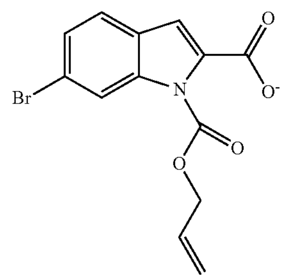
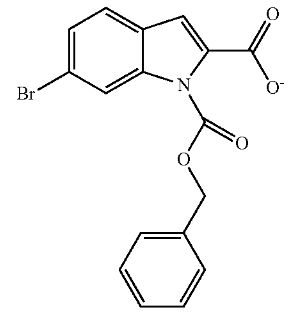
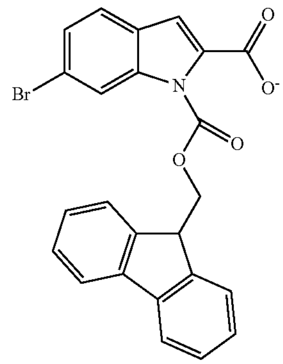
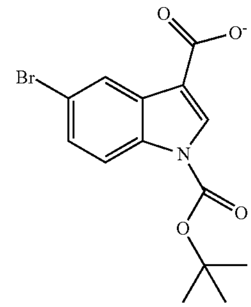
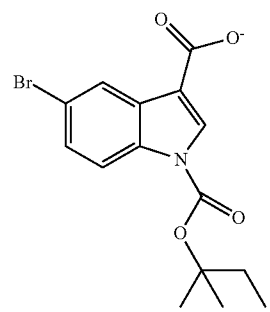
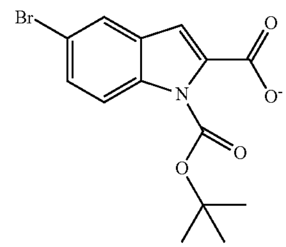
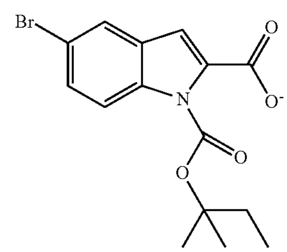
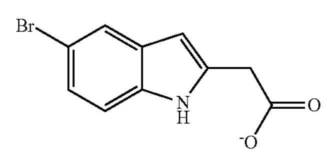
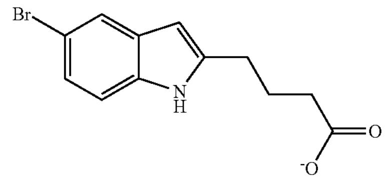
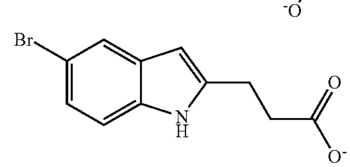

-continued
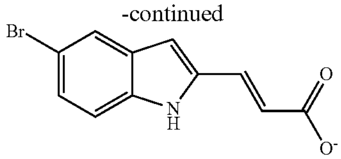
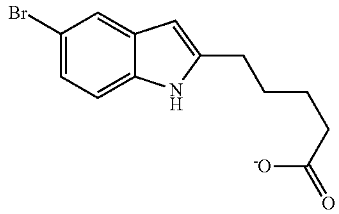
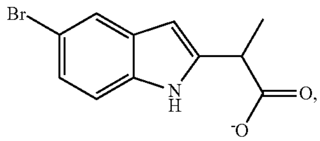
and
the anion in the sulfonium salt having formula (A-2) is selected from the group consisting of the following formulae:
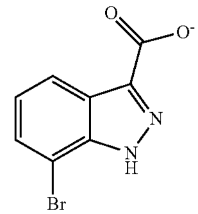
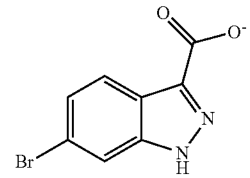
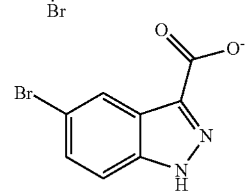
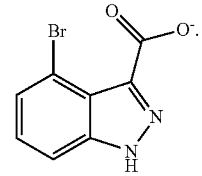
* * * * *